(12) United States Patent
Yamazaki et al.

(10) Patent No.: US 12,218,246 B2
(45) Date of Patent: Feb. 4, 2025

(54) SEMICONDUCTOR DEVICE AND METHOD FOR MANUFACTURING SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Shinya Sasagawa, Kanagawa (JP); Katsuaki Tochibayashi, Kanagawa (JP); Tsutomu Murakawa, Kanagawa (JP); Erika Takahashi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 680 days.

(21) Appl. No.: 17/414,490

(22) PCT Filed: Nov. 19, 2019

(86) PCT No.: PCT/IB2019/059909
§ 371 (c)(1),
(2) Date: Jun. 16, 2021

(87) PCT Pub. No.: WO2020/136467
PCT Pub. Date: Jul. 2, 2020

(65) Prior Publication Data
US 2022/0077317 A1    Mar. 10, 2022

(30) Foreign Application Priority Data

Dec. 28, 2018  (JP) .................................. 2018-247444
Dec. 28, 2018  (JP) .................................. 2018-247446
(Continued)

(51) Int. Cl.
*H01L 29/786*  (2006.01)
*H01L 21/02*   (2006.01)
(Continued)

(52) U.S. Cl.
CPC .... *H01L 29/7869* (2013.01); *H01L 21/02565* (2013.01); *H01L 27/1207* (2013.01);
(Continued)

(58) Field of Classification Search
CPC .......... H01L 29/7869; H01L 21/02565; H01L 27/1207; H01L 27/1225; H01L 27/124;
(Continued)

(56) References Cited

U.S. PATENT DOCUMENTS

| | | | |
|---|---|---|---|
| 8,809,855 B2 | 8/2014 | Yamazaki et al. |
| 9,166,060 B2 | 10/2015 | Yamazaki et al. |

(Continued)

FOREIGN PATENT DOCUMENTS

| | | | |
|---|---|---|---|
| JP | 2015-015457 A | 1/2015 |
| JP | 2015-109425 A | 6/2015 |

(Continued)

OTHER PUBLICATIONS

International Search Report (Application No. PCT/IB2019/059909) Dated Mar. 3, 2020.
(Continued)

*Primary Examiner* — Yasser A Abdelaziez
(74) *Attorney, Agent, or Firm* — Fish & Richardson P.C.

(57) ABSTRACT

A semiconductor device in which a variation of transistor characteristics is small is provided. The semiconductor device includes a transistor. The transistor includes a first insulator, a first oxide over the first insulator, a first conductor, a second conductor, and a second oxide, which is positioned between the first conductor and the second conductor, over the first oxide, a second insulator over the second oxide, and a third conductor over the second insulator. A top surface of the first oxide in a region overlapping with the third conductor is at a lower position than a position of a top surface of the first oxide in a region overlapping with
(Continued)

the first conductor. The first oxide in the region overlapping with the third conductor has a curved surface between a side surface and the top surface of the first oxide, and the curvature radius of the curved surface is greater than or equal to 1 nm and less than or equal to 15 nm.

10 Claims, 26 Drawing Sheets

(30) Foreign Application Priority Data

Jan. 25, 2019 (JP) .................................. 2019-010812
May 8, 2019 (JP) .................................. 2019-087969

(51) Int. Cl.
   *H01L 27/12* (2006.01)
   *H01L 29/66* (2006.01)
   *H10B 12/00* (2023.01)

(52) U.S. Cl.
   CPC ........ *H01L 27/1225* (2013.01); *H01L 27/124* (2013.01); *H01L 27/1255* (2013.01); *H01L 29/66969* (2013.01); *H01L 29/78648* (2013.01); *H01L 29/78696* (2013.01); *H10B 12/00* (2023.02)

(58) Field of Classification Search
   CPC ........... H01L 27/1255; H01L 29/66969; H01L 29/78648; H01L 29/78696; H01L 21/02631; H01L 21/8258; H01L 27/0688; H10B 41/70; H10B 12/00
   See application file for complete search history.

(56) References Cited

U.S. PATENT DOCUMENTS

| | | | |
|---|---|---|---|
| 9,368,607 | B2 | 6/2016 | Yamazaki et al. |
| 9,431,435 | B2 | 8/2016 | Ando et al. |
| 9,620,623 | B2 | 4/2017 | Yamazaki et al. |
| 9,711,656 | B2 | 7/2017 | Yamazaki et al. |
| 9,722,088 | B2 | 8/2017 | Hanaoka et al. |
| 9,780,201 | B2 | 10/2017 | Ando et al. |
| 10,032,918 | B2 | 7/2018 | Yamazaki et al. |
| 10,164,120 | B2 | 12/2018 | Kurata et al. |
| 10,186,604 | B2 | 1/2019 | Ando et al. |
| 10,403,646 | B2 | 9/2019 | Suzawa et al. |
| 10,475,818 | B2 | 11/2019 | Ando et al. |
| 10,535,776 | B2 | 1/2020 | Yamazaki et al. |
| 10,573,758 | B2 | 2/2020 | Hanaoka et al. |
| 11,271,115 | B2 | 3/2022 | Yamazaki et al. |
| 2014/0339544 | A1 | 11/2014 | Hanaoka et al. |
| 2014/0361293 | A1 | 12/2014 | Yamazaki et al. |
| 2016/0247832 | A1 | 8/2016 | Suzawa et al. |
| 2016/0293773 | A1* | 10/2016 | Yamazaki ............. H01L 29/045 |
| 2017/0309752 | A1 | 10/2017 | Yamazaki et al. |
| 2017/0317111 | A1 | 11/2017 | Ando et al. |
| 2018/0151742 | A1* | 5/2018 | Kurata ............. H01L 27/14627 |
| 2019/0181159 | A1 | 6/2019 | Suzawa et al. |
| 2020/0119201 | A1 | 4/2020 | Hanaoka et al. |
| 2022/0293794 | A1 | 9/2022 | Yamazaki et al. |

FOREIGN PATENT DOCUMENTS

| | | | |
|---|---|---|---|
| JP | 2015-216282 A | | 12/2015 |
| JP | 2016-157933 A | | 9/2016 |
| JP | 2017-199901 A | | 11/2017 |
| JP | 2018-061001 A | | 4/2018 |
| JP | WO2018138619 | * | 8/2018 |
| KR | 2016-0012156 A | | 2/2016 |
| TW | 201501319 | | 1/2015 |
| TW | 201703238 | | 1/2017 |
| TW | 201724526 | | 7/2017 |
| TW | 201806127 | | 2/2018 |
| WO | WO-2014/188982 | | 11/2014 |
| WO | WO-2015/060318 | | 4/2015 |
| WO | WO-2016/189425 | | 12/2016 |
| WO | WO-2017/187301 | | 11/2017 |
| WO | WO-2020/075022 | | 4/2020 |

OTHER PUBLICATIONS

Written Opinion (Application No. PCT/IB2019/059909) Dated Mar. 3, 2020.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.
Kunitake.H et al., "High thermal tolerance of 25-nm c-axis aligned crystalline In—Ga—Zn oxide FET", IEDM 18: Technical Digest of International Electron Devices Meeting, Dec. 1, 2018, pp. 312-315.
Taiwanese Office Action (Application No. 108142680) dated Sep. 23, 2023.

* cited by examiner

1471

1472

1473

1474

1475

1476

1477

1478

SEMICONDUCTOR DEVICE AND METHOD FOR MANUFACTURING SEMICONDUCTOR DEVICE

CROSS REFERENCE TO RELATED APPLICATIONS

This application is a U.S. National Phase Application under 35 U.S.C. § 371 of International Application PCT/IB2019/059909, filed on Nov. 19, 2019, which is incorporated by reference and claims the benefit of foreign priority applications filed in Japan on Dec. 28, 2018, as Application No. 2018-247444, on Dec. 28, 2018, as Application No. 2018-247446, on Jan. 25, 2019, as Application No. 2019-010812, and on May 8, 2019, as Application No. 2019-087969.

TECHNICAL FIELD

One embodiment of the present invention relates to a transistor, a semiconductor device, and an electronic device. Another embodiment of the present invention relates to a method for manufacturing a semiconductor device. Another embodiment of the present invention relates to a semiconductor wafer and a module.

Note that in this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

A technique by which a transistor is formed using a semiconductor thin film formed over a substrate having an insulating surface has been attracting attention. The transistor is applied to a wide range of electronic devices such as an integrated circuit (IC) or an image display device (also simply referred to as a display device). A silicon-based semiconductor material is widely known as a semiconductor thin film applicable to the transistor; in addition, an oxide semiconductor has been attracting attention as another material.

A CAAC (c-axis aligned crystalline) structure and an nc (nanocrystalline) structure, which are neither single crystal nor amorphous, have been found in an oxide semiconductor (see Non-Patent Document 1 and Non-Patent Document 2).

Non-Patent Document 1 and Non-Patent Document 2 disclose a technique for manufacturing a transistor using an oxide semiconductor having a CAAC structure.

REFERENCE

Non-Patent Document

[Non-Patent Document 1] S. Yamazaki et al., "SID Symposium Digest of Technical Papers", 2012, volume 43, issue 1, p. 183-186

[Non-Patent Document 2] S. Yamazaki et al., "Japanese Journal of Applied Physics", 2014, volume 53, Number 4S, p. 04ED18-1-04ED18-10

SUMMARY OF THE INVENTION

Problems to be Solved by the Invention

An object of one embodiment of the present invention is to provide a semiconductor device in which a variation of transistor characteristics is small. Another object of one embodiment of the present invention is to provide a semiconductor device having a high on-state current. Another object of one embodiment of the present invention is to provide a semiconductor device having favorable electrical characteristics. Another object of one embodiment of the present invention is to provide a semiconductor device that can be miniaturized or highly integrated. Another object of one embodiment of the present invention is to provide a semiconductor device having high reliability. Another object of one embodiment of the present invention is to provide a semiconductor device with low power consumption.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention is a semiconductor device including a transistor, and the transistor includes a first insulator, a first oxide over the first insulator, a first conductor, a second conductor, and a second oxide, which is positioned between the first conductor and the second conductor, over the first oxide, a second insulator over the second oxide, and a third conductor over the second insulator. A top surface of the first oxide in a region overlapping with the third conductor is at a lower position than a position of the top surface of the first oxide in a region overlapping with the first conductor. The first oxide in the region overlapping with the third conductor has a curved surface between a side surface and the top surface of the first oxide, and a curvature radius of the curved surface is greater than or equal to 1 nm and less than or equal to 15 nm.

In the semiconductor device, with use of a bottom surface of the first insulator as a benchmark, a difference between the level of the top surface of the first oxide in the region overlapping with the third conductor and the level of the top surface of the first oxide in the region overlapping with the first conductor is preferably greater than or equal to 1 nm and less than or equal to 5 nm.

In the semiconductor device, a half of a difference between the length of a bottom surface of the first oxide in the region overlapping with the first conductor and the length of a bottom surface of the first oxide in the region overlapping with the third conductor is preferably greater than or equal to 2 nm and less than or equal to 10 nm in the channel width direction of the transistor.

In the semiconductor device, the transistor includes a third oxide and a fourth oxide. The third oxide is positioned between the first oxide and the first conductor, and the fourth oxide is positioned between the first oxide and the second conductor. In the channel length direction of the transistor, a bottom surface of the second oxide is at a lower position than a position of a bottom surface of the third oxide and a position of a bottom surface of the fourth oxide.

Another embodiment of the present invention is a semiconductor device including a plurality of transistors, and the plurality of transistors include a first insulator, a first oxide over the first insulator, a first conductor, a second conductor, and a second oxide, which is positioned between the first conductor and the second conductor, over the first oxide, a second insulator over the second oxide, and a third conductor over the second insulator. A top surface of the first oxide in a region overlapping with the third conductor is at a position lower than a position of a top surface of the first oxide in a region overlapping with the first conductor. The first oxide in the region overlapping with the third conductor has a curved surface between a side surface and the top surface of the first oxide. A standard deviation σ of $V_{sh}$ in $I_d$-$V_g$ characteristics of the plurality of transistors is less than 60 mV.

In the above semiconductor device, the channel lengths of the plurality of transistors are preferably greater than or equal to 40 nm and less than or equal to 80 nm, and the channel widths of the plurality of transistors are preferably greater than or equal to 40 nm and less than or equal to 80 nm.

In the above semiconductor device, the curvature radius of the curved surface is preferably greater than or equal to 1 nm and less than or equal to 15 nm.

Another embodiment of the present invention is a semiconductor device including a transistor, and the transistor includes a first insulator, a first oxide over the first insulator, a first conductor, a second conductor, and a second oxide, which is positioned between the first conductor and the second conductor, over the first oxide, a second insulator over the second oxide, a third conductor over the second insulator, and a third insulator positioned in contact with a top surface of the first conductor, a top surface of the second conductor, and a part of a side surface of the first oxide. In the channel width direction of the transistor, the length of a bottom surface of the first oxide in a region overlapping with the first conductor is larger than the length of a bottom surface of the first oxide in a region overlapping with the third conductor. The first oxide in the region overlapping with the third conductor has a curved surface between the side surface and a top surface. The first oxide contains indium, an element M (M is gallium, yttrium, or tin), and zinc.

The third insulator contains an element that is to be an impurity of the first oxide. The concentration ratio of the element to the element M at the side surface of the first oxide in the region overlapping with the third conductor is lower than the concentration ratio of the element to the element M at the side surface of the first oxide in the region overlapping with the first conductor.

In the above semiconductor device, the element contained in the third insulator is preferably aluminum.

In the above semiconductor device, the curvature radius of the curved surface is preferably greater than or equal to 1 nm and less than or equal to 15 nm.

Effect of the Invention

According to one embodiment of the present invention, a semiconductor device in which a variation of transistor characteristics is small can be provided. According to another embodiment of the present invention, a semiconductor device with a high on-state current can be provided. According to another embodiment of the present invention, a semiconductor device having favorable electrical characteristics can be provided. According to another embodiment of the present invention, a semiconductor device that can be miniaturized or highly integrated can be provided. According to another embodiment of the present invention, a semiconductor device having high reliability can be provided. According to another embodiment of the present invention, a semiconductor device with low power consumption can be provided.

Note that the description of the effects does not preclude the existence of other effects. One embodiment of the present invention does not necessarily achieve all the effects. Note that effects other than these will be apparent from the description of the specification, the drawings, the claims, and the like and effects other than these can be derived from the description of the specification, the drawings, the claims, and the like.

MODE FOR CARRYING OUT THE INVENTION

Figure 1A:
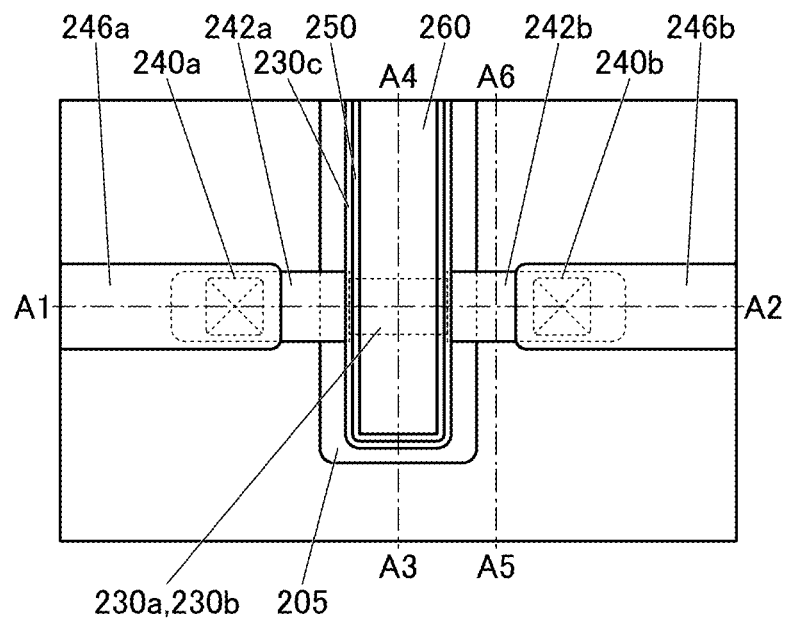
FIG. 1A is a top view of a semiconductor device of one embodiment of the present invention.

Hereinafter, embodiments will be described with reference to the drawings. However, the embodiments can be implemented with many different modes, and it will be readily appreciated by those skilled in the art that modes and details thereof can be changed in various ways without departing from the spirit and scope thereof. Thus, the present invention should not be interpreted as being limited to the following descriptions of the embodiments.

In the drawings, the size, the layer thickness, or the region is exaggerated for clarity in some cases. Therefore, the size, the layer thickness, or the region is not necessarily limited to the illustrated scale. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which might not be reflected in the drawings for easy understanding of the invention. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. The description of some hidden lines and the like might also be omitted.

Note that in this specification and the like, the ordinal numbers such as first and second are used for convenience and do not denote the order of steps or the stacking order of layers. Therefore, for example, description can be made even when "first" is replaced with "second", "third", or the like, as appropriate. In addition, the ordinal numbers in this specification and the like do not correspond to the ordinal numbers which are used to specify one embodiment of the present invention in some cases.

In this specification and the like, terms for describing arrangement, such as "over" and "under", are used for convenience in describing a positional relation between components with reference to drawings. The positional relation between components is changed as appropriate in accordance with a direction in which the components are described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or text, a connection relation other than one shown in drawings or text is regarded as being disclosed in the drawings or the text. Here, X and Y each denote an object (e.g., a device, an element, a circuit, a wiring, an electrode, a terminal, a conductive film, or a layer).

In this specification and the like, a transistor is an element having at least three terminals of a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which a current mainly flows.

Furthermore, functions of a source and a drain might be switched when a transistor of opposite polarity is employed or a direction of current flow is changed in circuit operation, for example. Therefore, the terms "source" and "drain" can sometimes be interchanged with each other in this specification and the like.

Note that a channel length refers to, for example, a distance between a source (a source region or a source electrode) and a drain (a drain region or a drain electrode) in a region where a semiconductor (or a portion where current flows in a semiconductor when a transistor is in an on state)

and a gate electrode overlap with each other or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, or the average value in a channel formation region.

A channel width refers to, for example, a length of a channel formation region in a direction perpendicular to a channel length direction in a region where a semiconductor (or a portion where current flows in a semiconductor when a transistor is in an on state) and a gate electrode overlap with each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, or the average value in a channel formation region.

Note that in this specification and the like, depending on the transistor structure, a channel width in a region where a channel is actually formed (hereinafter also referred to as an "effective channel width") is sometimes different from a channel width shown in a top view of a transistor (hereinafter also referred to as an "apparent channel width"). For example, when a gate electrode covers a side surface of a semiconductor, an effective channel width is greater than an apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is greater than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to apparent channel width in some cases. Alternatively, in this specification, the simple term "channel width" refers to effective channel width in some cases. Note that values of channel length, channel width, effective channel width, apparent channel width, and the like can be determined, for example, by analyzing a cross-sectional TEM image and the like.

Note that impurities in a semiconductor refer to, for example, elements other than the main components of the semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity which changes the characteristics of the semiconductor include Group 1 elements, Group 2 elements, Group 13 elements, Group 14 elements, Group 15 elements, transition metals other than the main components of the oxide semiconductor, and the like; hydrogen, lithium, sodium, silicon, boron, phosphorus, carbon, nitrogen, and the like are given as examples. Note that water also serves as an impurity in some cases. In addition, in the case of an oxide semiconductor, oxygen vacancies (also referred to as $V_O$) are formed by entry of impurities in some cases, for example.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle greater than or equal to 60° and less than or equal to 120°.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be called a transistor including a metal oxide or an oxide semiconductor.

In this specification and the like, normally off means drain current per micrometer of channel width flowing through a transistor being $1 \times 10^{-20}$ A or less at room temperature, $1 \times 10^{-18}$ A or less at 85° C., or $1 \times 10^{-16}$ A or less at 125° C. when a potential is not applied to a gate or a ground potential is applied to the gate.

Embodiment 1

An example of a semiconductor device including a transistor 200 of one embodiment of the present invention is described in this embodiment.

<Structure Example of Semiconductor Device>

Figure 1C:
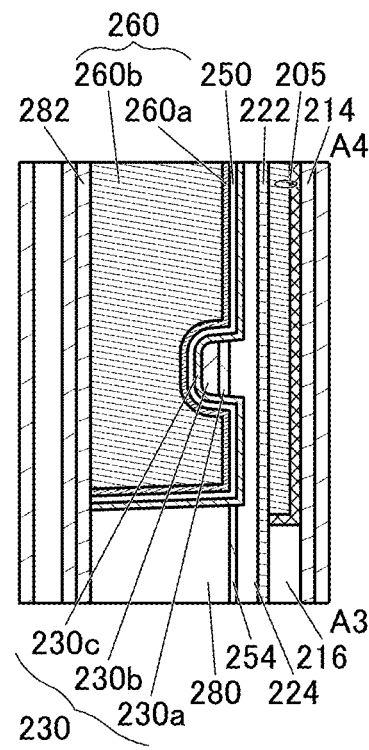
FIG. 1B to FIG. 1D are cross-sectional views of a semiconductor device of one embodiment of the present invention.
Figure 1B:
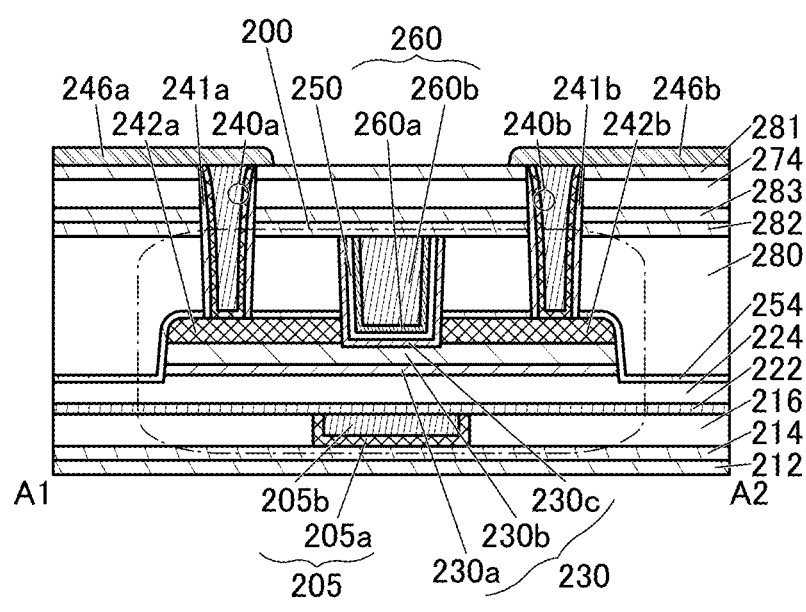
Figure 1D:
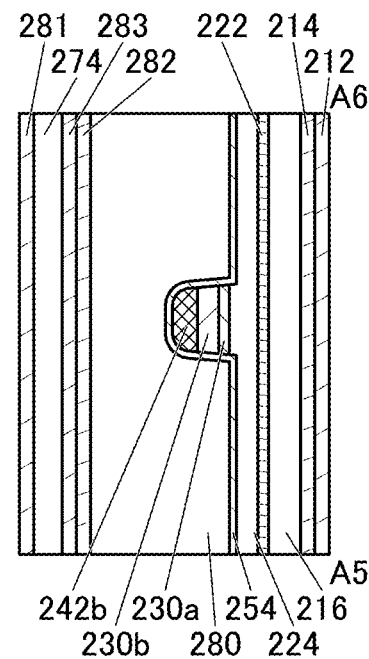

FIG. 1A to FIG. 1D are a top view and cross-sectional views of a semiconductor device including a transistor 200 of one embodiment of the present invention. FIG. 1A is a top view of the semiconductor device. FIG. 1B to FIG. 1D are cross-sectional views of the semiconductor device. Here, FIG. 1B is a cross-sectional view of a portion indicated by the dashed-dotted line A1-A2 in FIG. 1A, and is a cross-sectional view in the channel length direction of the transistor 200. FIG. 1C is a cross-sectional view of a portion indicated by the dashed-dotted line A3-A4 in FIG. 1A, and is a cross-sectional view in the channel width direction of the transistor 200. FIG. 1D is a cross-sectional view of a portion indicated by the dashed-dotted line A5-A6 in FIG. 1A. Note that for clarity of the drawing, some components are not illustrated in the top view of FIG. 1A.

The semiconductor device of one embodiment of the present invention includes an insulator 212 over a substrate (not illustrated), an insulator 214 over the insulator 212, the transistor 200 over the insulator 214, an insulator 280 over the transistor 200, an insulator 282 over the insulator 280, an insulator 283 over the insulator 282, an insulator 274 over the insulator 283, and an insulator 281 over the insulator 274. The insulator 212, the insulator 214, the insulator 280, the insulator 282, the insulator 283, the insulator 274, and the insulator 281 function as interlayer films. A conductor 240 (a conductor 240a and a conductor 240b) that is electrically connected to the transistor 200 and functions as a plug is also included. Note that an insulator 241 (an insulator 241a and an insulator 241b) is provided in contact with side surfaces of the conductor 240 functioning as a plug. A conductor 246 (a conductor 246a and a conductor 246b) that is electrically connected to the conductor 240 and functions as a wiring is provided over the insulator 281 and the conductor 240.

The insulator 241a is provided in contact with the inner wall of an opening in an insulator 254, the insulator 280, the insulator 282, the insulator 283, the insulator 274, and the insulator 281; a first conductor of the conductor 240a is provided in contact with a side surface of the insulator 241a; and a second conductor of the conductor 240a is provided on the inner side thereof. The insulator 241b is provided in contact with the inner wall of an opening in the insulator 254, the insulator 280, the insulator 282, the insulator 283, the insulator 274, and the insulator 281; a first conductor of the conductor 240b is provided in contact with a side surface of the insulator 241b; and a second conductor of the conductor 240b is provided on the inner side thereof. Here, the level of a top surface of the conductor 240 and the level of a top surface of the insulator 281 can be substantially the same. Note that although the transistor 200 has a structure in which the first conductor of the conductor 240 and the second conductor of the conductor 240 are stacked, the present invention is not limited thereto. For example, the conductor 240 may be provided as a single layer or to have a stacked-layer structure of three or more layers. In the case where a structure body has a stacked-layer structure, layers may be distinguished by ordinal numbers corresponding to the formation order.

[Transistor 200]

As illustrated in FIG. 1A to FIG. 1D, the transistor 200 includes an insulator 216 over the insulator 214; a conductor 205 (a conductor 205a and a conductor 205b) positioned so as to be embedded in the insulator 216; an insulator 222 over the insulator 216 and the conductor 205; an insulator 224 over the insulator 222; an oxide 230a over the insulator 224; an oxide 230b over the oxide 230a; a conductor 242a, a conductor 242b, and an oxide 230c over the oxide 230b; an insulator 250 over the oxide 230c; a conductor 260 (a conductor 260a and a conductor 260b) positioned over the insulator 250 and overlapping with the oxide 230c; and the insulator 254 in contact with part of the top surface of the insulator 224, part of a side surface of the oxide 230a, part of a side surface of the oxide 230b, a side surface of the conductor 242a, the top surface of the conductor 242a, a side surface of the conductor 242b, and the top surface of the conductor 242b. The oxide 230c is in contact with a side surface of the insulator 254, the side surface of the conductor 242a and the side surface of the conductor 242b. Here, as illustrated in FIG. 1B, a top surface of the conductor 260 is positioned to be substantially aligned with a top surface of the insulator 250 and a top surface of the oxide 230c. The insulator 282 is in contact with the top surfaces of the conductor 260, the insulator 250, the oxide 230c, and the insulator 280.

An opening reaching the oxide 230b is provided in the insulator 280 and the insulator 254. The oxide 230c, the insulator 250, and the conductor 260 are provided in the opening. In addition, in the channel length direction of the transistor 200, the conductor 260, the insulator 250, and the oxide 230c are provided between the conductor 242a and the conductor 242b. The insulator 250 includes a region overlapping a side surface of the conductor 260 and a region overlapping with a bottom surface of the conductor 260. The oxide 230c in a region overlapping with the oxide 230b includes a region in contact with the oxide 230b, a region overlapping with the side surface of the conductor 260 with the insulator 250 therebetween, and a region overlapping with the bottom surface of the conductor 260 with the insulator 250 therebetween.

In the transistor 200, a metal oxide functioning as a semiconductor (hereinafter, also referred to as an oxide semiconductor) is preferably used as the oxide 230 (the oxide 230a, the oxide 230b, and the oxide 230c) including a channel formation region.

The metal oxide functioning as a semiconductor has a band gap of preferably 2 eV or higher, further preferably 2.5 eV or higher. With use of a metal oxide having such a wide bandgap, the off-state current of the transistor can be reduced.

The transistor in which a metal oxide is used in its channel formation region has an extremely low leakage current in a non-conduction state; thus, a semiconductor device with low power consumption can be provided. The metal oxide can be deposited by a sputtering method or the like, and thus can be used for a transistor included in a highly integrated semiconductor device.

For example, as the oxide 230, a metal oxide such as an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. An In—Ga oxide or an In—Zn oxide may be used for the oxide 230.

The oxide 230 preferably includes the oxide 230a positioned over the insulator 224, the oxide 230b positioned over the oxide 230a, and the oxide 230c that is positioned over the oxide 230b and is at least partly in contact with the top surface of the oxide 230b. Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c.

Although a structure in which the oxide 230 has a three-layer stacked structure of the oxide 230a, the oxide 230b, and the oxide 230c in the transistor 200 is described, the present invention is not limited thereto. For example, the oxide 230 may be a single layer of the oxide 230b or has a two-layer structure of the oxide 230a and the oxide 230b, a two-layer structure of the oxide 230b and the oxide 230c, or a stacked-layer structure including four or more layers. Alternatively, each of the oxide 230a, the oxide 230b, and the oxide 230c may have a stacked-layer structure.

Furthermore, the oxide 230a and the oxide 230b preferably contain the same element, other than oxygen, as its main component, and the oxide 230b and the oxide 230c preferably contain the same element, other than oxygen, as its main component. By this, the density of defect states at the interface between the oxide 230a and the oxide 230b and the interface between the oxide 230b and the oxide 230c can be made low. Thus, the influence of interface scattering on carrier conduction is small, and the transistor 200 can have high on-state current and excellent frequency characteristics.

A conductor 242 (the conductor 242a and the conductor 242b) is provided over the oxide 230b. Here, each of the conductor 242a and the conductor 242b functions as a source electrode or a drain electrode of the transistor 200.

The conductor 260 includes the conductor 260a and the conductor 260b, and the conductor 260a is positioned so as to cover a bottom surface and a side surface of the conductor 260b. The conductor 260 functions as a first gate (also referred to as a top gate) electrode of the transistor 200.

Figure 2:
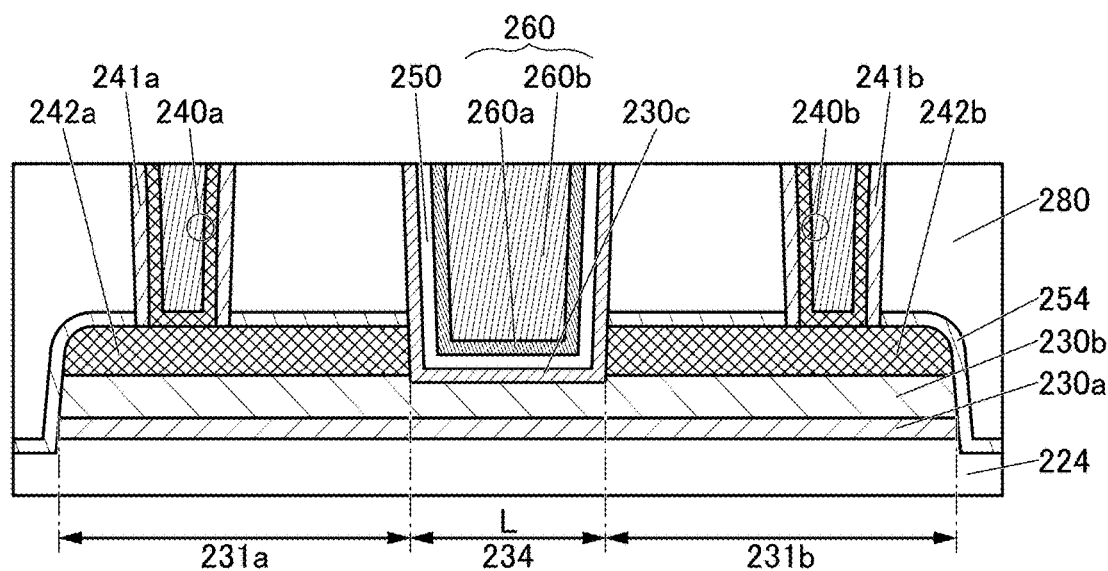
FIG. 2 is a cross-sectional view of a semiconductor device of one embodiment of the present invention.

FIG. 2 is a cross-sectional view illustrating an enlarged region that is part of the transistor 200 illustrated in FIG. 1B. As illustrated in FIG. 2, the oxide 230 includes a region 234 functioning as a channel formation region of the transistor 200 and a region 231 (a region 231a and a region 231b) functioning as a source region and a drain region. The region 231 is a region with a high carrier concentration and low resistance. In addition, the region 231 may include part of the low-resistance region. The region 234 has a lower carrier concentration than the region 231. Note that at least part of the region 231a and part of the region 231b are connected to the conductor 242a and the conductor 242b, respectively.

Although FIG. 2 shows a structure in which the region 231 and the region 234 are formed in the oxide 230b, one embodiment of the present invention is not limited thereto; for example, the region 231 or the region 234 may be formed in the oxide 230a and the oxide 230b, may be formed in the oxide 230b and the oxide 230c, or may be formed in the oxide 230a, the oxide 230b, and the oxide 230c.

Also in FIG. 2, a boundary between the region 231 and the region 234 is illustrated as being substantially perpendicular to the bottom surface of the oxide 230b; however, this embodiment is not limited thereto. For example, in some cases, the region 234 extends toward the conductor 240 around the surface of the oxide 230b and is narrowed around the bottom surface of the oxide 230b.

When a low-resistance region is formed in the channel formation region of the transistor including an oxide semiconductor in the channel formation region, leakage current (parasitic channel) between the source electrode and the drain electrode of the transistor is likely to be generated in the low-resistance region. Furthermore, the parasitic channel facilitates generation of defects of transistor characteristic, such as normally on of transistors, an increase in leakage current, and a change (shift) of threshold voltage caused by stress application. When the processing accuracy of the transistor is low, the parasitic channel varies between transistors, which causes a variation of transistor characteristics.

In a transistor using an oxide semiconductor, the resistance of the oxide semiconductor may be reduced when impurities and oxygen vacancies exist in a channel formation region of the oxide semiconductor. In addition, the electrical characteristics are likely to be changed, and thus the reliability is lowered in some cases. Examples of the impurities include aluminum (Al) and silicon (Si). Entry of the impurities into the channel formation region causes generation of defect states or oxygen vacancies in some cases.

Aluminum and silicon have a higher energy for bonding with oxygen than indium and zinc have. For example, when an In-M-Zn oxide is used as the oxide semiconductor, aluminum entering the oxide semiconductor may deprive oxygen contained in the oxide semiconductor, whereby oxygen vacancies are generated in the vicinity of indium or zinc in some cases.

If the channel formation region in the metal oxide includes oxygen vacancies, the transistor sometimes has normally-on characteristics. Moreover, in the case where hydrogen enters an oxygen vacancy in the metal oxide, the oxygen vacancy and the hydrogen are bonded to each other to form $V_OH$ in some cases. In some cases, a defect in which hydrogen has entered an oxygen vacancy ($V_OH$) functions as a donor and generates an electron serving as a carrier. In other cases, bonding of part of hydrogen to oxygen bonded to a metal atom generates electrons serving as carriers. Thus, a transistor using a metal oxide containing a large amount of hydrogen is likely to have normally-on characteristics. Moreover, hydrogen in a metal oxide easily moves by stress such as heat and an electric field; thus, the reliability of a transistor may be low when the metal oxide contains a plenty of hydrogen.

Therefore, the impurities and oxygen vacancies are preferably reduced as much as possible in the channel formation region of the oxide semiconductor and in the vicinity thereof.

Thus, a channel formation region of the transistor and a structure body in the vicinity thereof are preferably provided to have shapes described later. When the structure body forming the transistor is to have the shape described later, low-resistance regions formed in the channel formation region can be small, and generation of a parasitic channel can be inhibited. As a result, variation of transistor characteristics, due to a parasitic channel, can be suppressed. The transistor characteristics mentioned here indicate the current value in an on state (on-state current value), the current value in an off state (off-state current value), the threshold voltage, the subthreshold swing value (S value), the electric field-effect mobility, and the like. Moreover, the impurity concentration in the channel formation region of the oxide semiconductor or the impurity concentration in the vicinity thereof can be reduced, so that the reliability of the transistor can be improved.

<Preferable Shape of Channel Formation Region and Structure Body in the Vicinity Thereof>

Preferable shapes of the channel formation region and the structure body in the vicinity thereof will be described below. Note that for easy description, a region functioning as a channel formation region of the transistor 200 is assumed to be formed in the oxide 230b.

Figure 3A:
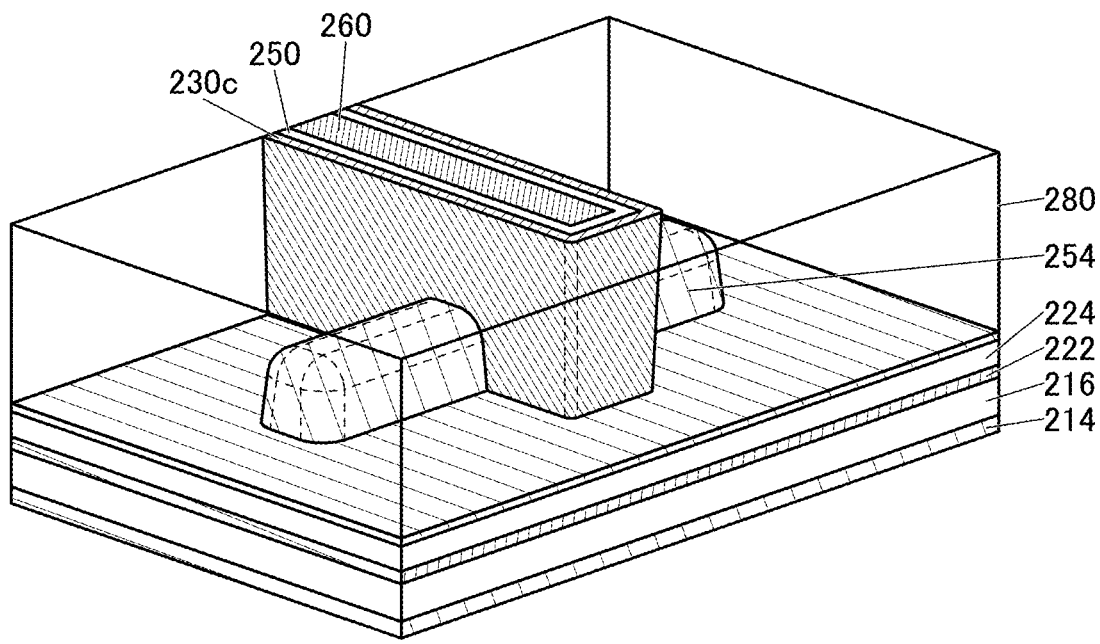
FIG. 3A and FIG. 3B are perspective views of a semiconductor device of one embodiment of the present invention.
Figure 3B:
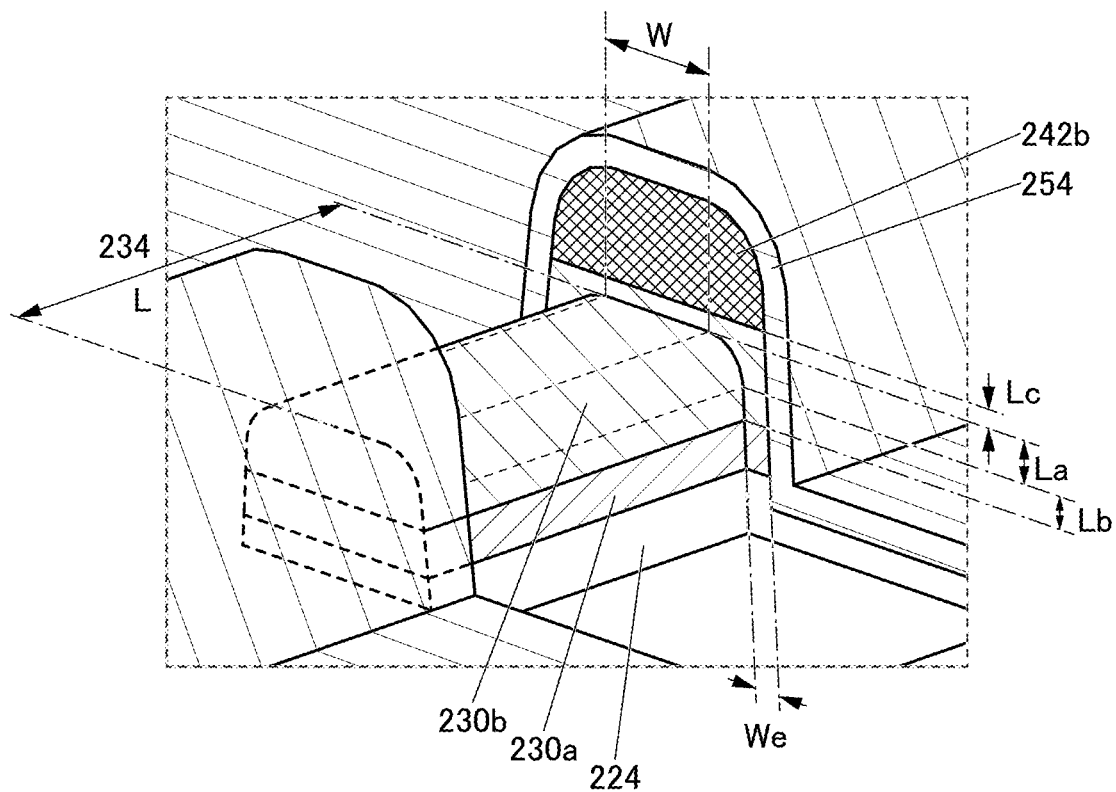

FIG. 3A is a perspective view illustrating the transistor 200 illustrated in FIG. 1A to FIG. 1D and the vicinity thereof. FIG. 3B is a perspective view illustrating an enlarged region of part of the transistor 200 illustrated in FIG. 3A. Note that for clarification of the drawing, some components are omitted in the perspective views of FIG. 3A and FIG. 3B.

The oxide 230b includes the region 231a (not illustrated in FIG. 3A and FIG. 3B) in contact with at least part of the conductor 242a, the region 231b (not illustrated in FIG. 3A and FIG. 3B) in contact with at least part of the conductor 242b, and the region 234 functioning as a channel formation region of the transistor 200 between the region 231a and the region 231b. In the oxide 230b, the region 234 has a region where the oxide 230b and the conductor 260 overlap with each other. Hereinafter, in the oxide 230b, a region where the oxide 230b and the conductor 242a overlap with each other, can be rephrased as the region 231a, and a region where the oxide 230b and the conductor 242b overlap with each other can be rephrased as the region 231b.

As illustrated in FIG. 1C and FIG. 3B, a curved surface is preferably provided between the side surface of the oxide 230b and the top surface of the oxide 230b in the region 234, in a cross-sectional view in the channel width direction of the transistor 200. That is, an end portion of the side surface and an end portion of the top surface are preferably curved (such a shape is hereinafter also referred to as a rounded shape).

Here, as illustrated in FIG. 2 and FIG. 3B, a distance between a side end portion of the conductor 242a and a side end portion of the conductor 242b is referred to as L in a cross-sectional view in the channel length direction of the transistor 200 where the side end portions face each other. Note that L can also be referred to as a length of the top surface of the oxide 230b in a region not overlapping with the conductor 242 in the cross-sectional view in the channel length direction of the transistor 200.

As illustrated in FIG. 3B, a length of the top surface of the oxide 230b in a region where the oxide 230b and the conductor 260 overlap with each other and where no curved surface is provided is referred to as W in the cross-sectional view in the channel width direction of the transistor 200.

The curvature radius of the curved surface is referred to as La as illustrated in FIG. 3B. Note that La is regarded, in some cases, as a difference between the level of the top surface of the oxide 230b and the level of the lower end portion of the side surface of the oxide 230b with a curved surface in the region where the oxide 230b and the conductor 260 overlap with each other, when a bottom surface of the insulator 224 is considered as a benchmark, in the cross-sectional view in the channel width direction of the transistor 200.

La is preferably greater than 0 nm and less than the thickness of the oxide 230b in the region overlapping with the conductor 242 or less than half of the above W. Specifically, La is greater than 0 nm and less than or equal to 20 nm, preferably greater than or equal to 1 nm and less than or equal to 15 nm, and further preferably greater than or equal to 2 nm and less than or equal to 10 nm. With such a shape, the concentration of electric field between the side surface and the top surface can be inhibited, and variation of transistor characteristics can be inhibited. Furthermore, a decrease in W can be prevented, and reductions in the on-state current and mobility of the transistor 200 can be inhibited. Thus, a semiconductor device having favorable electrical characteristics can be provided.

With the above shape, the effective channel length on the side surface of the oxide 230b is greater than the effective channel length on the top surface of the oxide 230b in the region 234, whereby the amount of current flowing through the side surface is reduced. Accordingly, the influence of a parasitic channel formed on the side surface is suppressed, which enables a reduction in an S value of the transistor 200. Furthermore, influence of the parasitic channel formed on the side surface on variation per transistor is reduced, whereby a semiconductor device in which a variation of transistor characteristics is small can be provided.

In the cross-sectional view in the channel width direction of the transistor 200, a length of a region where the oxide 230b and the conductor 260 overlap with each other and where no curved surface is provided on the side surface of the oxide 230b, is referred to as Lb. Note that in the case where the oxide 230b has a tapered side surface in the region where the oxide 230b and the conductor 260 overlap with each other, Lb can be rephrased as a length of a tapered portion of the oxide 230b. Furthermore, Lb is regarded, in some cases, as a difference between the level of an upper end portion of the region not having a curved surface and the level of a lower end portion of the region not having a curved surface when the bottom surface of the insulator 224 is considered as a benchmark. Lb depends on La, the thickness of the oxide 230b, the taper angle of the oxide 230b, and the like. Here, the taper angle refers to an angle formed between a side surface of a film having a tapered shape and a bottom surface of the film.

The amount of thickness reduction of the top surface of the oxide 230b in the region where the oxide 230b and the conductor 260 overlap with each other is referred to as Lc. For example, Lc can be calculated to be a difference between the level of the top surface of the oxide 230b in the region overlapping with the conductor 242 and the level of the top surface of the oxide 230b in the region overlapping with the conductor 260 in the cross-sectional view in the channel width direction of the transistor 200, when the bottom surface of the insulator 222 is considered as a benchmark.

As described later, a low-resistance region might be formed partly between the oxide 230b and a conductive layer 242B or in the vicinity of a surface of the oxide 230b when an element included in the conductive layer 242B that is provided over and in contact with the oxide 230b has a function of absorbing oxygen in the oxide 230b. Furthermore, a low-resistance region might be formed partly between the oxide 230b and an insulating film 254A or in the vicinity of the oxide 230b when an element included in the insulating film 254A that is provided over and in contact with the side surface of the channel formation region of the oxide 230b has a function of absorbing oxygen in the oxide 230b. That is, these elements might serve as impurities in the oxide semiconductor. In this case, in the low-resistance regions, an impurity or an impurity that has entered an oxygen vacancy (hydrogen, nitrogen, a metal element, or the like) serves as a donor, so that the carrier concentration increases in some cases.

Entry of the impurities into the oxide semiconductor causes generation of defect states or oxygen vacancies in some cases. Thus, when impurities enter a channel formation region of the oxide semiconductor, the electrical characteristics of a transistor using the oxide semiconductor are likely to vary and its reliability is degraded in some cases. Therefore, when the channel formation region includes oxygen vacancies, the transistor tends to have normally-on characteristics (the channel is generated even when no voltage is applied to the gate electrode and current flows through the transistor).

Thus, the position of the top surface of the oxide 230b in the region 234 is preferably lower than the position of the top surface of the oxide 230b in the region overlapping with the conductor 242. For example, Lc is preferably greater than 0 nm and less than the thickness of the oxide 230b in the region overlapping with the conductor 242. Specifically, Lc is greater than 0 nm and less than or equal to 15 nm, preferably greater than or equal to 0.5 nm and less than or equal to 10 nm, and further preferably greater than or equal to 1 nm and less than or equal to 5 nm. With such a shape, the impurity is removed, and the low-resistance region formed in the vicinity of the top surface of the region 234 is made small, so that generation of a parasitic channel can be prevented. Note that the effective channel length on the top surface of the region 234 is represented by L+2×Lc. Consequently, by a reduction in Lc, a decrease in the on-state current of the transistor can be inhibited.

The amount of thickness reduction of the side surface of the oxide 230b in the region where the oxide 230b and the conductor 260 overlap with each other is referred to as We. For example, We can be calculated to be a difference between the side surface of the oxide 230b in the region overlapping with the conductor 242 and the side surface of the oxide 230b in the region not having the curved surface in the cross-sectional view in the channel width direction of the transistor 200. Furthermore, in the cross-sectional view in the channel width direction of the transistor 200, We can be calculated to be half of a difference between the length of the bottom surface of the oxide 230b in the region overlapping with the conductor 242 and the length of the bottom surface of the oxide 230b in the region not overlapping with the conductor 242, for example.

We is preferably is greater than 0 nm and less than or equal to the thickness of the oxide 230b in the region overlapping overlaps with the conductor 242. Specifically, We is greater than 0 nm and less than or equal to 20 nm, preferably greater than or equal to 1 nm and less than or equal to 15 nm, and further preferably greater than or equal to 2 nm and less than or equal to 10 nm. When We is greater than 0 nm, impurities in the vicinity of the side surface of the region 234 can be removed, so that the low-resistance regions can be reduced and generation of a parasitic channel can be prevented.

In the above manner, the low-resistance region formed in the channel formation region can be reduced, and the generation of a parasitic channel can be prevented. As a result, variation of transistor characteristics due to the parasitic channel can be inhibited. Moreover, the concentrations of impurities in the channel formation region of the oxide semiconductor and in the vicinity thereof can be reduced, so that the reliability of the transistor can be improved.

When the channel formation region of the transistor 200 and the structure body in the vicinity thereof have the above-described shapes, the variation of transistor characteristics can be reduced. For example, the variation in $V_{sh}$ can be reduced. In this specification, $V_{sh}$ is defined by a gate voltage $V_g$ curve at the drain current $I_d=1.0\times10^{-12}$ A on the $I_d$-$V_g$ of the transistor. The variation in $V_{sh}$ can be evaluated with a standard deviation σ, for example. The standard deviation σ of $V_{sh}$ among n (n is an integer greater than or equal to 3) transistors is expressed by the following formula.

$$\sigma = \sqrt{\frac{1}{n}\sum_{i=1}^{n}(x_i - \mu)^2} \quad \text{[Formula 1]}$$

In the above formula, $x_i$ denotes a value of $V_{sh}$ of the i-th (i is an integer greater than or equal to 1 and less than or equal to n) transistor, and μ is an average value of $V_{sh}$ of the n transistors.

In the $I_d$-$V_g$ characteristics of the transistor 200, the standard deviation σ of $V_{sh}$ is specifically less than or equal to 60 mV, preferably less than or equal to 40 mV, and further preferably less than or equal to 20 mV.

When the channel formation region of the transistor 200 and the structure body in the vicinity thereof have the above shapes, the concentrations of impurities in the channel formation region of the oxide semiconductor and in the vicinity thereof can be reduced. Specifically, the concentration of impurities obtained by secondary ion mass spectrometry (SIMS) is lower than or equal to $1\times10^{18}$ atoms/cm$^3$, preferably lower than or equal to $2\times10^{16}$ atoms/cm$^3$ in and around the channel formation region of the oxide semiconductor. Alternatively, the concentration of impurities obtained by element analysis using energy dispersive X-ray spectroscopy (EDX) is lower than or equal to 1.0 atomic % in and around the channel formation region of the oxide semiconductor. When an oxide containing the element M is used as the oxide semiconductor, the concentration ratio of the impurities to the element M is lower than 0.10, preferably lower than 0.05 in and around the channel formation region of the oxide semiconductor. Here, the concentration of the element M used in the calculation of the concentration ratio may be a concentration in a region whose concertation of the impurities is calculated or may be a concentration in the oxide semiconductor.

Furthermore, the concentration of impurities at the side surface of the oxide 230b in the channel formation region is lower than the concentration of impurities at the side surface of the oxide 230b in the region overlapping with the conductor 242. Alternatively, the concentration ratio of impurities to the element M at the side surface of the oxide 230b in the channel formation region is lower than the concentration of impurities to the element M at the side surface of the oxide 230b in the region overlapping with the conductor 242. Furthermore, the concentration of impurities to the element M at the top surface of the oxide 230b in the channel formation region is lower than the concentration of impurities to the element M at the top surface of the oxide 230b in the region overlapping with the conductor 242.

<Detailed Structure of Semiconductor Device>

Detailed structures of a semiconductor device of one embodiment of the present invention and the transistor 200 included in the semiconductor device will be described below.

The insulator 212, the insulator 214, the insulator 254, the insulator 282, the insulator 283, and the insulator 281 preferably function as barrier insulating films, each of which inhibits diffusion of impurities such as water and hydrogen from the substrate side or above the transistor 200 into the transistor 200. Thus, for each of the insulator 212, the insulator 214, the insulator 254, the insulator 282, the insulator 283, and the insulator 281, an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (through which the impurities are less likely to pass) is preferably used. Alternatively, it is preferable to use an insulating material having a function of inhibiting diffusion of oxygen (e.g., at least one of an oxygen atom, an oxygen molecule, and the like) (through which the above oxygen is less likely to pass).

For example, silicon nitride or the like is preferably used for the insulator 212, the insulator 283, and the insulator 281, and aluminum oxide or the like is preferably used for the insulator 214, the insulator 254, and the insulator 282. Accordingly, impurities such as water and hydrogen can be inhibited from being diffused to the transistor 200 side from the substrate side through the insulator 212 and the insulator 214. Alternatively, oxygen contained in the insulator 224 or the like can be inhibited from being diffused to the substrate side through the insulator 212 and the insulator 214. Furthermore, impurities such as water and hydrogen can be inhibited from being diffused into the inside of the transistor 200 from the insulator 280 and the conductor 246 and the like, which are placed above the insulator 254, through the insulator 254. In this manner, the transistor 200 is preferably surrounded by the insulator 212, the insulator 214, the insulator 254, the insulator 282, and the insulator 283 having a function of inhibiting diffusion of oxygen and impurities such as water and hydrogen.

The resistivities of the insulator 212, the insulator 283, and the insulator 281 are preferably low in some cases. For example, by setting the resistivities of the insulator 212, the insulator 283, and the insulator 281 to approximately $1\times10^{13}$ Ωcm, the insulator 212, the insulator 283, and the insulator 281 can sometimes reduce charge up of the conductor 205, the conductor 242, or the conductor 260 in treatment using plasma or the like in the manufacturing process of a semiconductor device. The resistivities of the insulator 212, the insulator 283, and the insulator 281 are preferably higher than or equal to $1\times10^{10}$ Ωcm and lower than or equal to $1\times10^{15}$ Ωcm.

The insulator 216, the insulator 280, and the insulator 274 preferably have a lower dielectric constant than the insulator 214. When a material with a low dielectric constant is used for the interlayer film, the parasitic capacitance generated between wirings can be reduced. For example, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide is used as appropriate for the insulator 216, the insulator 280, and the insulator 274.

The conductor 205 is provided to overlap with the oxide 230 and the conductor 260. Furthermore, the conductor 205 is preferably provided to be embedded in the insulator 214 or the insulator 216.

Here, the conductor 260 sometimes functions as a first gate electrode. The conductor 205 sometimes functions as a second gate electrode. In that case, by changing a potential applied to the conductor 205 not in conjunction with but independently of a potential applied to the conductor 260, the threshold voltage ($V_{th}$) of the transistor 200 can be controlled. In particular, by applying a negative potential to the conductor 205, $V_{th}$ of the transistor 200 can be further increased, and the off-state current can be reduced. Thus, drain current when a potential applied to the conductor 260 is 0 V can be lower in the case where a negative potential is applied to the conductor 205 than in the case where the negative potential is not applied to the conductor 205.

As illustrated in FIG. 1A, the conductor 205 is preferably provided to be larger than a region of the oxide 230 that does not overlap with the conductor 242a or the conductor 242b. As illustrated in FIG. 1C, it is particularly preferable that the conductor 205 extend to a region outside an end portion of the oxide 230 that intersects with the channel width direction. That is, the conductor 205 and the conductor 260 preferably overlap with each other with the insulators therebetween on an outer side of the side surface of the oxide 230 in the channel width direction. Since the above-described structure is included, the channel formation region of the oxide 230 can be electrically surrounded by the electric field of the conductor 260 functioning as the first gate electrode and the electric field of the conductor 205 functioning as the second gate electrode. In this specification, a transistor structure in which a channel formation region is electrically surrounded by electric fields of the first gate and the second gate is referred to as a surrounded channel (S-channel) structure.

In this specification and the like, the S-channel structure refers to a transistor structure in which a channel formation region is electrically surrounded by the electric fields of a pair of gate electrodes. Furthermore, in this specification and the like, the S-channel structure has a feature in that the side surface and the vicinity of the oxide 230 in contact with the conductor 242a and the conductor 242b functioning as a source electrode and a drain electrode are of I-type like the channel formation region. The side surface and the vicinity of the oxide 230 in contact with the conductor 242a and the conductor 242b are in contact with the insulator 280 and thus can be of I-type like the channel formation region. Note that in this specification and the like, "I-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

Furthermore, as shown in FIG. 1C, the conductor 205 extends to function as a wiring as well. However, without limitation to this structure, a structure where a conductor functioning as a wiring is provided below the conductor 205 may be employed. In addition, the conductor 205 does not necessarily have to be provided in each transistor. For example, the conductor 205 may be shared by a plurality of transistors.

Although the transistor 200 having a structure in which the conductor 205 has a stacked structure of the conductor 205a and the conductor 205b is illustrated, the present invention is not limited thereto. For example, the conductor 205 may have a single-layer structure or a stacked-layer structure of three or more layers. In the case where a structure body has a stacked-layer structure, layers may be distinguished by ordinal numbers corresponding to the formation order.

Here, for the conductor 205a, a conductive material having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, or the like), and a copper atom is preferably used. Alternatively, it is preferable to use a conductive material having a function of inhibiting diffusion of oxygen (e.g., at least one of oxygen atoms, oxygen molecules, and the like).

When a conductive material having a function of inhibiting oxygen diffusion is used for the conductor 205a, the conductivity of the conductor 205b can be inhibited from being lowered because of oxidation. As a conductive material having a function of inhibiting diffusion of oxygen, for example, tantalum, tantalum nitride, ruthenium, or ruthenium oxide is preferably used. Thus, the conductor 205a is a single layer or a stacked layer of the above conductive materials. For example, the conductor 205a may be a stack of tantalum, tantalum nitride, ruthenium, or ruthenium oxide and titanium or titanium nitride.

Moreover, the conductor 205b is preferably formed using a conductive material containing tungsten, copper, or aluminum as its main component. Note that the conductor 205b is illustrated as a single layer but may have a stacked-layer structure, for example, a stack of any of the above conductive materials and titanium or titanium nitride.

The insulator 222 and the insulator 224 function as a gate insulator.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has a function of further inhibiting diffusion of one or both of hydrogen and oxygen as compared to the insulator 224.

For the insulator 222, an insulator containing an oxide of one or both of aluminum and hafnium, which is an insulating material, is preferably used. In particular, it is preferable that aluminum oxide, hafnium oxide, an oxide containing aluminum and hafnium (hafnium aluminate), or the like be used as the insulator. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen inside the transistor 200 and inhibit generation of oxygen vacancies in the oxide 230. Moreover, the conductor 205 can be inhibited from reacting with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used as the insulator 222.

A single layer or stacked layers of an insulator containing what is called a high-k material such as aluminum oxide, hafnium oxide, tantalum oxide, zirconium oxide, lead zirconate titanate (PZT), strontium titanate ($SrTiO_3$), or (Ba, Sr)$TiO_3$ (BST) may be used as the insulator 222. With miniaturization and high integration of transistors, a problem such as leakage current may arise because of a thinner gate insulator. When a high-k material is used as an insulator functioning as the gate insulator, a gate potential during operation of the transistor can be lowered while the physical thickness of the gate insulator is maintained.

It is preferable that oxygen be released from the insulator 224 in contact with the oxide 230 by heating. Silicon oxide, silicon oxynitride, or the like is used as appropriate for the insulator 224, for example. When an insulator containing oxygen is provided in contact with the oxide 230, oxygen vacancies in the oxide 230 can be reduced and the reliability of the transistor 200 can be improved.

As the insulator 224, specifically, an oxide material from which part of oxygen is released by heating, in other words, an insulating material including an excess-oxygen region is preferably used. An oxide film that releases oxygen by heating is an oxide film in which the amount of released oxygen converted into oxygen molecules is greater than or equal to $1.0\times10^{18}$ molecules/cm$^3$, preferably greater than or equal to $1.0\times10^{19}$ molecules/cm$^3$, further preferably greater than or equal to $2.0\times10^{19}$ molecules/cm$^3$ or greater than or equal to $3.0\times10^{20}$ molecules/cm$^3$ in TDS (Thermal Desorption Spectroscopy) analysis. Note that the temperature of the film surface in the TDS analysis is preferably within the range of from 100° C. to 700° C., or from 100° C. to 400° C.

One or more of heat treatment, microwave treatment, and RF treatment may be performed in a state in which the insulator including an excess-oxygen region and the oxide 230 are in contact with each other. By the treatment, water or hydrogen in the oxide 230 can be removed. For example, in the oxide 230, dehydrogenation can be performed when a reaction in which a bond of a defect where hydrogen enters an oxygen vacancy ($V_OH$) is cut occurs, i.e., a reaction of "$V_OH \rightarrow V_O+H$" occurs. Some hydrogen generated at this time is bonded to oxygen to be $H_2O$, and removed from the oxide 230 or an insulator near the oxide 230 in some cases. Part of hydrogen is diffused into or gettered by the conductor 242 in some cases.

For the microwave treatment, for example, an apparatus including a power supply that generates high-density plasma or an apparatus including a power supply that applies RF to the substrate side is suitably used. For example, the use of a gas containing oxygen and high-density plasma enables high-density oxygen radicals to be produced, and RF application to the substrate side allows the oxygen radicals generated by the high-density plasma to be efficiently introduced into the oxide 230 or an insulator near the oxide 230. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 200, the heat treatment is preferably performed with the surface of the oxide 230 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This provides oxygen to the oxide 230, and reduces oxygen vacancies. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is performed in a nitrogen gas or inert gas atmosphere.

Note that the oxygen adding treatment performed on the oxide 230 can promote a reaction in which oxygen vacancies in the oxide 230 are filled with supplied oxygen, i.e., a reaction of "$V_O+O \rightarrow null$". Furthermore, hydrogen remaining in the oxide 230 reacts with supplied oxygen, so that the hydrogen can be removed as $H_2O$ (dehydration). This can inhibit recombination of hydrogen remaining in the oxide 230 with oxygen vacancies and formation of $V_OH$.

Note that the insulator 222 and the insulator 224 may each have a stacked-layer structure of two or more layers. In such cases, without limitation to a stacked-layer structure formed of the same material, a stacked-layer structure formed of different materials may be employed.

Note that the oxide 230 preferably has a stacked-layer structure using oxides with different chemical compositions. Specifically, the atomic ratio of the element M to metal elements of main components in the metal oxide used for the oxide 230a is preferably greater than the atomic ratio of the element M to metal elements of main components in the metal oxide used for the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a. A metal oxide that can be used as the oxide 230a or the oxide 230b can be used as the oxide 230c.

Note that in order to increase the on-state current of the transistor 200, an In—Zn oxide is preferably used as the oxide 230. In the case where an In—Zn oxide is used as the oxide 230, for example, a stacked-layer structure in which an In—Zn oxide is used as the oxide 230a and In-M-Zn oxides are used as the oxide 230b and the oxide 230c, or a stacked-layer structure in which an In-M-Zn oxide is used as the oxide 230a and an In—Zn oxide is used as one of the oxide 230b and the oxide 230c can be employed.

The oxide 230b and the oxide 230c preferably have crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. This can inhibit oxygen extraction from the oxide 230b by the source electrode or the drain electrode. This can reduce oxygen extraction from the oxide 230b even when heat treatment is performed; thus, the transistor 200 is stable with respect to high temperatures in a manufacturing process (what is called thermal budget).

In addition, a CAAC-OS is preferably used for the oxide 230c; the c-axis of a crystal included in the oxide 230c is preferably aligned in a direction substantially perpendicular to the formation surface or the top surface of the oxide 230c. The CAAC-OS has a property of making oxygen move easily in the direction perpendicular to the c-axis. Thus, oxygen contained in the oxide 230c can be efficiently supplied to the oxide 230b.

The conduction band minimum of each of the oxide 230a and the oxide 230c is preferably closer to the vacuum level than the conduction band minimum of the oxide 230b. In other words, the electron affinity of each of the oxide 230a and the oxide 230c is preferably smaller than the electron affinity of the oxide 230b. In that case, a metal oxide that can be used for the oxide 230a is preferably used for the oxide 230c. At this time, the oxide 230b serves as a main carrier path.

The conduction band minimum gradually changes at a junction portion of the oxide 230a, the oxide 230b, and the oxide 230c. In other words, the conduction band minimum at a junction portion of the oxide 230a, the oxide 230b, and the oxide 230c continuously changes or is continuously connected. To obtain this, the density of defect states in a mixed layer formed at an interface between the oxide 230a and the oxide 230b and an interface between the oxide 230b and the oxide 230c is preferably made low.

Specifically, when the oxide 230a and the oxide 230b or the oxide 230b and the oxide 230c contain the same element as a main component in addition to oxygen, a mixed layer with a low density of defect states can be formed. For example, an In—Ga—Zn oxide, a Ga—Zn oxide, gallium oxide, or the like may be used for the oxide 230a and the oxide 230c in the case where the oxide 230b is an In—Ga—Zn oxide.

Specifically, as the oxide 230a, a metal oxide with In:Ga:Zn=1:3:4 [atomic ratio] or In:Ga:Zn=1:1:0.5 [atomic ratio] may be used. For the oxide 230b, a metal oxide with In:Ga:Zn=1:1:1 [atomic ratio] or In:Ga:Zn=4:2:3 [atomic ratio] may be used. As the oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] may be used.

When the metal oxide is deposited by a sputtering method, the above atomic ratio is not limited to the atomic ratio of the deposited metal oxide and may be the atomic ratio of a sputtering target used for depositing the metal oxide.

When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have high on-state current and excellent frequency characteristics.

For the conductor 242 (the conductor 242a and the conductor 242b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are conductive materials that are not easily oxidized or materials that maintain the conductivity even when absorbing oxygen.

In that case, contact between the conductor 242 and the oxide 230b may make oxygen in the oxide 230b diffuse into the conductor 242, resulting in oxidation of the conductor 242. It is highly possible that oxidation of the conductor 242 lowers the conductivity of the conductor 242. Note that diffusion of oxygen in the oxide 230b into the conductor 242 can be rephrased as absorption of oxygen in the oxide 230b by the conductor 242.

When oxygen in the oxide 230b is diffused into the conductor 242a and the conductor 242b, another layer is sometimes formed between the conductor 242a and the oxide 230b, and between the conductor 242b and the oxide 230b. Since the layer contains a larger amount of oxygen than the conductor 242a or the conductor 242b, the layer seems to have an insulating property. In this case, a three-layer structure of the conductor 242a or the conductor 242b, the layer, and the oxide 230b can be regarded as a three-layer structure of a metal, an insulator, and a semiconductor and is sometimes referred to as a MIS (Metal-Insulator-Semiconductor) structure or referred to as a diode-connected structure mainly formed of the MIS structure.

Note that hydrogen contained in the oxide 230b or the like is diffused into the conductor 242a or 242b in some cases. In particular, when a nitride containing tantalum is used for the conductor 242a and the conductor 242b, hydrogen contained in the oxide 230b or the like is likely to be diffused into the conductor 242a or the conductor 242b, and the diffused hydrogen is bonded to nitrogen contained in the conductor 242a or the conductor 242b in some cases. That is, hydrogen contained in the oxide 230b or the like is sometimes absorbed by the conductor 242a or the conductor 242b in some cases.

There is a curved surface between the side surface of the conductor 242 and the top surface of the conductor 242 in some cases. That is, the end portion of the side surface and the end portion of the top surface are curved in some cases. The curvature radius of the curved surface at an end portion of the conductor 242 is greater than or equal to 3 nm and less than or equal to 10 nm, preferably greater than or equal to 5 nm and less than or equal to 6 nm, for example. When the end portions are not angular, the coverage with films in later deposition steps is improved.

As illustrated in FIG. 1B, the insulator 254 is preferably in contact with the top surface and side surface of the conductor 242a, the top surface and side surface of the conductor 242b, the side surfaces of the oxide 230a, the side surfaces of the oxide 230b, and part of the top surface of the insulator 224. With such a structure, the insulator 280 is isolated from the insulator 224, the oxide 230a, and the oxide 230b by the insulator 254.

Like the insulator 222, the insulator 254 preferably has a function of inhibiting diffusion of one or both of hydrogen and oxygen. For example, the insulator 254 preferably has a function of further inhibiting diffusion of one or both of hydrogen and oxygen as compared to the insulator 224 and the insulator 280. Thus, diffusion of hydrogen contained in the insulator 280 into the oxide 230a and the oxide 230b can be inhibited. Furthermore, by surrounding the insulator 224, the oxide 230, and the like with the insulator 222 and the insulator 254, diffusion of impurities such as water and hydrogen into the insulator 224 and the oxide 230 from the outside can be inhibited. Consequently, the transistor 200 can have favorable electrical characteristics and reliability.

The insulator 254 is preferably deposited by a sputtering method. When the insulator 254 is deposited by a sputtering method in an oxygen-containing atmosphere, oxygen can be added to the vicinity of a region of the insulator 224 that is in contact with the insulator 254. Accordingly, oxygen can be supplied from the region into the oxide 230 through the insulator 224. Here, with the insulator 254 having a function of inhibiting upward oxygen diffusion, oxygen can be prevented from diffusing from the oxide 230 into the insulator 280. Moreover, with the insulator 222 having a function of inhibiting downward oxygen diffusion, oxygen can be prevented from diffusing from the oxide 230 to the substrate side. In this manner, oxygen is supplied to the channel formation region of the oxide 230. Accordingly, oxygen vacancies in the oxide 230 can be reduced, so that the transistor can be inhibited from becoming normally on.

An insulator containing an oxide of one or both of aluminum and hafnium is preferably deposited as the insulator 254, for example. In this case, the insulator 254 is preferably deposited using an atomic layer deposition (ALD) method. An ALD method is a deposition method providing good coverage, and thus can prevent formation of disconnection or the like due to unevenness of the insulator 254.

An insulator containing aluminum nitride may be used for the insulator 254, for example. Accordingly, a film having an excellent insulating property and high thermal conductivity can be obtained, and thus dissipation of heat generated in driving the transistor 200 can be increased. Alternatively, silicon nitride, silicon nitride oxide, or the like can be used.

Alternatively, an oxide containing gallium may be used for the insulator 254, for example. An oxide containing gallium is preferable because it sometimes has a function of inhibiting diffusion of one or both of hydrogen and oxygen. Note that gallium oxide, gallium zinc oxide, indium gallium zinc oxide, or the like can be used as an oxide containing gallium. Note that when indium gallium zinc oxide is used for the insulator 254, the atomic ratio of gallium to indium is preferably large. When the atomic ratio is increased, the insulating property of the oxide can be high.

The insulator 254 can have a multilayer structure of two or more layers. When the insulator 254 has a stacked-layer structure of two layers, the lower layer and the upper layer of the insulator 254 can be formed by any of the above methods; the lower layer and the upper layer of the insulator 254 may be formed by the same method or different methods. For example, as the insulator 254, the lower layer of the insulator 254 may be formed by a sputtering method in an oxygen-containing atmosphere and then the upper layer of the insulator 254 may be formed by an ALD method. An ALD method is a deposition method providing good coverage, and thus can prevent formation of disconnection or the like due to unevenness of the first layer.

The above material can be used for the lower layer and the upper layer of the insulator 254, and the lower layer and the upper layer of the insulator 254 may be formed using the same material or different materials. For example, a stacked-layer structure of silicon oxide, silicon oxynitride, silicon nitride oxide, or silicon nitride and an insulator having a function of inhibiting passage of oxygen and impurities such as hydrogen may be employed. As the insulator having a function of inhibiting passage of oxygen and impurities such as hydrogen, an insulator containing an oxide of one or both of aluminum and hafnium can be used, for example.

The insulator 250 functions as a gate insulator. The insulator 250 is preferably positioned in contact with at least part of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

Like the insulator 224, the insulator 250 is preferably formed using an insulator that releases oxygen by heating. When an insulator from which oxygen is released by heating is provided as the insulator 250 in contact with at least part of the oxide 230c, oxygen can be efficiently supplied to the channel formation region of the oxide 230b and oxygen defects in the channel formation region of the oxide 230b can be reduced. Thus, a transistor that has stable electrical characteristics with a small variation in electrical characteristics and improved reliability can be provided. Furthermore, as in the insulator 224, the concentration of impurities such as water and hydrogen in the insulator 250 is preferably reduced. The thickness of the insulator 250 is preferably greater than or equal to 1 nm and less than or equal to 20 nm.

Although the insulator 250 is a single layer in FIG. 1A to FIG. 1C, a stacked-layer structure of two or more layers may be employed. In the case where the insulator 250 has a stacked-layer structure including two layers, it is preferable that a lower layer of the insulator 250 be formed using an insulator from which oxygen is released by heating and an upper layer of the insulator 250 be formed using an insulator having a function of inhibiting diffusion of oxygen. With such a structure, oxygen contained in the lower layer of the insulator 250 can be inhibited from diffusing into the conductor 260. That is, a reduction in the amount of oxygen supplied to the oxide 230 can be inhibited. In addition, oxidation of the conductor 260 due to oxygen from the lower layer of the insulator 250 can be inhibited. For example, the lower layer of the insulator 250 can be formed using the above-described material that can be used for the insulator 250, and the upper layer of the insulator 250 can be formed using a material similar to that for the insulator 222.

In the case where silicon oxide, silicon oxynitride, or the like is used for the lower layer of the insulator 250, the upper layer of the insulator 250 may be formed using an insulating material that is a high-k material having a high relative dielectric constant. The gate insulator having a stacked-layer structure of the lower layer of the insulator 250 and the upper layer of the insulator 250 can be thermally stable and can have a high dielectric constant. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used as the upper layer of the insulator 250. Alternatively, the metal oxide that ca be used for the oxide 230 can be used. In particular, an insulator containing an oxide of one or both of aluminum and hafnium is preferably used.

Furthermore, a metal oxide may be provided between the insulator 250 and the conductor 260. The metal oxide preferably inhibits diffusion of oxygen from the insulator 250 into the conductor 260. Providing the metal oxide that inhibits diffusion of oxygen inhibits diffusion of oxygen from the insulator 250 into the conductor 260. That is, a reduction in the amount of oxygen supplied to the oxide 230 can be inhibited. In addition, oxidation of the conductor 260 due to oxygen from the insulator 250 can be inhibited.

The metal oxide preferably has a function of part of the first gate electrode. For example, a metal oxide that can be used for the oxide 230 can be used as the metal oxide. In that case, when the conductor 260a is deposited by a sputtering method, the metal oxide can have a reduced electric resistance value to be a conductor. This can be referred to as an OC (Oxide Conductor) electrode. For example, the oxide semiconductor that can be used for the oxide 230 can also be used for the metal oxide when the resistance thereof is reduced.

With the upper layer of the insulator 250 and/or the above metal oxide, the on-state current of the transistor 200 can be increased without a reduction in the influence of the electric field from the conductor 260. Since the distance between the conductor 260 and the oxide 230 is kept by the physical thicknesses of the insulator 250 and the metal oxide, leakage current between the conductor 260 and the oxide 230 can be reduced. Moreover, when the stacked-layer structure of the insulator 250 and the metal oxide is provided, the physical distance between the conductor 260 and the oxide 230 and the intensity of electric field applied to the oxide 230 from the conductor 260 can be easily adjusted as appropriate.

The conductor 260 preferably includes the conductor 260a and the conductor 260b positioned over the conductor 260a. For example, the conductor 260a is preferably positioned to cover a bottom surface and a side surface of the conductor 260b. Although the conductor 260 has a two-layer structure of the conductor 260a and the conductor 260b in FIG. 1A to FIG. 1C, the conductor 260 can have a single-layer structure or a stacked-layer structure of three or more layers.

For the conductor 260a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of oxygen atoms, oxygen molecules, and the like).

In addition, when the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure, for example, a stacked-layer structure of any of the above conductive materials and titanium or titanium nitride.

In the transistor 200, the conductor 260 is formed in a self-aligned manner to fill an opening formed in the insulator 280 and the like. The formation of the conductor 260 in this manner allows the conductor 260 to be positioned certainly in a region between the conductor 242a and the conductor 242b without alignment.

As illustrated in FIG. 1C in the channel width direction of the transistor 200, when the bottom surface of the insulator 222 is considered as a benchmark, the level of the bottom surface of the conductor 260 in a region where the conductor 260 and the oxide 230b do not overlap with each other is preferably lower than the level of the bottom surface of the oxide 230b. When the conductor 260 functioning as the gate electrode covers the side and top surfaces of the channel formation region of the oxide 230b with the insulator 250 and the like therebetween, the electric field of the conductor 260 is likely to affect the entire channel formation region of the oxide 230b. Thus, the on-state current of the transistor 200 can be increased and the frequency characteristics of the transistor 200 can be improved. When the bottom surface of the insulator 222 is a benchmark, the difference between the level of the bottom surface of the conductor 260 in a region where the conductor 260, the oxide 230a, and the oxide 230b do not overlap with each other and the level of the bottom surface of the oxide 230b is greater than or equal to 0 nm and less than or equal to 100 nm, preferably greater than or equal to 3 nm and less than or equal to 50 nm, further preferably greater than or equal to 5 nm and less than or equal to 20 nm.

The insulator 280 is provided over the insulator 224, the oxide 230a, the oxide 230b, the conductor 242, and the insulator 254. In addition, a top surface of the insulator 280 may be planarized.

The insulator 280 functioning as an interlayer film preferably has a low dielectric constant. When a material with a low dielectric constant is used for the interlayer film, the parasitic capacitance generated between wirings can be reduced. The insulator 280 is preferably formed using a material similar to that used for the insulator 216, for example. In particular, silicon oxide and silicon oxynitride, which have thermal stability, are preferable. Materials such as silicon oxide, silicon oxynitride, and porous silicon oxide, in each of which a region containing oxygen released by heating can be easily formed, are particularly preferable.

The concentration of impurities such as water and hydrogen in the insulator 280 is preferably reduced. Moreover, the insulator 280 preferably has a low hydrogen concentration and includes an excess-oxygen region or excess oxygen, and may be formed using a material similar to that for the insulator 216, for example. The insulator 280 may have a stacked-layer structure of the above materials; silicon oxide formed by a sputtering method and silicon oxynitride formed by a chemical vapor deposition (CVD) method stacked thereover. Furthermore, silicon nitride may be stacked thereover.

The insulator 282 or the insulator 283 preferably functions as barrier insulating films that inhibit impurities such as water and hydrogen from diffusing into the insulator 280 from above. The insulator 282 or the insulator 283 preferably functions as barrier insulating films for inhibiting passage of oxygen. As the insulator 282 and the insulator 283, for example, an insulator such as aluminum oxide, silicon nitride, or silicon nitride oxide may be used. The insulator 282 may be formed using aluminum oxide that has high blocking property against oxygen and the insulator 283 may be formed using silicon nitride that has high blocking property against hydrogen, for example.

The insulator 274 functioning as an interlayer film is preferably provided over the insulator 282. As in the insulator 224 and the like, the concentration of impurities such as water and hydrogen in the insulator 274 is preferably reduced.

For the conductor 240a and the conductor 240b, a conductive material containing tungsten, copper, or aluminum as its main component is preferably used. The conductor 240a and the conductor 240b may each have a stacked-layer structure.

In the case where the conductor 240a and the conductor 240b each have a stacked-layer structure, a conductive material having a function of inhibiting transmission of impurities such as water and hydrogen is preferably used for a conductor in contact with the insulator 281, the insulator 274, the insulator 283, the insulator 282, the insulator 280, and the insulator 254. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. The use of the conductive material can prevent oxygen added to the insulator 280 from being absorbed by the conductor 240a and the conductor 240b. Moreover, impurities such as water and hydrogen contained in a layer above the insulator 281 can be inhibited from entering the oxide 230 through the conductor 240a and the conductor 240b.

For the insulator 241a and the insulator 241b, for example, an insulator such as silicon nitride, aluminum oxide, or silicon nitride oxide may be used. Since the insulator 241a and the insulator 241b are provided in contact with the insulator 254, impurities such as water and hydrogen contained in the insulator 280 or the like can be inhibited from entering the oxide 230 through the conductor 240a and the conductor 240b. In particular, silicon nitride is suitable because of having a high blocking property against hydrogen. In addition, oxygen contained in the insulator 280 can be prevented from being absorbed by the conductor 240a and the conductor 240b.

The conductor 246 (the conductor 246a and the conductor 246b) functioning as a wiring may be provided in contact with a top surface of the conductor 240a and a top surface of the conductor 240b. The conductor 246 is preferably formed using a conductive material containing tungsten, copper, or aluminum as its main component. Furthermore, the conductor may have a stacked-layer structure and may be a stack of titanium or titanium nitride and any of the above conductive materials, for example. Note that the conductor may be formed to be embedded in an opening provided in an insulator.

<Material Constituting Semiconductor Device>

Constituent materials that can be used for the semiconductor device are described below.

<<Substrate>>

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate using silicon, germanium, or the like as a material and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<<Insulator>>

Examples of an insulator include an oxide, a nitride, an oxynitride, a nitride oxide, a metal oxide, a metal oxynitride, and a metal nitride oxide, each of which has an insulating property.

As miniaturization and high integration of transistors progress, for example, a problem such as leakage current may arise because of a thinner gate insulator. When a high-k material is used as the insulator functioning as a gate insulator, the voltage during operation of the transistor can be lowered while the physical thickness of the gate insulator is maintained. In contrast, when a material with a low relative dielectric constant is used as the insulator functioning as an interlayer film, parasitic capacitance generated between wirings can be reduced. Accordingly, a material is preferably selected depending on the function of an insulator.

Examples of the insulator with a high relative dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using a metal oxide is surrounded by insulators having a function of inhibiting passage of oxygen and impurities such as hydrogen, the electrical characteristics of the transistor can be stable. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

The insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be filled.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With use of such a material, hydrogen contained in the metal oxide where the channel is formed can be trapped in some cases. Alternatively, hydrogen entering from an external insulator or the like can be trapped in some cases.

<<Metal Oxide>>

The oxide 230 is preferably formed using a metal oxide functioning as a semiconductor (an oxide semiconductor). A metal oxide that can be used for the oxide 230 of one embodiment of the present invention is described below.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, the element M, and zinc is considered. Note that the element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also referred to as a metal oxide in some cases. A metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear grain boundary even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary cannot be observed in the CAAC-OS; thus, it can be said that a reduction in electron mobility due to the crystal grain boundary is less likely to occur. Entry of impurities, formation of defects, or the like might decrease the crystallinity of a metal oxide, which means that the CAAC-OS is a metal oxide having small amounts of impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that an In—Ga—Zn oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Impurity]

Here, the influence of each impurity in the metal oxide will be described.

Entry of the impurities into the oxide semiconductor causes formation of defect states or oxygen vacancies in some cases. Thus, when impurities enter a channel formation region of the oxide semiconductor, the electrical characteristics of a transistor using the oxide semiconductor are likely to vary and its reliability is degraded in some cases. Moreover, when the channel formation region includes oxygen vacancies, the transistor tends to have normally-on characteristics.

In contrast, a transistor using a metal oxide is likely to have normally-on characteristics (characteristics in that a channel exists without voltage application to a gate electrode and current flows in a transistor) owing to an impurity and an oxygen vacancy in the metal oxide that affect the electrical characteristics. In the case where the transistor is driven in the state where excess oxygen exceeding the proper amount is included in the metal oxide, the valence of the excess oxygen atoms is changed and the electrical characteristics of the transistor are changed, so that reliability is decreased in some cases.

Thus, a metal oxide having a low carrier concentration is preferably used for a channel formation region of a transistor of one embodiment of the present invention. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Note that in this specification and the like, the case where the carrier concentration of the metal oxide in the channel formation region is lower than or equal to $1\times10^{16}$ cm$^{-3}$ is defined as a substantially highly purified intrinsic state.

The carrier concentration of the metal oxide in the channel formation region is preferably lower than or equal to $1\times10^{18}$ cm$^{-3}$, further preferably lower than or equal to $1\times10^{17}$ cm$^{-3}$, still further preferably lower than or equal to $1\times10^{16}$ cm$^{-3}$, yet further preferably lower than $1\times10^{13}$ cm$^{-3}$, and yet still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

Examples of impurities in a metal oxide include hydrogen, nitrogen, alkali metal, alkaline earth metal, iron, nickel, and silicon. In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. Moreover, in the case where hydrogen enters an oxygen vacancy in the metal oxide, the oxygen vacancy and the hydrogen are bonded to each other to form $V_OH$ in some cases. In some cases, a defect in which hydrogen has entered an oxygen vacancy ($V_OH$) functions as a donor and generates an electron serving as a carrier. In other cases, bonding of part of hydrogen to oxygen bonded to a metal atom generates electrons serving as carriers. Thus, a transistor using a metal oxide containing a large amount of hydrogen is likely to have normally-on characteristics. Moreover, hydrogen in a metal oxide easily moves by stress such as heat and an electric field; thus, the reliability of a transistor may be low when the metal oxide contains a plenty of hydrogen.

In one embodiment of the present invention, $V_OH$ in the oxide 230 is preferably reduced as much as possible so that the oxide 230 becomes a highly purified intrinsic or substantially highly purified intrinsic oxide. It is important to remove impurities such as moisture and hydrogen in a metal oxide (sometimes described as dehydration or dehydrogenation treatment) and to compensate for oxygen vacancies by supplying oxygen to the metal oxide (sometimes described as oxygen supplying treatment) to obtain a metal oxide whose $V_OH$ is reduced enough. When a metal oxide in which impurities such as $V_OH$ are sufficiently reduced is used for a channel formation region of a transistor, stable electrical characteristics can be given.

A defect in which hydrogen has entered an oxygen vacancy ($V_OH$) can function as a donor in the metal oxide. However, it is difficult to evaluate the defects quantitatively. Thus, the metal oxide is sometimes evaluated by not its donor concentration but its carrier concentration. Therefore, in this specification and the like, the carrier concentration in a state where an electric field is assumed to be not applied is sometimes used, instead of the donor concentration, as the parameter of the metal oxide. That is, "carrier concentration" in this specification and the like can be replaced with "donor concentration" in some cases. In addition, "carrier concentration" in this specification and the like can be replaced with "carrier density".

Therefore, hydrogen in the metal oxide is preferably reduced as much as possible. Specifically, the hydrogen concentration of the metal oxide obtained by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide with a sufficiently low concentration of impurities such as hydrogen is used for a channel formation region of a transistor, the transistor can have stable electrical characteristics.

The above-described defect states may include a trap state. Charges trapped by the trap states in the metal oxide take a long time to be released and may behave like fixed charges. Thus, a transistor whose channel formation region includes a metal oxide having a high density of trap states has unstable electrical characteristics in some cases.

If the impurities exist in the channel formation region of the oxide semiconductor, the crystallinity of the channel formation region may decrease, and the crystallinity of an oxide provided in contact with the channel formation region may decrease. Low crystallinity of the channel formation region tends to result in deterioration in stability or reliability of the transistor. Moreover, if the crystallinity of the oxide provided in contact with the channel formation region is low, an interface state may be formed and the stability or reliability of the transistor may deteriorate.

Therefore, the reduction in concentration of impurities in and around the channel formation region of the oxide semiconductor is effective in improving the stability or reliability of the transistor. Examples of impurities include hydrogen, nitrogen, an alkali metal, an alkaline earth metal, iron, nickel, and silicon. A metal oxide with a low impurity concentration has a low density of defect states and thus has a low density of trap states in some cases.

<<Other Semiconductor Materials>>

A semiconductor material that can be used for the oxide 230 is not limited to the above metal oxides. A semiconductor material which has a band gap (a semiconductor material that is not a zero-gap semiconductor) can be used for the oxide 230. For example, a single element semiconductor such as silicon, a compound semiconductor such as gallium arsenide, or a layered material functioning as a semiconductor (also referred to as an atomic layered material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

As the oxide 230, a transition metal chalcogenide functioning as a semiconductor is preferably used, for example. Specific examples of the transition metal chalcogenide which can be used for the oxide 230 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), zirconium selenide (typically $ZrSe_2$).

<Manufacturing Method of Semiconductor Device>

Next, a method for manufacturing a semiconductor device that is one embodiment of the present invention, which is illustrated in FIG. 1A to FIG. 1D, is described with reference to FIG. 4A to FIG. 11D.

FIG. 4A, FIG. 5A, FIG. 6A, FIG. 7A, FIG. 8A, FIG. 9A, FIG. 10A, and FIG. 11A are top views. FIG. 4B, FIG. 5B, FIG. 6B, FIG. 7B, FIG. 8B, FIG. 9B, FIG. 10B, and FIG. 11B are cross-sectional views corresponding to portions indicated by dashed-dotted lines A1-A2 in FIG. 4A, FIG. 5A, FIG. 6A, FIG. 7A, FIG. 8A, FIG. 9A, FIG. 10A, and FIG. 11A, respectively, and are also cross-sectional views of the transistor 200 in the channel length direction. Furthermore, FIG. 4C, FIG. 5C, FIG. 6C, FIG. 7C, FIG. 8C, FIG. 9C, FIG. 10C, and FIG. 11C are cross-sectional views corresponding to portions indicated by dashed-dotted lines A3-A4 in FIG. 4A, FIG. 5A, FIG. 6A, FIG. 7A, FIG. 8A, FIG. 9A, FIG. 10A, and FIG. 11A, respectively, and are also cross-sectional views of the transistor 200 in the channel width direction. Moreover, FIG. 4D, FIG. 5D, FIG. 6D, FIG. 7D, FIG. 8D, FIG. 9D, FIG. 10D, and FIG. 11D are cross-sectional views corresponding to portions indicated by dashed-dotted lines A5-A6 in FIG. 4A, FIG. 5A, FIG. 6A, FIG. 7A, FIG. 8A, FIG. 9A, FIG. 10A, and FIG. 11A, respectively. Note that for simplification of the drawing, some components are not illustrated in the top views of FIG. 4A, FIG. 5A, FIG. 6A, FIG. 7A, FIG. 8A, FIG. 9A, FIG. 10A, and FIG. 11A.

First, a substrate (not illustrated) is prepared, and the insulator 212 is deposited over the substrate. The insulator 212 can be deposited by a sputtering method, a CVD method, a molecular beam epitaxy (MBE) method, a pulsed laser deposition (PLD) method, an ALD method, or the like.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. In contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

In an ALD method, one atomic layer can be deposited at a time using self-regulating characteristics of atoms. Thus, the ALD method has advantages such as deposition of an extremely thin film, deposition on a component with a high aspect ratio, deposition of a film with a small number of defects such as pinholes, deposition with good coverage, and low-temperature deposition. Furthermore, the ALD method includes a PEALD (plasma enhanced ALD) method using plasma. The use of plasma is sometimes preferable because deposition at lower temperature is possible. Note that a precursor used in the ALD method sometimes contains impurities such as carbon. Thus, in some cases, a film provided by the ALD method contains impurities such as carbon in a larger amount than a film provided by another deposition method. Note that impurities can be quantified by X-ray photoelectron spectroscopy (XPS).

Unlike a film formation method in which particles ejected from a target or the like are deposited, a CVD method and an ALD method are film deposition methods in which a film is deposited by reaction at a surface of an object. Thus, a CVD method and an ALD method are film deposition methods that enable favorable step coverage almost regardless of the shape of an object. In particular, an ALD method has excellent step coverage and excellent thickness uniformity and thus is suitable for covering a surface of an opening with a high aspect ratio, for example. On the other hand, an ALD method has a relatively low deposition rate, and thus is preferably used in combination with another film deposition method with a high deposition rate, such as a CVD method, in some cases.

Each of a CVD method and an ALD method enables the composition of a film that is to be deposited to be controlled with a flow rate ratio of source gases. For example, by each of a CVD method and an ALD method, a film with a certain composition can be deposited depending on the flow rate ratio of the source gases. Moreover, with each of a CVD method and an ALD method, by changing the flow rate ratio of the source gases while depositing the film, a film whose composition is continuously changed can be formed. In the case where the film is deposited while changing the flow rate ratio of the source gases, as compared to the case where the film is deposited using a plurality of deposition chambers, the time taken for the deposition can be shortened because the time taken for transfer and pressure adjustment is omitted. Thus, the productivity of the semiconductor device can be increased in some cases.

In this embodiment, for the insulator 212, silicon nitride is deposited by a CVD method. When an insulator through which copper is less likely to pass, such as silicon nitride, is used for the insulator 212 in such a manner, even in the case where a metal that is likely to diffuse, such as copper, is used for a conductor in a layer (not illustrated) below the insulator 212, diffusion of the metal into an upper portion through the insulator 212 can be inhibited. The use of an insulator through which impurities such as water and hydrogen are less likely to pass, such as silicon nitride, can inhibit diffusion of impurities such as water and hydrogen contained in a layer under the insulator 212.

Next, the insulator 214 is deposited over the insulator 212. The insulator 214 can be deposited by a sputtering method, a CVD method, an MBE method, a PLD method, an ALD method, or the like. In this embodiment, aluminum oxide is used for the insulator 214.

Next, the insulator 216 is deposited over the insulator 214. The insulator 216 can be deposited by a sputtering method, a CVD method, an MBE method, a PLD method, an ALD method, or the like.

Then, an opening reaching the insulator 214 is formed in the insulator 216. A groove and a slit, for example, are included in the category of the opening. A region where an opening is formed may be referred to as an opening portion. Wet etching can be used for the formation of the opening; however, dry etching is preferably used for microfabrication. As the insulator 214, it is preferable to select an insulator that functions as an etching stopper film used in forming the groove by etching the insulator 216. For example, in the case where silicon oxide is used as the insulator 216 in which the groove is to be formed, silicon nitride, aluminum oxide, or hafnium oxide is preferably used as the insulator 214.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

After the formation of the opening, a conductive film to be the conductor 205a is deposited. The conductive film preferably includes a conductor that has a function of inhibiting passage of oxygen. For example, tantalum nitride, tungsten nitride, or titanium nitride can be used. Alternatively, a stacked-layer film of the conductor having a function of inhibiting passage of oxygen and tantalum, tungsten, titanium, molybdenum, aluminum, copper, or a molybdenum-tungsten alloy can be used. The conductive film can be deposited by a sputtering method, a CVD method, an MBE method, a PLD method, an ALD method, or the like.

In this embodiment, the conductive film to be the conductor 205a has a multilayer structure. First, tantalum nitride is deposited by a sputtering method, and titanium nitride is stacked over the tantalum nitride. When such metal nitrides are used for a lower layer of the conductor 205b, even in the case where a metal that is likely to diffuse, such as copper, is used for a conductive film to be a conductor 205b described below, outward diffusion of the metal from the conductor 205a can be inhibited.

Next, a conductive film to be the conductor 205b is deposited. The conductive film can be deposited by a plating method, a sputtering method, a CVD method, an MBE method, a PLD method, an ALD method, or the like. In this embodiment, for the conductive film, a low-resistance conductive material such as copper is deposited.

Next, CMP treatment is performed, thereby removing part of the conductive film to be the conductor 205a and part of the conductive film to be the conductor 205b to expose the insulator 216. As a result, the conductor 205a and the conductor 205b remain only in the opening portion. Thus, the conductor 205 whose top surface is flat can be formed (see FIG. 4B to FIG. 4D). Note that the insulator 216 is partly removed by the CMP treatment in some cases.

Although the conductor 205 is embedded in the opening in the insulator 216 in the above description, this embodiment is not limited to this structure. For example, the surface of the conductor 205 may be exposed in the following manner: the conductor 205 is formed over the insulator 214, the insulator 216 is formed over the conductor 205, and the insulator 216 is subjected to the CMP treatment so that the insulator 216 is partly removed.

Next, the insulator 222 is deposited over the insulator 216 and the conductor 205. An insulator containing an oxide of one or both of aluminum and hafnium is preferably deposited as the insulator 222. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from diffusing into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Sequentially, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

In this embodiment, the heat treatment is performed in such a manner that treatment is performed at 400° C. in a nitrogen atmosphere for one hour after the deposition of the insulator 222, and then another treatment is successively performed at 400° C. in an oxygen atmosphere for one hour. By the heat treatment, impurities such as water and hydrogen contained in the insulator 222 can be removed, for example. The heat treatment can also be performed after the deposition of the insulator 224, for example.

Next, the insulator 224 is deposited over the insulator 222. The insulator 224 can be deposited by a sputtering method, a CVD method, an MBE method, a PLD method, an ALD method, or the like. In this embodiment, for the insulator 224, a silicon oxynitride film is deposited by a CVD method.

Here, plasma treatment containing oxygen may be performed under reduced pressure so that an excess-oxygen region can be formed in the insulator 224. For the plasma treatment with oxygen, an apparatus including a power source for generating high-density plasma using a microwave is preferably used, for example. Alternatively, a power source for applying an RF (Radio Frequency) to a substrate side may be included. The use of high-density plasma enables high-density oxygen radicals to be produced, and RF application to the substrate side allows the oxygen radicals generated by the high-density plasma to be efficiently introduced into the insulator 224. Alternatively, after plasma treatment with an inert gas is performed using this apparatus, plasma treatment with oxygen may be performed to compensate for released oxygen. Note that impurities such as water and hydrogen contained in the insulator 224 can be removed by selecting the conditions for the plasma treatment appropriately. In that case, the heat treatment does not need to be performed.

Here, after aluminum oxide is deposited over the insulator 224 by a sputtering method, for example, the aluminum oxide may be subjected to CMP treatment until the insulator 224 is reached. The CMP treatment can planarize and smooth the surface of the insulator 224. When the CMP treatment is performed on the aluminum oxide placed over the insulator 224, it is easy to detect the endpoint of the CMP treatment. Although part of the insulator 224 is polished by the CMP treatment and the thickness of the insulator 224 is reduced in some cases, the thickness can be adjusted when the insulator 224 is deposited. Planarizing and smoothing the surface of the insulator 224 can prevent deterioration of the coverage with an oxide deposited later and a decrease in the yield of the semiconductor device in some cases. The deposition of aluminum oxide over the insulator 224 by a sputtering method is preferred because oxygen can be added to the insulator 224.

Figure 4A:
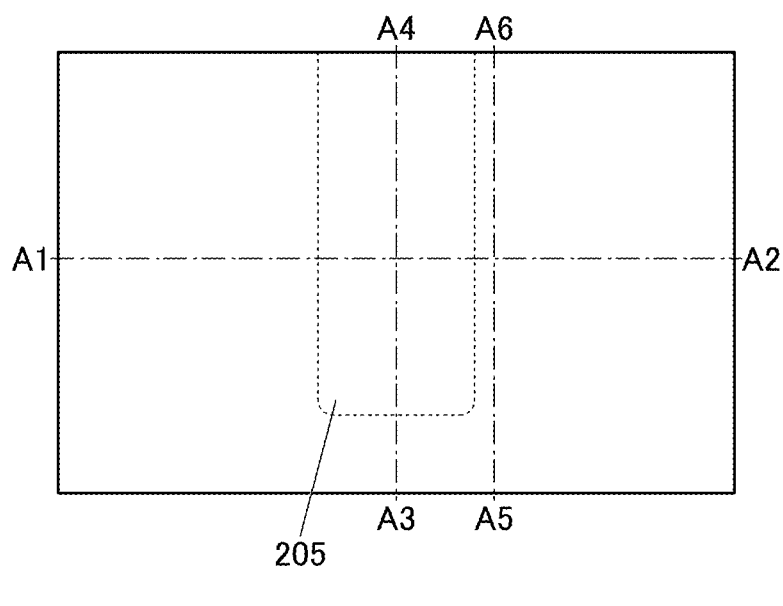
FIG. 4A is a top view illustrating a manufacturing method of a semiconductor device of one embodiment of the present invention.
Figure 4C:
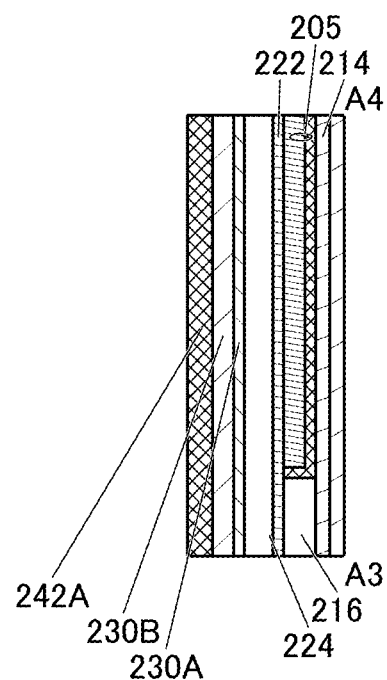
FIG. 4B to FIG. 4D are cross-sectional views illustrating a manufacturing method of a semiconductor device of one embodiment of the present invention.
Figure 4B:
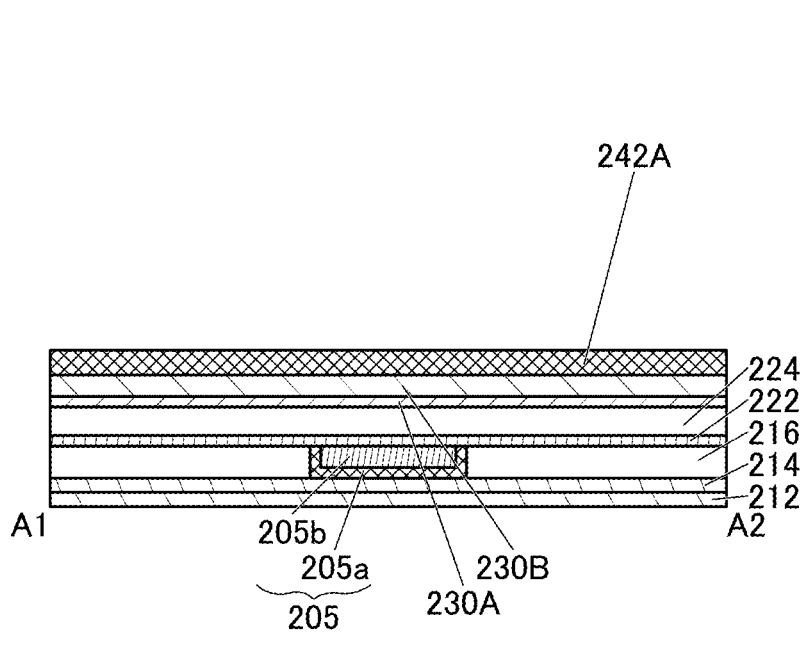
Figure 4D:
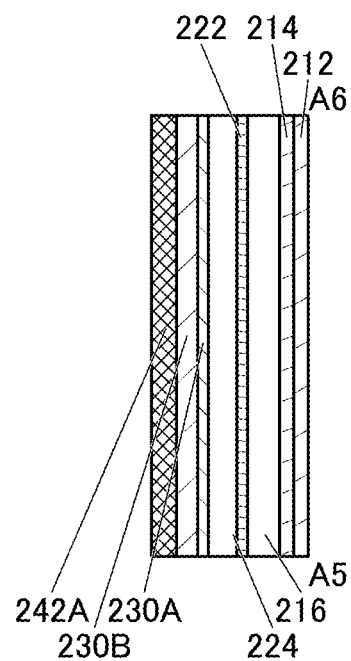
Figure 5A:
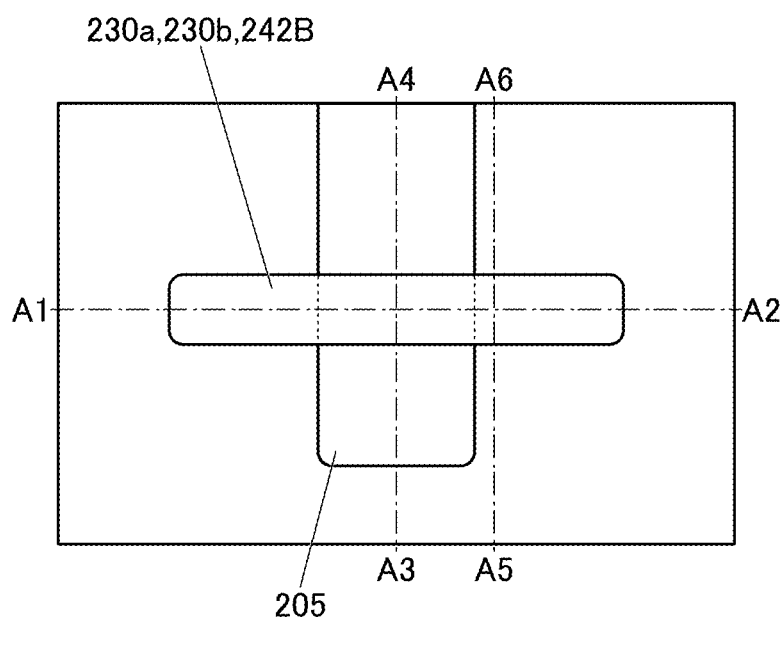
FIG. 5A is a top view illustrating a manufacturing method of a semiconductor device of one embodiment of the present invention.
Figure 5C:
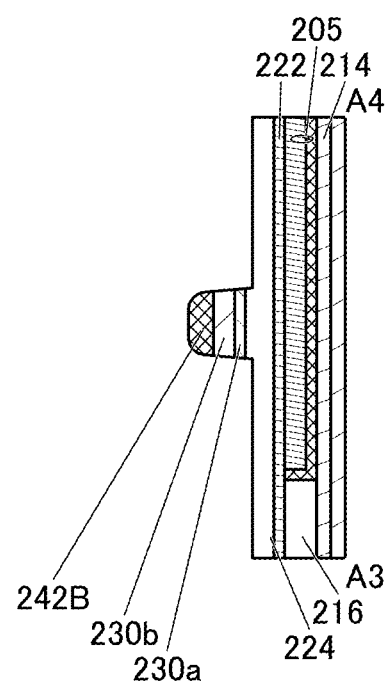
FIG. 5B to FIG. 5D are cross-sectional views illustrating a manufacturing method of a semiconductor device of one embodiment of the present invention.
Figure 5B:
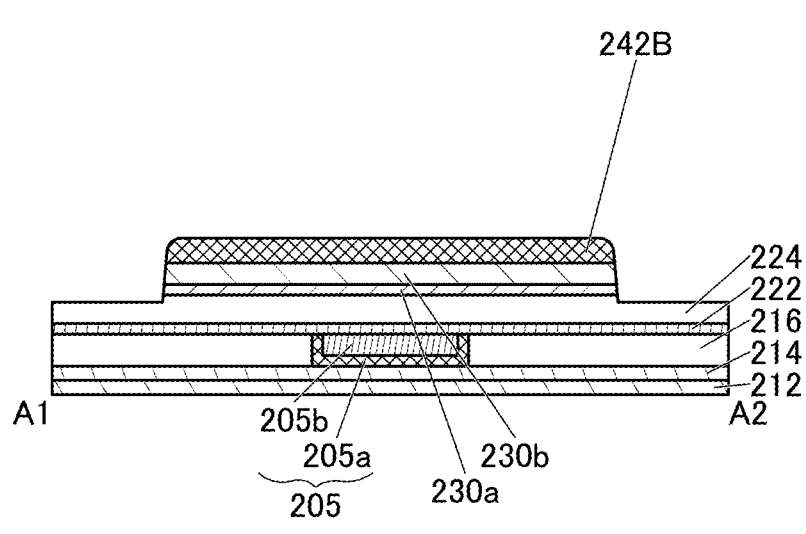
Figure 5D:
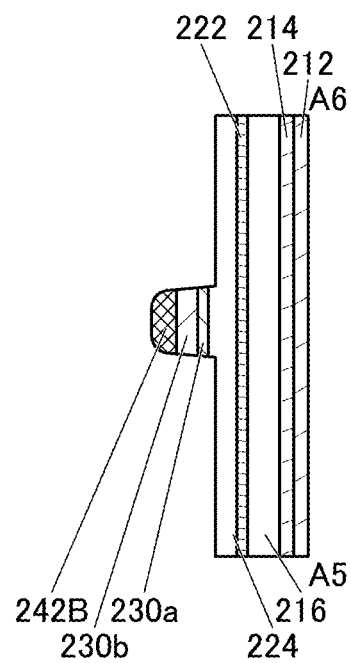

Next, an oxide film 230A and an oxide film 230B are deposited in this order over the insulator 224 (see FIG. 4B to FIG. 4D). Note that it is preferable to deposit the oxide film 230A and the oxide film 230B successively without exposure to the air. By the deposition without exposure to the air, impurities or moisture from the atmospheric environment can be prevented from being attached onto the oxide film 230A and the oxide film 230B, so that the vicinity of the interface between the oxide film 230A and the oxide film 230B can be kept clean.

The oxide film 230A and the oxide film 230B can be deposited by a sputtering method, a CVD method, an MBE method, a PLD method, an ALD method, or the like.

For example, in the case where the oxide film 230A and the oxide film 230B are deposited by a sputtering method, oxygen or a mixed gas of oxygen and a rare gas is used as a sputtering gas. Increasing the proportion of oxygen contained in the sputtering gas can increase the amount of excess oxygen in the deposited oxide films. In the case where the oxide films are deposited by a sputtering method, the above In-M-Zn oxide target or the like can be used.

In particular, when the oxide film 230A is deposited, part of oxygen contained in the sputtering gas is supplied to the insulator 224 in some cases. Thus, the proportion of oxygen contained in the sputtering gas is higher than or equal to 70%, preferably higher than or equal to 80%, further preferably 100%.

In the case where the oxide film 230B is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained. Note that one embodiment of the present invention is not limited thereto. In the case where the oxide film 230B is formed by a sputtering method and the proportion of oxygen contained in the sputtering gas for deposition is higher than or equal to 1% and lower than or equal to 30%, preferably higher than or equal to 5% and lower than or equal to 20%, an oxygen-deficient oxide semiconductor is formed. A transistor in which an oxygen-deficient oxide semiconductor is used for its channel formation region can have relatively high field-effect mobility. Furthermore, when the deposition is performed while the substrate is heated, the crystallinity of the oxide film can be improved.

In this embodiment, the oxide film 230A is formed by a sputtering method using an oxide target with In:Ga:Zn=1:3:4 [atomic ratio]. In addition, the oxide film 230B is formed by a sputtering method using an oxide target with In:Ga:Zn=4:2:4.1 [atomic ratio]. Note that each of the oxide films is formed to have characteristics required for the oxide 230a and the oxide 230b by selecting the deposition condition and the atomic ratio as appropriate.

Note that the insulator 222, the insulator 224, the oxide film 230A, and the oxide film 230B are preferably deposited without exposure to the air. For example, a multi-chamber deposition apparatus is used.

Next, heat treatment may be performed. For the heat treatment, the above-described heat treatment conditions can be used. Through the heat treatment, impurities such as water and hydrogen in the oxide film 230A and the oxide film 230B can be removed, for example. In this embodiment, treatment is performed at 400° C. in a nitrogen atmosphere for one hour, and treatment is successively performed at 400° C. in an oxygen atmosphere for one hour.

Next, a conductive film 242A is deposited over the oxide film 230B (see FIG. 4B to FIG. 4D). The conductive film 242A can be deposited by a sputtering method, a CVD method, an MBE method, a PLD method, an ALD method, or the like. Note that heat treatment may be performed before the formation of the conductive film 242A. This heat treatment may be performed under reduced pressure, and the conductive film 242A may be successively formed without exposure to the air. The treatment enables removal of moisture and hydrogen adsorbed onto the surface of the oxide film 230B and the like, and further enables reductions in the moisture concentration and the hydrogen concentration of the oxide film 230A and the oxide film 230B. The heat treatment is preferably performed at a temperature higher than or equal to 100° C. and lower than or equal to 400° C. In this embodiment, the heat treatment is performed at 200° C.

Next, the oxide film 230A, the oxide film 230B, and the conductive film 242A are processed into island shapes by a lithography method to form the oxide 230a, the oxide 230b, and a conductive layer 242B (see FIG. 5A to FIG. 5D). A dry etching method or a wet etching method can be used for the processing. Processing by a dry etching method is suitable for microfabrication. The oxide film 230A, the oxide film 230B, and the conductive film 242A may be processed under different conditions. Note that in this step, the thickness of a region of the insulator 224 which does not overlap with the oxide 230a becomes small in some cases.

Note that in the lithography method, first, a resist is exposed to light through a mask. Next, a region exposed to light is removed or left using a developer, so that a resist mask is formed. Then, etching treatment through the resist mask is conducted, whereby a conductor, a semiconductor, an insulator, or the like can be processed into a desired shape. The resist mask is formed by, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed by dry etching treatment such as ashing, wet etching treatment, wet etching treatment after dry etching treatment, or dry etching treatment after wet etching treatment.

In addition, a hard mask formed of an insulator or a conductor may be used instead of the resist mask. In the case where a hard mask is used, a hard mask with a desired shape can be formed by forming an insulating film or a conductive film to be the hard mask material over the conductive film 242A, forming a resist mask thereover, and then etching the hard mask material. The etching of the conductive film 242A and the like may be performed after removing the resist mask or with the resist mask remaining. In the latter case, the resist mask sometimes disappears during the etching. The hard mask may be removed by etching after the etching of the conductive film 242A and the like. Meanwhile, the hard mask is not necessarily removed when the hard mask material does not affect subsequent steps or can be utilized in the subsequent steps.

Here, the oxide 230a, the oxide 230b, and the conductive layer 242B are formed so as to at least partly overlap with the conductor 205. It is preferable that the side surfaces of the oxide 230a, the oxide 230b, and the conductive layer 242B be substantially perpendicular to a top surface of the insulator 222. When the side surfaces of the oxide 230a, the oxide 230b, and the conductive layer 242B are substantially perpendicular to the top surface of the insulator 222, a plurality of transistors 200 can be provided in a smaller area and at a higher density. Alternatively, a structure may be employed in which the angle formed by the side surfaces of the oxide 230a, the oxide 230b, and the conductive layer 242B and the top surface of the insulator 222 is a small angle. In that case, the angle formed by the side surfaces of the oxide 230a, the oxide 230b, and the conductive layer 242B and the top surface of the insulator 222 is preferably greater than or equal to 60° and less than 70°. With such a shape, coverage with the insulator 254 and the like can be improved in a later step, so that defects such as voids can be reduced.

There is a curved surface between the side surface of the conductive layer 242B and a top surface of the conductive layer 242B. That is, an end portion of the side surface and an end portion of the top surface are preferably curved. The curvature radius of the curved surface at the end portion of the conductive layer 242B is greater than or equal to 3 nm and less than or equal to 10 nm, preferably greater than or equal to 5 nm and less than or equal to 6 nm, for example. When the end portions are not angular, the coverage with films in later deposition steps is improved.

Figure 6A:
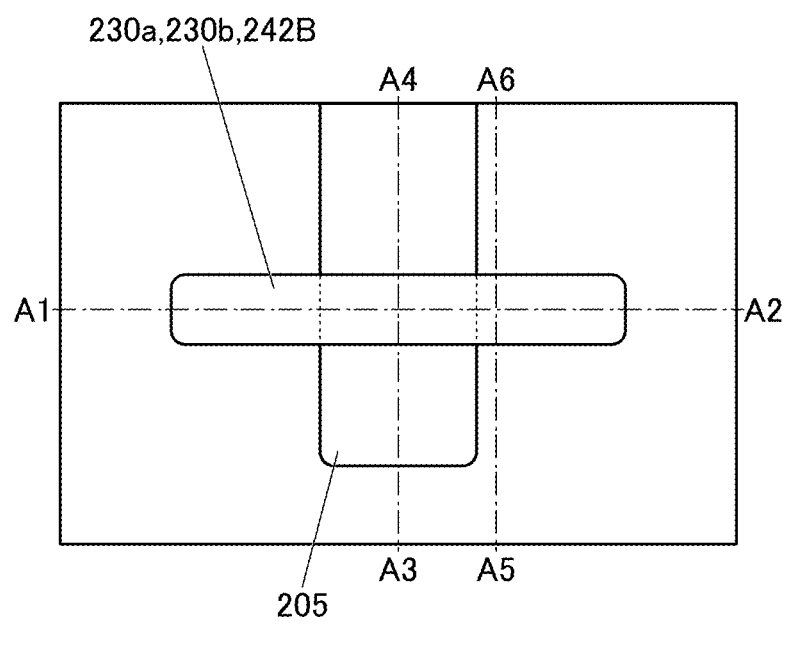
FIG. 6A is a top view illustrating a manufacturing method of a semiconductor device of one embodiment of the present invention.
Figure 6C:
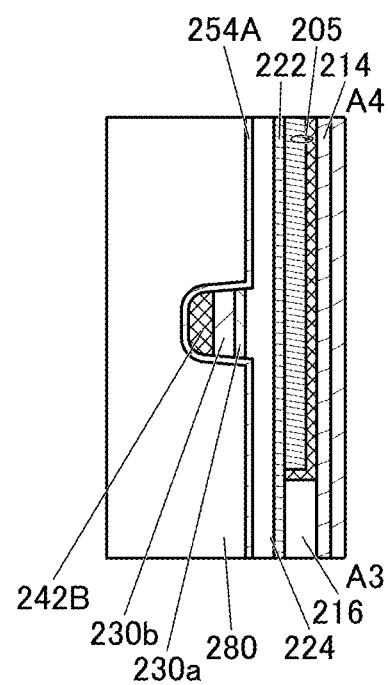
FIG. 6B to FIG. 6D are cross-sectional views illustrating a manufacturing method of a semiconductor device of one embodiment of the present invention.
Figure 6B:
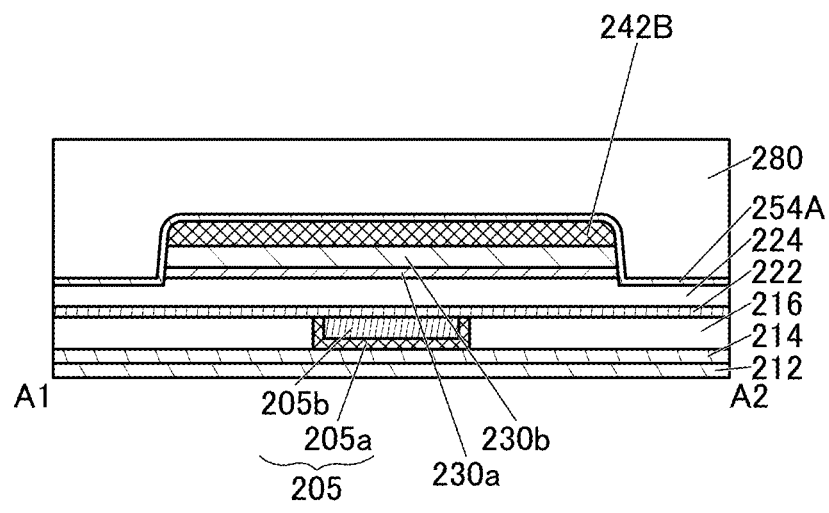
Figure 6D:
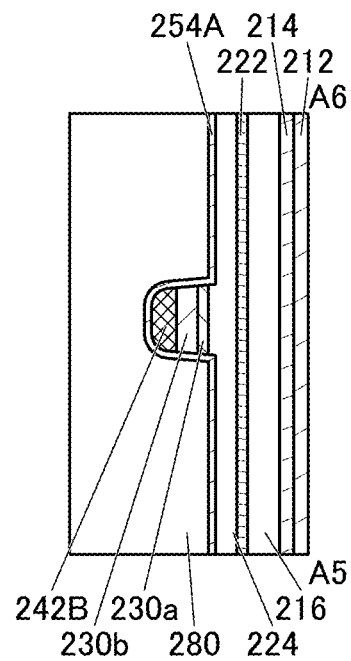
Figure 7A:
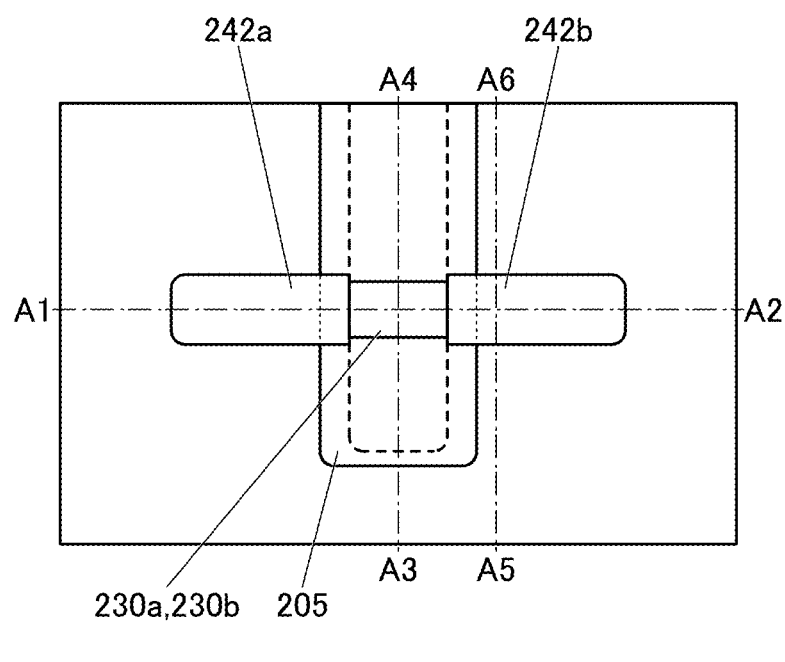
FIG. 7A is a top view illustrating a manufacturing method of a semiconductor device of one embodiment of the present invention.
Figure 7C:
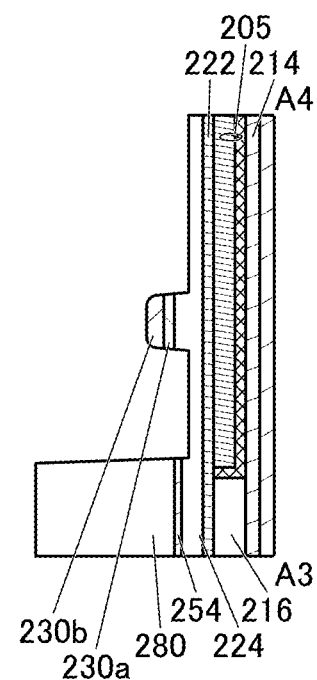
FIG. 7B to FIG. 7D are cross-sectional views illustrating a manufacturing method of a semiconductor device of one embodiment of the present invention.
Figure 7B:
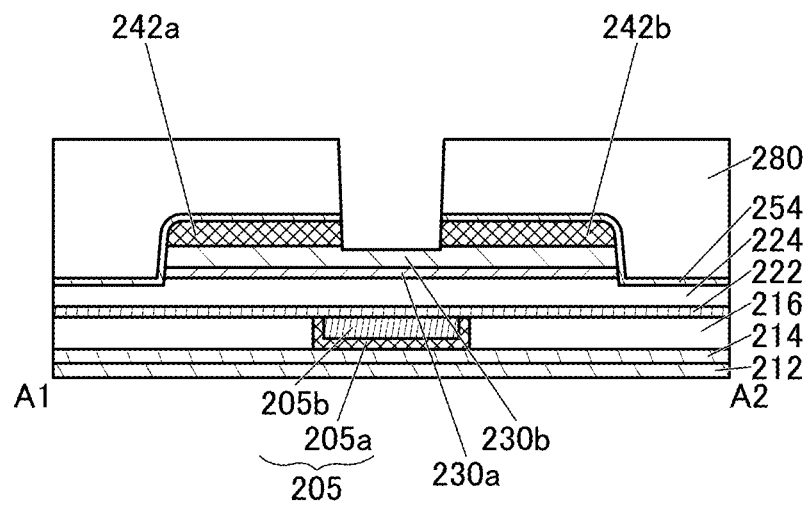
Figure 7D:
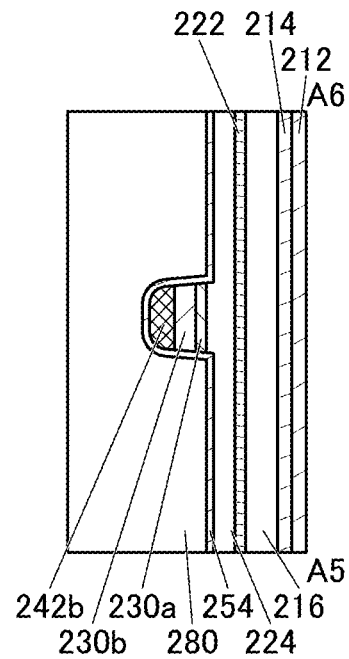
Figure 8A:
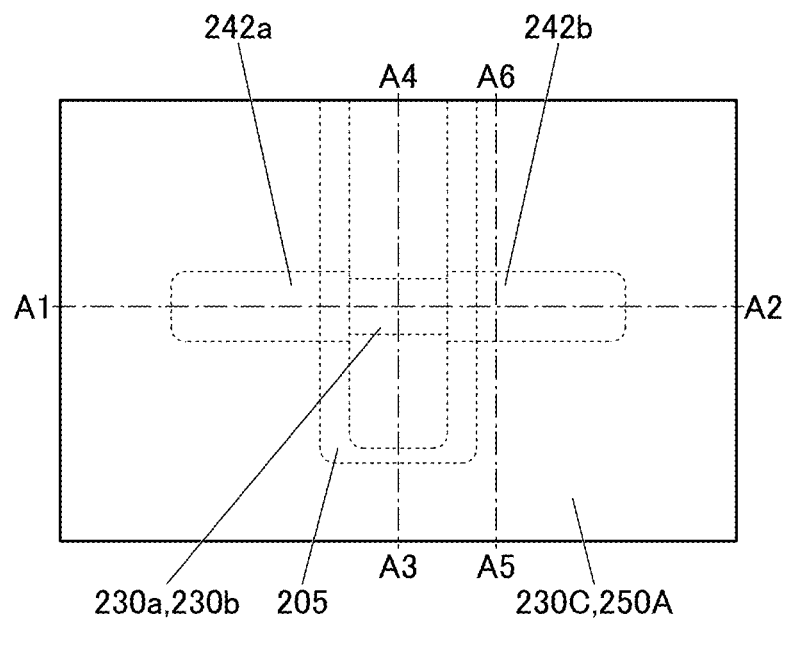
FIG. 8A is a top view illustrating a manufacturing method of a semiconductor device of one embodiment of the present invention.
Figure 8B:
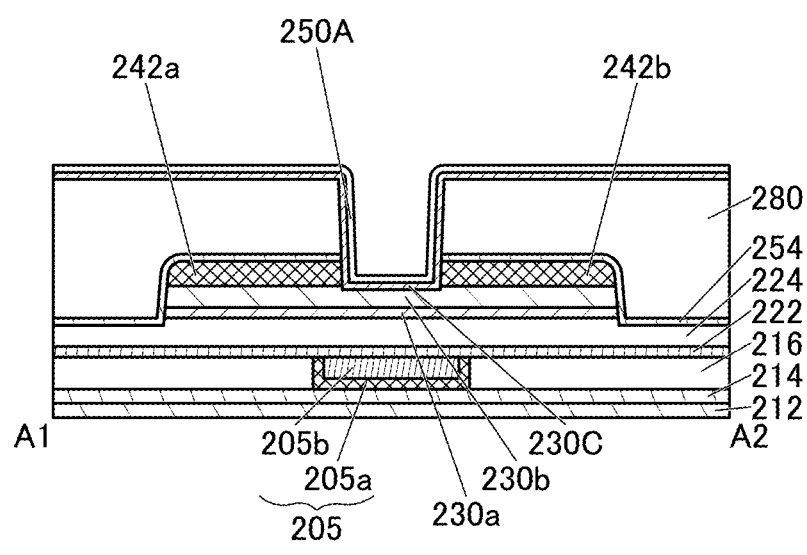
FIG. 8B to FIG. 8D are cross-sectional views illustrating a manufacturing method of a semiconductor device of one embodiment of the present invention.
Figure 8C:
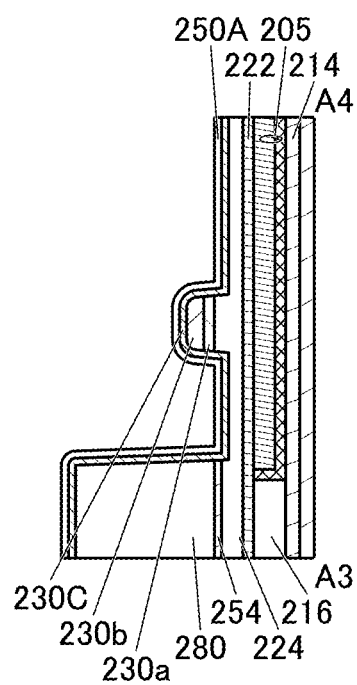
Figure 8D:
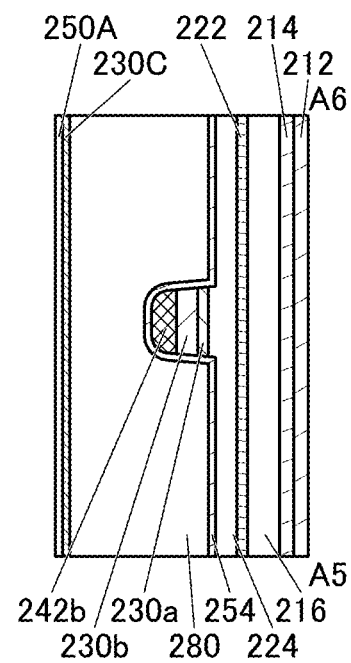
Figure 9A:
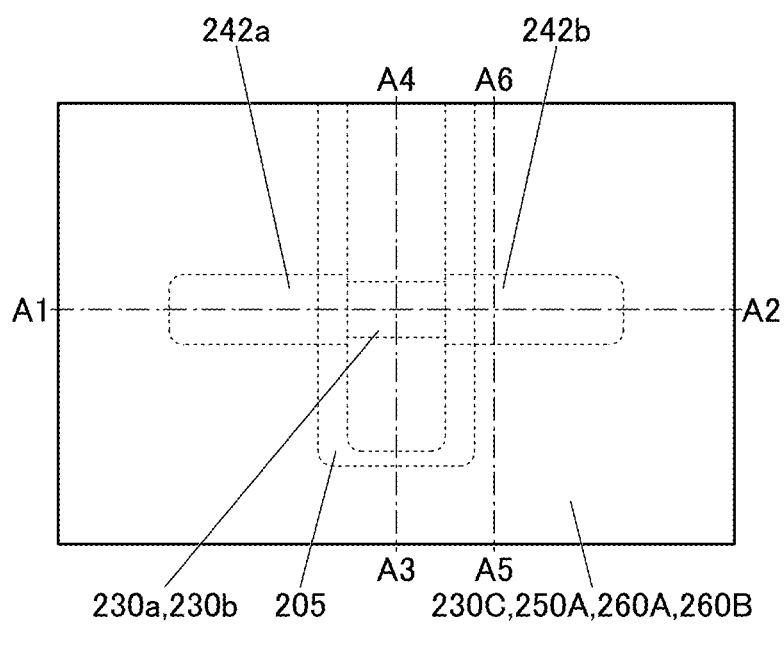
FIG. 9A is a top view illustrating a manufacturing method of a semiconductor device of one embodiment of the present invention.
Figure 9C:
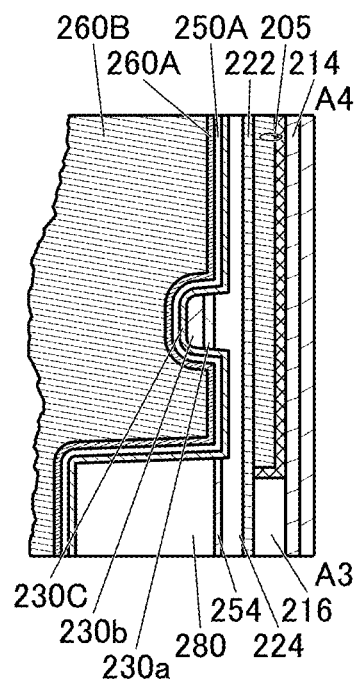
FIG. 9B to FIG. 9D are cross-sectional views illustrating a manufacturing method of a semiconductor device of one embodiment of the present invention.
Figure 9B:
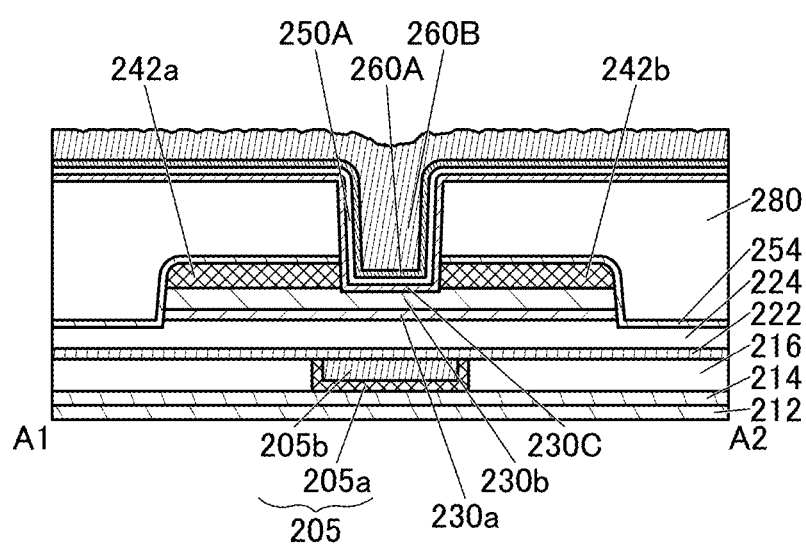
Figure 9D:
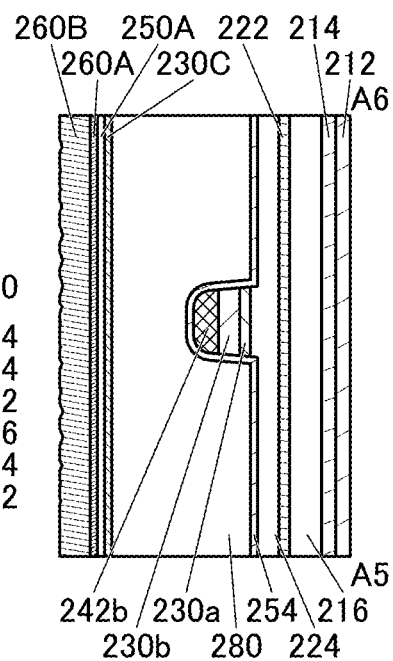

Next, the insulating film 254A is formed over the insulator 224, the oxide 230a, the oxide 230b, and the conductive layer 242B (see FIG. 6B to FIG. 6D).

The insulating film 254A can be formed by a sputtering method, a CVD method, an MBE method, a PLD method, an ALD method, or the like. As the insulating film 254A, an insulating film having a function of inhibiting passage of oxygen is preferably used. For example, an aluminum oxide film, a silicon nitride film, a silicon oxide film, or a gallium oxide film is deposited by a sputtering method or an ALD method. Alternatively, an aluminum oxide film may be deposited by a sputtering method and another aluminum oxide film may be deposited over the aluminum oxide film by an ALD method.

Next, an insulating film to be the insulator 280 is formed over the insulating film 254A. The insulating film can be deposited by a sputtering method, a CVD method, an MBE method, a PLD method, an ALD method, or the like. In this embodiment, as the insulating film, a silicon oxide film is formed by a CVD method or a sputtering method. The heat treatment may be performed before the insulating film is deposited. The heat treatment may be performed under reduced pressure, and the insulating films may be successively formed without exposure to the air. The treatment can remove moisture and hydrogen adsorbed onto the surface of the insulating film 254A and the like, and further can reduce the moisture concentration and the hydrogen concentration of the oxide 230a, the oxide 230b, and the insulator 224. The conditions for the above-described heat treatment can be used.

In addition, the insulating film may have a multilayer structure. The insulating film may have a structure in which a silicon oxide film is deposited by a sputtering method and another silicon oxide film is deposited over the silicon oxide film by a CVD method, for example.

Next, the insulating film is subjected to CMP treatment, so that the insulator 280 having a flat top surface is formed (see FIG. 6B to FIG. 6D).

Here, microwave treatment may be performed. The microwave treatment is preferably performed in an atmosphere containing oxygen under reduced pressure. By performing the microwave treatment, an electric field by a microwave can be supplied to the insulator 280, the oxide 230b, the oxide 230a, and the like to divide $V_OH$ in the oxide 230b and the oxide 230a into oxygen vacancy ($V_O$) and hydrogen (H). Some hydrogen divided at this time is bonded to oxygen contained in the insulator 280 and is removed as water molecules in some cases. Some hydrogen is gettered by the conductive layer 242B through the insulating film 254A in some cases.

After the microwave treatment, heat treatment may be performed with the reduced pressure being maintained. Such treatment enables hydrogen in the insulator 280, the oxide 230b, and the oxide 230a to be removed efficiently. Note that the temperature of the heat treatment is preferably higher than or equal to 300° C. and lower than or equal to 500° C.

Performing the microwave treatment improves the film quality of the insulator 280, thereby inhibiting diffusion of hydrogen, water, impurities, and the like. Accordingly, hydrogen, water, impurities, and the like can be inhibited from diffusing into the oxide 230 through the insulator 280 in the following step after the formation of the insulator 280, heat treatment, or the like.

Subsequently, part of the insulator 280, part of the insulating film 254A, and part of the conductive layer 242B are processed to form an opening reaching the oxide 230b. The opening is preferably formed to overlap with the conductor 205. The formation of the opening leads formation of the insulator 254, the conductor 242a, and the conductor 242b (see FIG. 7A to FIG. 7D).

At this time, the oxide 230b in a region overlapping with the opening is preferably processed to have a small thickness. The amount of thickness reduction in the region corresponds to Lc shown in FIG. 3B. By a reduction in the thickness of the oxide 230b in the region, a low-resistance region can be inhibited from being formed in the vicinity of a top surface of the channel formation region, so that generation of a parasitic channel can be inhibited. Consequently, the variation of transistor characteristics due to the parasitic channel can be suppressed.

In addition, it is preferable to remove part of the side surface of the oxide 230b in the region overlapping with the opening. The amount of the thickness reduction in the region corresponds to We shown in FIG. 3B. Thus, a low-resistance region can be inhibited from being formed in the vicinity of the side surface of the channel formation region, so that generation of a parasitic channel can be inhibited. Consequently, the variation of transistor characteristics due to the parasitic channel can be suppressed.

Part of the insulator 280, part of the insulating film 254A, and part of the conductive layer 242B may be processed under different conditions. For example, part of the insulator 280 may be processed by a dry etching method, part of the insulating film 254A may be processed by a wet etching method, and part of the conductive layer 242B may be processed by a dry etching method.

Here, it is preferable to remove impurities that are attached onto the surfaces of the oxide 230a, the oxide 230b, and the like or diffused into the oxide 230a, the oxide 230b, and the like. The impurities result from components contained in the insulator 280, the insulating film 254A, and the conductive layer 242B; components contained in a member of an apparatus used to form the opening; and components contained in a gas or a liquid used for etching, for instance. Examples of the impurities include aluminum, silicon, tantalum, fluorine, and chlorine.

In order to remove the above impurities and the like, cleaning treatment may be performed. Examples of the cleaning method include wet cleaning using a cleaning solution, plasma treatment using plasma, and cleaning by heat treatment, and any of these cleanings may be performed in appropriate combination.

As the wet cleaning, cleaning treatment may be performed using an aqueous solution in which ammonia water, oxalic acid, phosphoric acid, hydrofluoric acid, or the like is diluted with carbonated water or pure water; pure water; carbonated water; or the like. Alternatively, ultrasonic cleaning using such an aqueous solution, pure water, or carbonated water may be performed. Alternatively, such cleaning methods may be performed in combination as appropriate.

Next, heat treatment may be performed. The heat treatment is preferably performed in an oxygen-containing atmosphere. Heat treatment may be performed under reduced pressure, and an oxide film 230C may be successively deposited without exposure to the air (see FIG. 8A to FIG. 8D). The treatment enables removal of moisture and hydrogen adsorbed onto the surface of the oxide 230b and the like, and further enables reductions in the moisture concentration and the hydrogen concentration of the oxide 230a and the oxide 230b. The heat treatment is preferably performed at a temperature higher than or equal to 100° C. and lower than or equal to 400° C. In this embodiment, the heat treatment is performed at 200° C.

The oxide film 230C can be formed by a sputtering method, a CVD method, an MBE method, a PLD method, an ALD method, or the like. The oxide film 230C may be formed by a deposition method similar to that for the oxide film 230A or the oxide film 230B depending on characteristics required for the oxide film 230C. In this embodiment, the oxide film 230C is deposited by a sputtering method using an oxide target with In:Ga:Zn=4:2:4.1 [atomic ratio].

Note that the oxide film 230C may have a stacked-layer structure. For example, the oxide film 230C may be deposited by a sputtering method using an oxide target of In:Ga:Zn=4:2:4.1 [atomic ratio] and successively deposited using an oxide target of In:Ga:Zn=1:3:4 [atomic ratio].

In the deposition of the oxide film 230C, part of oxygen contained in the sputtering gas is sometimes supplied to the oxide 230a and the oxide 230b. When the oxide film 230C is deposited, part of oxygen contained in the sputtering gas is supplied to the insulator 280 in some cases. Therefore, the proportion of oxygen contained in the sputtering gas for the oxide film 230C is preferably higher than or equal to 70%, further preferably higher than or equal to 80%, still further preferably 100%.

Next, heat treatment may be performed. Heat treatment may be performed under reduced pressure, and an insulating film 250A may be successively formed without exposure to the air (see FIG. 8A to FIG. 8D). The treatment enables removal of moisture and hydrogen adsorbed onto the surface of the oxide film 230C and the like, and further enables reductions in the moisture concentration and the hydrogen concentration in the oxide 230a, the oxide 230b, and the oxide film 230C. The heat treatment is preferably performed at a temperature higher than or equal to 100° C. and lower than or equal to 400° C.

The insulating film 250A can be deposited by a sputtering method, a CVD method, an MBE method, a PLD method, an ALD method, or the like. In this embodiment, for the insulating film 250A, silicon oxynitride is deposited by a CVD method. Note that the deposition temperature at the time of the deposition of the insulating film 250A is preferably higher than or equal to 350° C. to lower than 450° C., particularly preferably approximately 400° C. When the insulating film 250A is deposited at 400° C., an insulating film having few impurities can be deposited.

Note that in the case where the insulator 250 has a two-layer stacked structure, an insulating film below the insulator 250 and an insulating film over the insulator 250 are preferably formed successively without exposure to the air. When the insulating films are formed without exposure to the air, the impurities or moisture from the atmospheric environment can be prevented from being attached onto the insulating film below the insulator 250 and the insulating film over the insulator 250, whereby the vicinity of the interface between the insulating film below the insulator 250 and the insulating film over the insulator 250 can be kept clean.

Here, after the insulating film 250A is deposited, the microwave treatment may be performed in an atmosphere containing oxygen under reduced pressure. By performing the microwave treatment, an electric field by a microwave is applied to the insulating film 250A, the oxide film 230C, the oxide 230b, the oxide 230a, and the like, so that $V_OH$ in the oxide film 230C, the oxide 230b, and the oxide 230a can be divided into $V_O$ and hydrogen. Some hydrogen divided at this time is bonded to oxygen and is removed as $H_2O$ from the insulating film 250A, the oxide film 230C, the oxide 230b, and the oxide 230a in some cases. Some hydrogen may be gettered by the conductor 242 (the conductor 242a and the conductor 242b). Performing the microwave treatment in such a manner can reduce the hydrogen concentration in the insulating film 250A, the oxide film 230C, the oxide 230b, and the oxide 230a. Furthermore, oxygen is supplied to $V_O$ that can exist after $V_OH$ in the oxide 230a, the oxide 230b, and the oxide film 230C is divided into $V_O$ and hydrogen, so that $V_O$ can be repaired or filled.

After the microwave treatment, heat treatment may be performed with the reduced pressure being maintained. Such treatment enables hydrogen in the insulating film 250A, the oxide film 230C, the oxide 230b, and the oxide 230a to be removed efficiently. Some hydrogen may be gettered by the conductor 242 (the conductor 242a and the conductor 242b). Alternatively, it is possible to repeat the step of performing microwave treatment and the step of performing heat treatment with the reduced pressure being maintained after the microwave treatment. The repetition of the heat treatment enables hydrogen in the insulating film 250A, the oxide film 230C, the oxide 230b, and the oxide 230a to be removed more efficiently. Note that the temperature of the heat treatment is preferably higher than or equal to 300° C. and lower than or equal to 500° C.

Furthermore, microwave plasma treatment improves the film quality of the insulating film 250A, whereby diffusion of hydrogen, water, an impurity, or the like can be inhibited. Accordingly, hydrogen, water, an impurity, or the like can be inhibited from being diffused into the oxide 230a and the oxide 230b through the insulator 250 in the following step such as deposition of a conductive film to be the conductor 260 or the following treatment such as heat treatment.

Next, a conductive film 260A and a conductive film 260B are deposited in this order (see FIG. 9A to FIG. 9D). The conductive film 260A and the conductive film 260B can be deposited by a sputtering method, a CVD method, an MBE method, a PLD method, an ALD method, or the like. In this embodiment, the conductive film 260A is deposited by an ALD method, and the conductive film 260B is deposited by a CVD method.

Figure 10A:
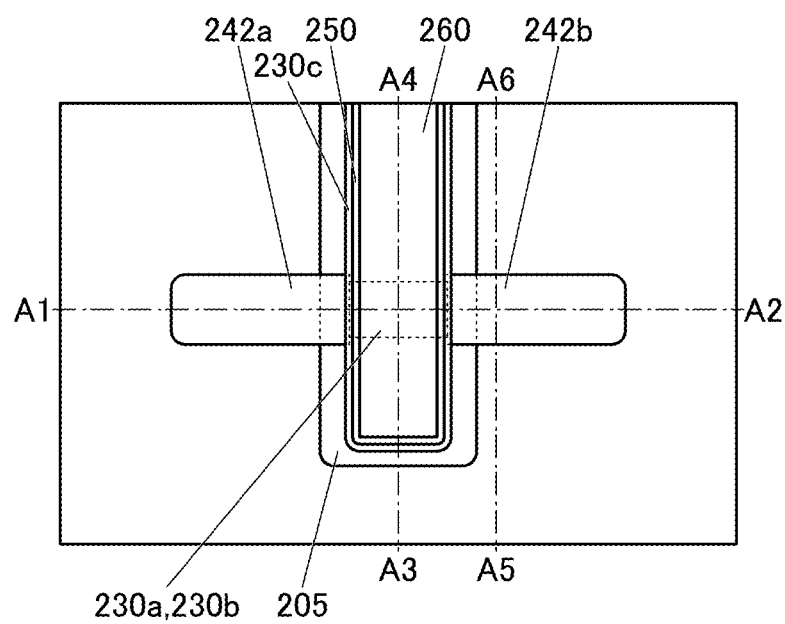
FIG. 10A is a top view illustrating a manufacturing method of a semiconductor device of one embodiment of the present invention.
Figure 10C:
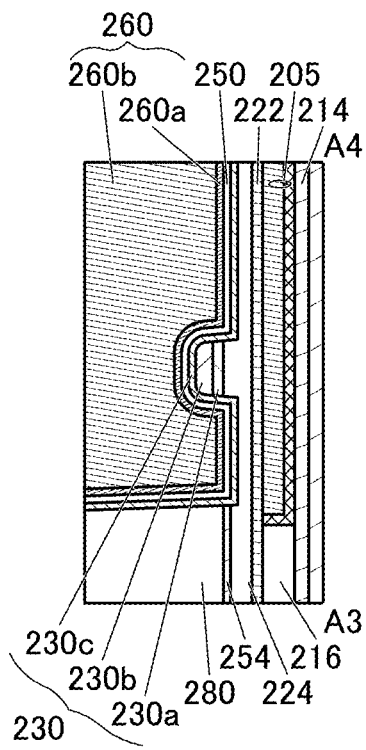
FIG. 10B to FIG. 10D are cross-sectional views illustrating a manufacturing method of a semiconductor device of one embodiment of the present invention.
Figure 10B:
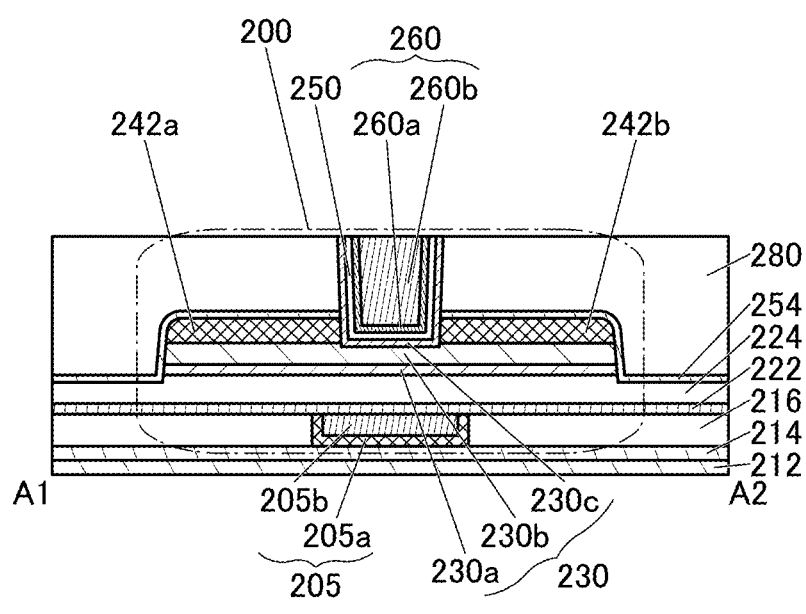
Figure 10D:
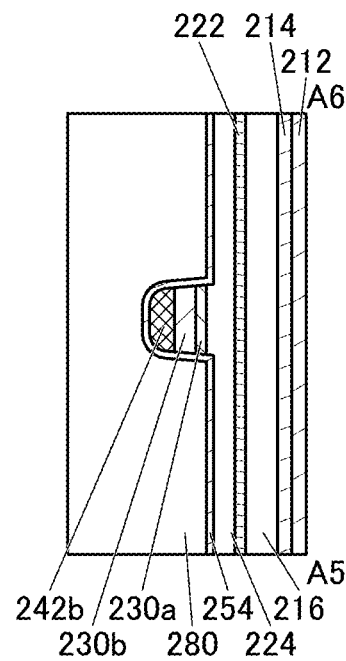

Subsequently, the oxide film 230C, the insulating film 250A, the conductive film 260A, and the conductive film 260B are polished by CMP treatment until the insulator 280 is exposed, whereby the oxide 230c, the insulator 250, and the conductor 260 (the conductor 260a and the conductor 260b) are formed (see FIG. 10A to FIG. 10C). Accordingly, the oxide 230c is positioned to cover the inner wall (the side wall and bottom surface) of the opening reaching the oxide 230b. The insulator 250 is positioned to cover the inner wall of the opening with the oxide 230c therebetween. The conductor 260 is positioned to fill the opening with the oxide 230c and the insulator 250 therebetween.

Next, heat treatment may be performed. In this embodiment, treatment is performed at 400° C. in a nitrogen atmosphere for one hour. The heat treatment enables reductions in the moisture concentration and the hydrogen concentration of the insulator 250 and the insulator 280.

Figure 11A:
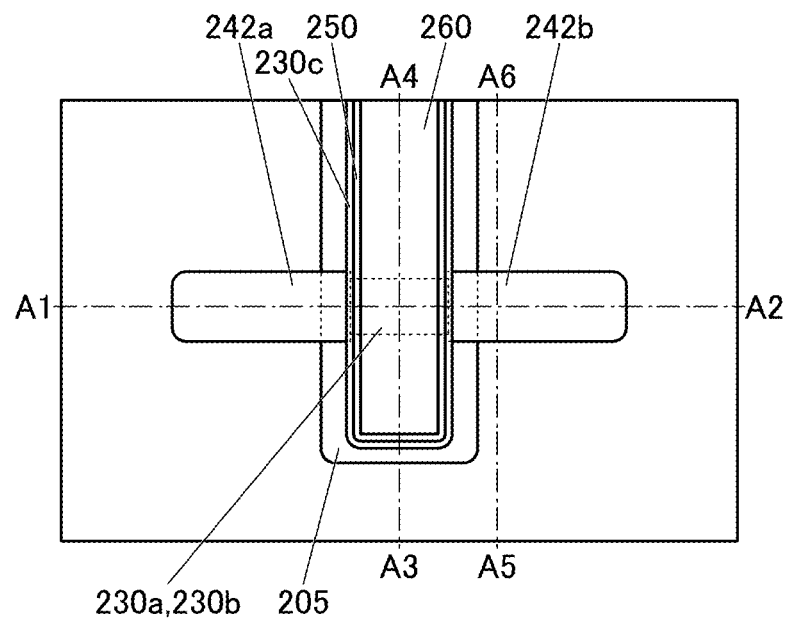
FIG. 11A is a top view illustrating a manufacturing method of a semiconductor device of one embodiment of the present invention.
Figure 11C:
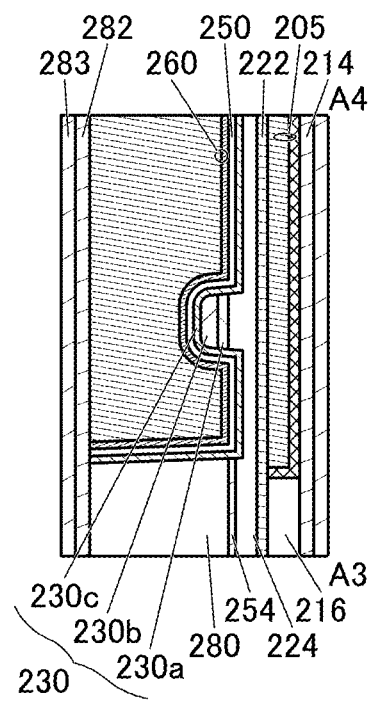
FIG. 11B to FIG. 11D are cross-sectional views illustrating a manufacturing method of a semiconductor device of one embodiment of the present invention.
Figure 11B:
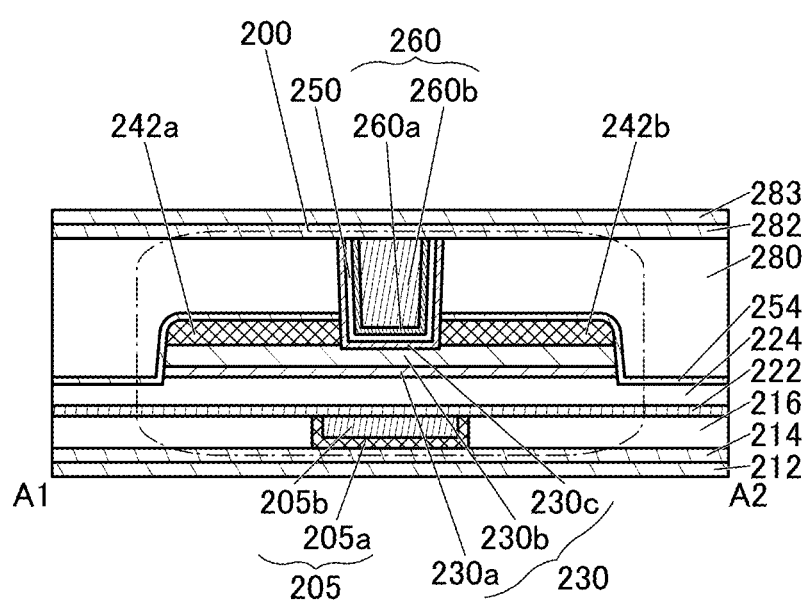
Figure 11D:
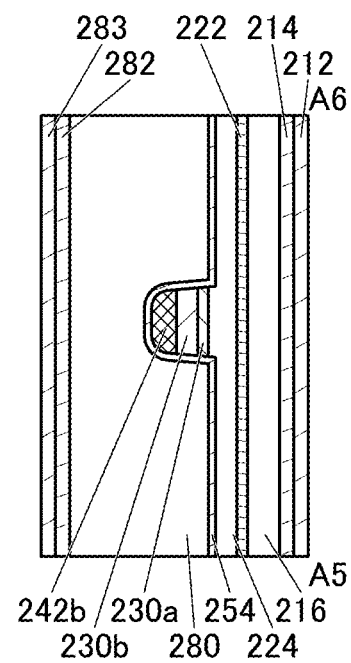

Next, the insulator 282 is formed over the oxide 230c, the insulator 250, the conductor 260, and the insulator 280 (see FIG. 11B to FIG. 11D). The insulator 282 can be deposited by a sputtering method, a CVD method, an MBE method, a PLD method, an ALD method, or the like. Aluminum oxide is preferably deposited as the insulator 282 by a sputtering method, for example. The insulator 282 is deposited by a sputtering method in an oxygen-containing atmosphere, whereby oxygen can be added to the insulator 280 during the deposition. At this time, the insulator 282 is preferably deposited while the substrate is being heated. It is preferable to form the insulator 282 in contact with the top surface of the conductor 260 because oxygen contained in the insulator 280 can be inhibited from being absorbed into the conductor 260 in a later heat treatment.

Next, the insulator 283 is formed over the insulator 282 (see FIG. 11B to FIG. 11D). The insulator 283 can be deposited by a sputtering method, a CVD method, an MBE method, a PLD method, an ALD method, or the like. As the insulator 283, silicon nitride or silicon nitride oxide is preferably deposited.

Next, heat treatment may be performed. In this embodiment, treatment is performed at 400° C. in a nitrogen atmosphere for one hour. By the heat treatment, oxygen added by the deposition of the insulator 282 is diffused to the insulator 280 and can be supplied to the oxide 230a and the oxide 230b through the oxide 230c. Note that the heat treatment is not necessarily performed after the deposition of the insulator 283 and may be performed after the deposition of the insulator 282.

Next, the insulator 274 may be deposited over the insulator 283. The insulator 274 can be deposited by a sputtering method, a CVD method, an MBE method, a PLD method, an ALD method, or the like.

Next, the insulator 281 may be deposited over the insulator 274. The insulator 281 can be deposited by a sputtering method, a CVD method, an MBE method, a PLD method, an ALD method, or the like. Silicon nitride is preferably deposited as the insulator 281 by a sputtering method, for example.

Next, openings reaching the conductor 242*a* and the conductor 242*b* are formed in the insulator 254, the insulator 280, the insulator 282, the insulator 283, the insulator 274, and the insulator 281. The openings are formed by a lithography method.

Subsequently, an insulating film to be the insulator 241 (the insulator 241*a* and the insulator 241*b*) is deposited and subjected to anisotropic etching, so that the insulator 241 is formed. The insulating film can be deposited by a sputtering method, a CVD method, an MBE method, a PLD method, an ALD method, or the like. As the insulating film, an insulating film having a function of inhibiting passage of oxygen is preferably used. For example, silicon nitride is preferably deposited by a PEALD method. Silicon nitride is preferable because it has high blocking property against hydrogen.

As an anisotropic etching for the insulating film to be the insulator 241, a dry etching method may be performed, for example. When the insulator 241 is provided on the side wall portions of the openings, passage of oxygen from the outside can be inhibited and oxidation of the conductor 240*a* and the conductor 240*b* to be formed next can be prevented. Furthermore, impurities such as water and hydrogen can be prevented from diffusing from the conductor 240*a* and the conductor 240*b* to the outside.

Next, a conductive film to be the conductor 240*a* and the conductor 240*b* is formed. The conductive film desirably has a stacked-layer structure that includes a conductor having a function of inhibiting passage of impurities such as water and hydrogen. For example, a stacked layer of tantalum nitride, titanium nitride, or the like and tungsten, molybdenum, copper, or the like can be employed. The conductive film can be deposited by a sputtering method, a CVD method, an MBE method, a PLD method, an ALD method, or the like.

Next, CMP treatment is performed, thereby removing part of the conductive film to be the conductor 240*a* and the conductor 240*b* to expose the insulator 281. As a result, the conductive film remains only in the openings, so that the conductor 240*a* and the conductor 240*b* having flat top surfaces can be formed (see FIG. 1A to FIG. 1D). Note that the insulator 281 is partly removed by the CMP treatment in some cases.

Next, a conductive film to be the conductor 246 is formed. The conductive film can be deposited by a sputtering method, a CVD method, an MBE method, a PLD method, an ALD method, or the like.

Next, the conductive film to be the conductor 246 is processed by a lithography method, thereby forming the conductor 246*a* in contact with the top surface of the conductor 240*a* and the conductor 246*b* in contact with the top surface of the conductor 240*b* (see FIG. 1A to FIG. 1D).

Through the above process, the semiconductor device including the transistor 200 illustrated in FIG. 1A to FIG. 1D can be manufactured. As shown in FIG. 4A to FIG. 11D, transistor 200 can be fabricated with use of the method for manufacturing the semiconductor device described in this embodiment.

Modification Example of Semiconductor Device

An example of a semiconductor device of one embodiment of the present invention will be described below with reference to FIG. 12A to FIG. 12D and FIGS. 13A and 13B.

Modification Example 1 of Semiconductor Device

Figure 12A:
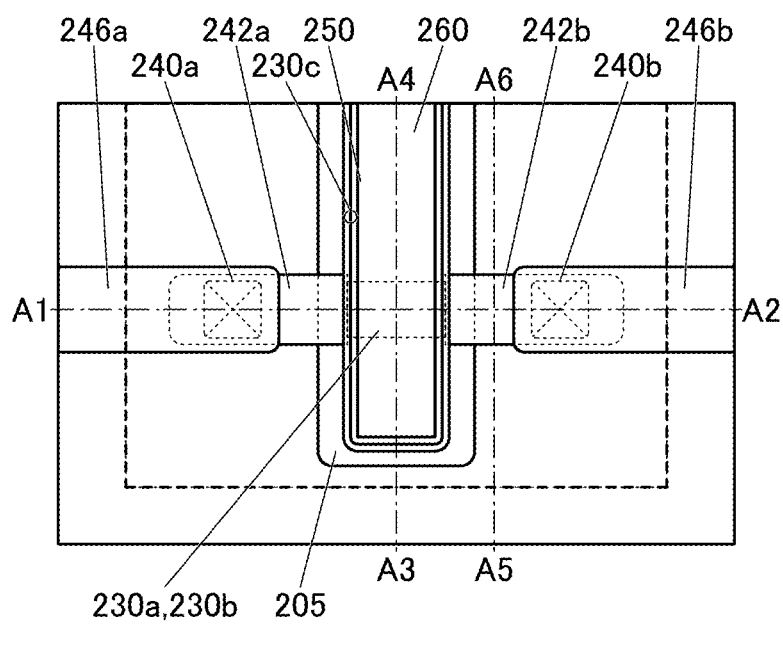
FIG. 12A is a top view illustrating a semiconductor device of one embodiment of the present invention.
Figure 12C:
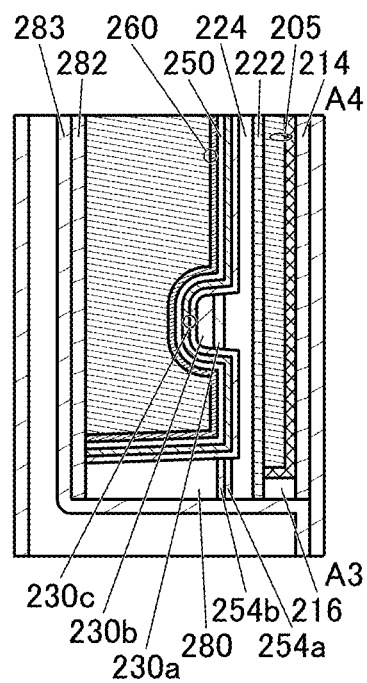
FIG. 12B to FIG. 12D are cross-sectional views illustrating a semiconductor device of one embodiment of the present invention.
Figure 12B:
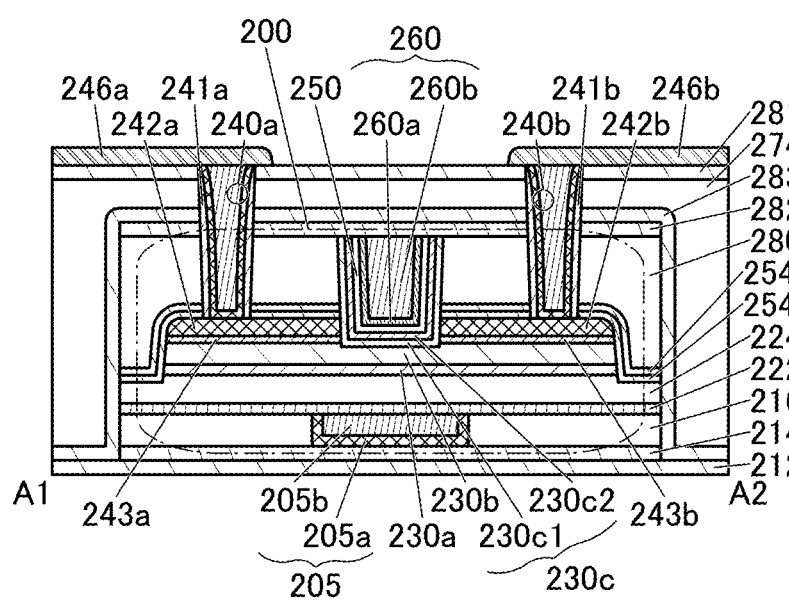
Figure 12D:
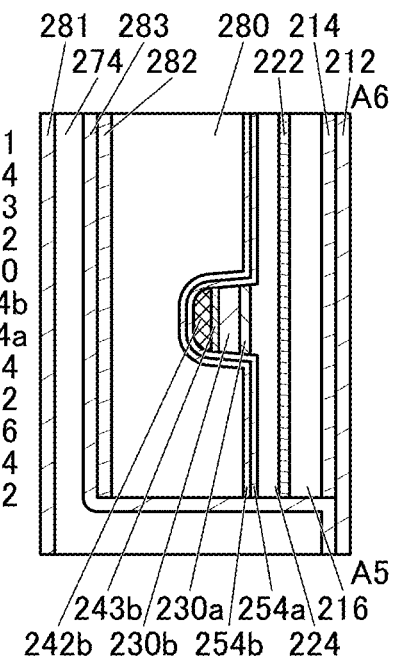

FIG. 12A is a top view of the semiconductor device. FIG. 12B is a cross-sectional view corresponding to a portion indicated by the dashed-dotted line A1-A2 in FIG. 12A. FIG. 12C is a cross-sectional view corresponding to a portion indicated by the dashed-dotted line A3-A4 in FIG. 12A. FIG. 12D is a cross-sectional view corresponding to a portion indicated by dashed-dotted line A5-A6 in FIG. 12A. Note that for clarity of the drawing, some components are not illustrated in the top view of FIG. 12A.

Note that in the semiconductor devices illustrated in FIG. 12A to FIG. 12D, components having the same functions as the components included in the semiconductor device described in <Structure example of semiconductor device> are denoted by the same reference numerals. Note that the materials described in detail in <Structure example of semiconductor device> can also be used as constituent materials of the semiconductor devices in this section.

A semiconductor device illustrated in FIG. 12A to FIG. 12D is a modification example of the semiconductor device illustrated in FIG. 1A to FIG. 1D. The semiconductor device in FIG. 12A to FIG. 12D is different from the semiconductor device in FIG. 1A to FIG. 1D in the shape of the insulator 283. An oxide 243 (an oxide 243*a* and an oxide 243*b*) is included, which is a difference. In addition, a structure in which each of the oxide 230*c* and the insulator 254 has a two-layer stacked structure is shown.

The semiconductor device illustrated in FIG. 12A to FIG. 12D has a structure in which the insulator 214, the insulator 216, the insulator 222, the insulator 224, the insulator 254 (an insulator 254*a* and an insulator 254*b*), the insulator 280, and the insulator 282 are patterned and covered with the insulator 283. In other words, the insulator 283 is in contact with a top surface and side surfaces of the insulator 282, side surfaces of the insulator 280, side surfaces of the insulator 254, side surfaces of the insulator 224, side surfaces of the insulator 222, side surfaces of the insulator 216, side surfaces of the insulator 214, and a top surface of the insulator 212. Accordingly, the insulator 214, the insulator 216, the insulator 222, the insulator 224, the insulator 254, the insulator 280, and the insulator 282 in addition to the oxide 230 and the like are isolated from the outside by the insulator 283 and the insulator 212. In other words, the transistor 200 is located in a region sealed by the insulator 283 and the insulator 212.

It is particularly preferable that the insulator 212 and the insulator 283 have higher capability of inhibiting diffusion of hydrogen (e.g., at least one of a hydrogen atom, a hydrogen molecule, and the like) or a water molecule. For example, for the insulator 212 and the insulator 283, silicon nitride or silicon nitride oxide with a higher hydrogen barrier property is preferably used.

With the above structure, entry of hydrogen contained in the region outside the sealed region into the sealed region can be inhibited.

The transistor 200 illustrated in FIG. 12A to FIG. 12D shows a structure where the insulator 212, the insulator 214, and the insulator 283 each have a single layer; however, the present invention is not limited thereto. For example, a structure in which the insulator 212, the insulator 214, and the insulator 283 each have a stacked structure including two or more layers may be employed.

For example, the transistor 200 illustrated in FIG. 12A to FIG. 12D includes the oxide 243 (the oxide 243a and the oxide 243b) having a function of inhibiting passage of oxygen, between the conductor 242 (the conductor 242a and the conductor 242b) and the oxide 230. It is preferable to locate the oxide 243 having a function of inhibiting passage of oxygen between the oxide 230b and the conductor 242, which functions as the source electrode and the drain electrode, in which case the electrical resistance between the conductor 242 and the oxide 230b is reduced. Such a structure improves the electrical characteristics of the transistor 200 and the reliability of the transistor 200.

A metal oxide containing the element M may be used as the oxide 243. In particular, aluminum, gallium, yttrium, or tin is preferably used as the element M. The concentration of the element M in the oxide 243 is preferably higher than that in the oxide 230b. Alternatively, gallium oxide may be used as the oxide 243. A metal oxide such as an In-M-Zn oxide may be used as the oxide 243. Specifically, the atomic ratio of the element M to In in the metal oxide used as the oxide 243 is preferably greater than the atomic ratio of the element M to In in the metal oxide used as the oxide 230b. The thickness of the oxide 243 is preferably larger than or equal to 0.5 nm and smaller than or equal to 5 nm, further preferably larger than or equal to 1 nm and smaller than or equal to 3 nm, still further preferably larger than or equal to 1 nm and smaller than or equal to 2 nm. The oxide 243 preferably has crystallinity. In the case where the oxide 243 has crystallinity, release of oxygen from the oxide 230 can be favorably inhibited. When the oxide 243 has a hexagonal crystal structure, for example, release of oxygen from the oxide 230 can sometimes be inhibited.

In a cross-sectional view of the transistor 200 in the channel length direction, a bottom surface of the oxide 230c in a region overlapping with the conductor 260 is preferably positioned at the level comparable to or lower than the level of the bottom surface of the oxide 243 (the oxide 243a and the oxide 243b). With such a shape, impurities in the vicinity of the interface between the oxide 230b and the oxide 230c can be removed, so that a low-resistance region formed in the vicinity of a top surface of the region 234 can be small. In the cross-sectional view of the transistor 200 in the channel length direction, a difference between the level of the bottom surface of the oxide 243 and the level of the bottom surface of the oxide 230c in the region overlapping with the conductor 260 is greater than or equal to 0 nm and less than or equal to 10 nm, preferably greater than or equal to 0 nm and less than or equal to 5 nm, further preferably greater than or equal to 0 nm and less than or equal to 3 nm, when the bottom surface of the insulator 224 is considered as a benchmark.

The transistor 200 illustrated in FIG. 12A to FIG. 12D shows a structure in which the oxide 230c has a stacked structure of an oxide 230c1 and an oxide 230c2.

The oxide 230c2 preferably contains at least one of the metal elements contained in the metal oxide used as the oxide 230c1, and further preferably contains all of these metal elements. For example, it is preferable that an In—Ga—Zn oxide or an IN—Zn oxide be used as the oxide 230c1, and an In—Ga—Zn oxide, a Ga—Zn oxide, or gallium oxide be used as the oxide 230c2. Accordingly, the density of defect states at the interface between the oxide 230c1 and the oxide 230c2 can be decreased.

The conduction band minimum of each of the oxide 230a and the oxide 230c2 is preferably closer to the vacuum level than the conduction band minimum of each of the oxide 230b and the oxide 230c1. In other words, the electron affinity of each of the oxide 230a and the oxide 230c2 is preferably smaller than the electron affinity of each of the oxide 230b and the oxide 230c1. In that case, it is preferable that a metal oxide that can be used as the oxide 230a be used as the oxide 230c2, and a metal oxide that can be used as the oxide 230b be used as the oxide 230c1. At this time, not only the oxide 230b but also the first oxide of the oxide 230c1 serves as a main carrier path in some cases. The metal oxide that can be used as the oxide 230b is used for the oxide 230c1, whereby an increase in the effective channel length on the top surface of the channel formation region can be inhibited and a decrease in the on-state current of the transistor 200 can be inhibited.

Specifically, a metal oxide with In:Ga:Zn=4:2:3 [atomic ratio] or In:Ga:Zn=5:1:6 [atomic ratio] or na in-Zn oxide is used as the oxide 230c1, and a metal oxide with In:Ga:Zn=1:3:4 [atomic ratio], Ga:Zn=2:1 [atomic ratio], or Ga:Zn=2:5 [atomic ratio], or a metal oxide such as gallium oxide is used as the oxide 230c2.

The oxide 230c2 is preferably a metal oxide that inhibits diffusion or passage of oxygen, compared to the oxide 230c1. Providing the oxide 230c2 between the insulator 250 and the oxide 230c1 can inhibit diffusion of oxygen contained in the insulator 280 into the insulator 250. Accordingly, the oxygen can be efficiently supplied to the oxide 230b through the oxide 230c1.

When the atomic ratio of In to the metal element of the main component in the metal oxide used as the oxide 230c2 is lower than the atomic ratio of In to the metal element of the main component in the metal oxide used as the oxide 230c1, the diffusion of In into the insulator 250 side can be inhibited. Since the insulator 250 functions as a gate insulator, the transistor exhibits poor characteristics when In enters the insulator 250 and the like. Thus, the oxide 230c2 provided between the oxide 230c1 and the insulator 250 allows the semiconductor device to have high reliability.

Note that the oxide 230c1 may be provided for each of the transistors 200. Accordingly, the oxide 230c1 of the transistor 200 is not necessarily in contact with the oxide 230c1 of another transistor 200 adjacent to the transistor 200. Furthermore, the oxide 230c1 of the transistor 200 may be apart from the oxide 230c1 of another transistor 200 adjacent to the transistor 200. In other words, a structure in which the oxide 230c1 is not located between the transistor 200 and another transistor 200 adjacent to the transistor 200 may be employed.

When the above structure is employed for the semiconductor device where a plurality of transistors 200 are located in the channel width direction, the oxide 230c can be independently provided for each transistor 200. Accordingly, generation of a parasitic transistor between the transistor 200 and another transistor 200 adjacent to the transistor 200 can be prevented, and generation of the leakage path can be prevented. Thus, a semiconductor device that has favorable electrical characteristics and can be miniaturized or highly integrated can be provided.

For example, when a side end portion of the oxide 230c1 of the transistor 200 faces a side end portion of the oxide 230c1 of another transistor 200 adjacent to the transistor 200 and a distance between the side end portions in the channel width direction of the transistor 200 is denoted by $L_1$, $L_1$ is made greater than 0 nm. In the channel width direction of the transistor 200, when a side end portion of the oxide 230a of the transistor 200 faces a side end portion of the oxide 230a of another transistor 200 adjacent to the transistor 200 and the distance between the side end portions is denoted by $L_2$, a value of a ratio of $L_1$ to $L_2$ ($L_1/L_2$) is preferably greater than 0 and less than 1, further preferably greater than or equal to 0.1 and less than or equal to 0.9, still further preferably greater than or equal to 0.2 and less than or equal to 0.8. Note that $L_2$ may be a distance between a side end portion of the oxide 230b of the transistor 200 and a side end portion of the oxide 230b of another transistor 200 adjacent to the transistor 200 when the end portions face each other.

By a reduction in the ratio of $L_1$ to $L_2$ ($L_1/L_2$), even when misalignment of a region where the oxide 230c1 is not located between the transistor 200 and another transistor 200 adjacent to the transistor 200 occurs, the oxide 230c1 of the transistor 200 can be apart from the oxide 230c1 of another transistor 200 adjacent to the transistor 200.

By an increase in the ratio of $L_1$ to $L_2$ ($L_1/L_2$), even when the interval between the transistor 200 and another transistor 200 adjacent to the transistor 200 is decreased, the width of the minimum feature size can be secured, and further miniaturization and higher integration of the semiconductor device can be achieved.

Note that each of the conductor 260, the insulator 250, and the oxide 230c2 may be shared by adjacent transistors 200. In other words, the conductor 260 of the transistor 200 includes a region continuous with the conductor 260 of another transistor 200 adjacent to the transistor 200. In addition, the insulator 250 of the transistor 200 includes a region continuous with the insulator 250 of another transistor 200 adjacent to the transistor 200. In addition, the oxide 230c2 of the transistor 200 includes a region continuous with the oxide 230c2 of another transistor 200 adjacent to the transistor 200.

In the above structure, the oxide 230c2 includes a region in contact with the insulator 224 between the transistor 200 and another transistor 200 adjacent to the transistor 200.

Note that like the oxide 230c1, the oxide 230c2 of the transistor 200 may be apart from the oxide 230c2 of another transistor 200 adjacent to the transistor 200. In that case, the insulator 250 includes a region in contact with the insulator 224 between the transistor 200 and another transistor 200 adjacent to the transistor 200.

Moreover, the transistor 200 illustrated in FIGS. 12A to 12D shows a structure in which the insulator 254 has a stacked structure of the insulator 254a and the insulator 254b. For a material, a formation method, and the like of each of the insulator 254a and the insulator 254b, the description of the lower layer and the upper layer of the insulator 254, which are described in <Detailed structure of semiconductor device>, can be referred to.

An insulator that functions as a barrier layer may be provided, instead of the insulator 254, between the top surface of the conductor 242 and the insulator 280. With this structure, absorption of excess oxygen contained in the insulator 280 by the conductor 242 can be inhibited.

Furthermore, by inhibiting oxidation of the conductor 242, an increase in the contact resistance between the transistor 200 and a wiring can be inhibited. Consequently, the transistor 200 can have favorable electrical characteristics and reliability.

Thus, the above insulator preferably has a function of inhibiting diffusion of oxygen. For example, the above insulator preferably has a function of inhibiting oxygen diffusion more than the insulator 280 has.

An insulator containing an oxide of one or both of aluminum and hafnium may be deposited as the above insulator, for example. In particular, aluminum oxide is preferably deposited by an ALD method. With use of an ALD method, a dense film with a smaller number of defects such as cracks and pinholes or with a uniform thickness can be formed. An insulator containing aluminum nitride may be used as the above insulator, for example.

Modification Example 2 of Semiconductor Device

Figure 13A:
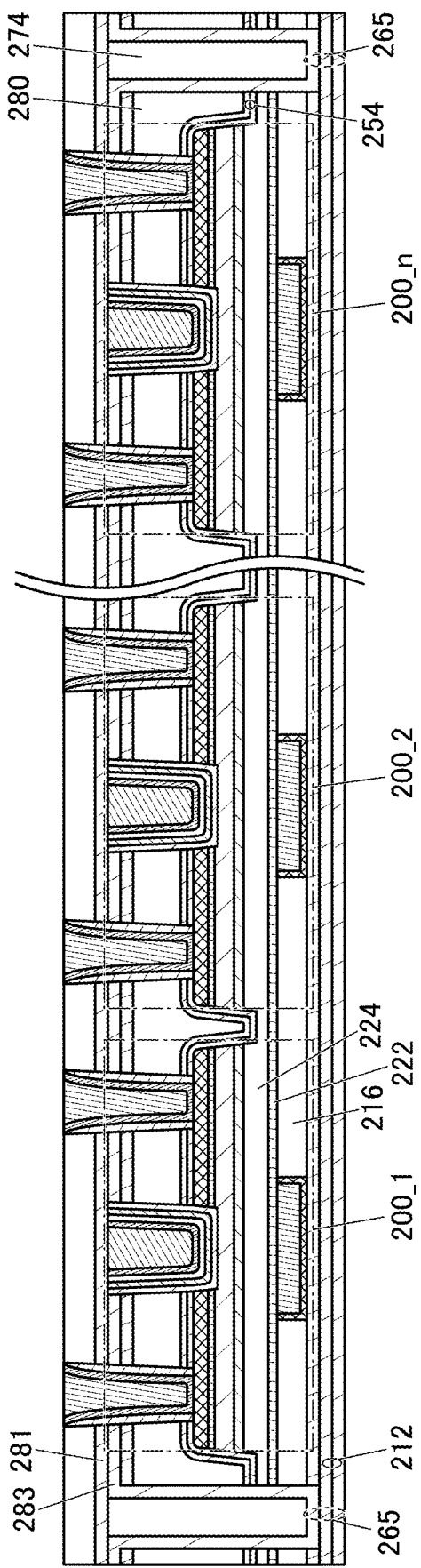
FIG. 13A and FIG. 13B are cross-sectional views of a semiconductor device of one embodiment of the present invention.
Figure 13B:
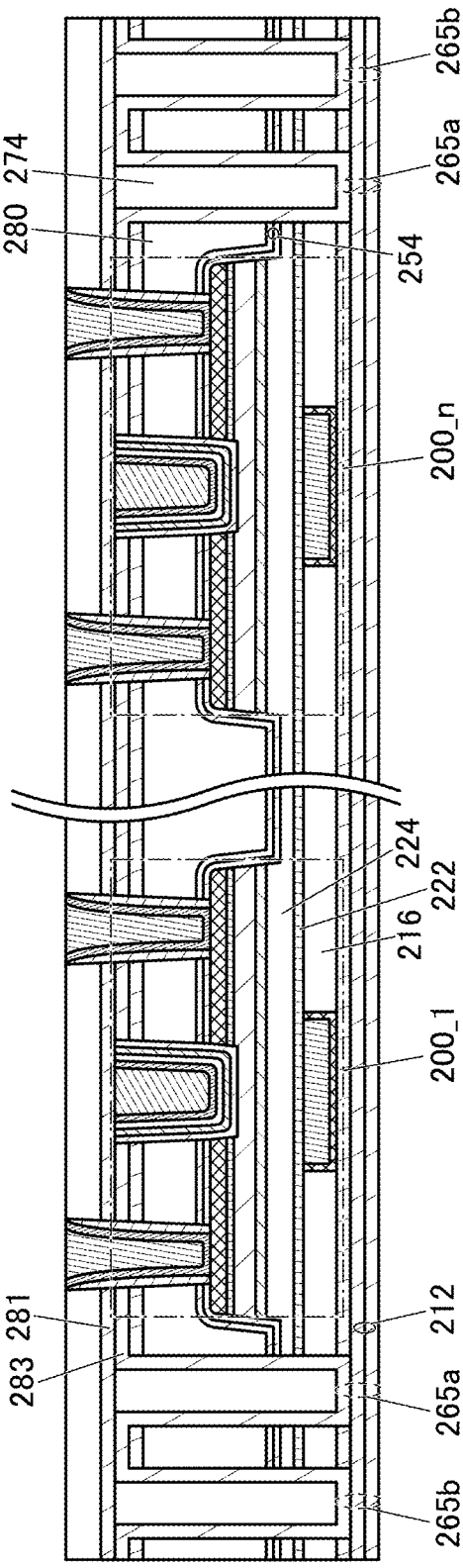

FIG. 13(A) and FIG. 13(B) each illustrate a structure in which a plurality of transistors (a transistor 200_1 to a transistor 200_n) are sealed with the insulator 283 and the insulator 212. Note that although the transistor 200_1 to the transistor 200_n appear to be arranged in the channel length direction in FIG. 13(A) and FIG. 13(B), the present invention is not limited thereto. The transistor 200_1 to the transistor 200_n may be arranged in the channel width direction, may be arranged in a matrix, or may be arranged without particular regularity.

As illustrated in FIG. 13(A), a portion where the insulator 283 is in contact with the insulator 212 (hereinafter, sometimes referred to as a sealing portion 265) is formed outside the plurality of transistors (the transistor 200_1 to the transistor 200_n). The sealing portion 265 is formed to surround the plurality of transistors (also referred to as a transistor group). With such a structure, the plurality of transistors can be surrounded by the insulator 283 and the insulator 212. That is, the four side surfaces and top surfaces of the plurality of transistors can be surrounded by the insulator 283 and the insulator 281, and the bottom surfaces of the transistors can be surrounded by the insulator 212. As described above, a plurality of transistor groups surrounded by the sealing portion 265 are provided over a substrate.

Here, a distance between the sealing portion 265 and the oxide 230 closest to the sealing portion 265 is preferably short. For example, the distance between the sealing portion 265 and the oxide 230 closest to the sealing portion 265 is preferably less than or equal to 1 μm, further preferably less than or equal to 500 nm. This structure can reduce the volume of the insulator 280 sealed with the insulator 283 and the like, so that the amount of hydrogen contained in the insulator 280 can be reduced.

A dicing line (sometimes referred to as a scribe line, a dividing line, or a cutting line) may be provided to overlap with the sealing portion 265. The above substrate is divided at the dicing line, so that the transistor group surrounded by the sealing portion 265 is taken out as one chip.

Although FIG. 13(A) shows an example in which the plurality of transistors (the transistor 200_1 to the transistor 200_n) are surrounded by one sealing portion 265, the present invention is not limited thereto. As illustrated in FIG. 13(B), the plurality of transistors (the transistor 200_1 to the transistor 200_n) may be surrounded by a plurality of sealing portions. In FIG. 13(B), the plurality of transistors are surrounded by a sealing portion 265a and are further surrounded by an outer sealing portion 265b.

When the plurality of transistors (the transistor 200_1 to the transistor 200_n) are surrounded by the plurality of sealing portions in this manner, a portion where the insulator 283 is in contact with the insulator 212 increases, which further can improve adhesion between the insulator 283 and the insulator 212. Accordingly, the plurality of transistors can be sealed more surely.

In that case, a dicing line may be provided to overlap with the sealing portion 265a or the sealing portion 265b, or may be provided between the sealing portion 265a and the sealing portion 265b.

Note that FIG. 13A and FIG. 13B, the insulator 212 has a structure in which a lower layer of the insulator 212 and an upper layer of the insulator 212 are stacked. For example, silicon nitride is deposited by a PECVD method as the lower layer of the insulator 212, and silicon nitride is deposited by a sputtering method as the upper layer of the insulator 212. In this case, the lower layer of the insulator 212 can be formed at a higher rate than the lower layer of the insulator 212, and thus productivity can be increased. Moreover, the upper layer of the insulator 212, which is closer to the oxide 230 than the lower layer of the insulator 212 is, can have a lower hydrogen concentration than the lower layer of the insulator 212. As described above when an insulator through which impurities such as water and hydrogen are less likely to pass, such as silicon nitride, is used as the insulator 212, diffusion of impurities such as water and hydrogen from a layer (not illustrated) below the insulator 212 can be inhibited. When an insulator through which copper is less likely to pass, such as silicon nitride, is used for the insulator 212 in such a manner, even in the case where a metal that is likely to diffuse, such as copper, is used for a conductor in a layer (not illustrated) below the insulator 212, diffusion of the metal into a layer above the insulator 212 through the insulator 212 can be inhibited.

Note that the insulator 212 is not limited to the above structure, and a single-layer structure provided with either the lower layer of the upper layer of the insulator 212 may be employed. Moreover, although the insulator 214 is provided in FIGS. 13A and 13B and the like, the present invention is not limited thereto, and a structure without the insulator 214 may be employed.

According to one embodiment of the present invention, a semiconductor device in which a variation of transistor characteristics is small can be provided. Furthermore, according to one embodiment of the present invention, a semiconductor device with a high on-state current can be provided. Furthermore, according to one embodiment of the present invention, a semiconductor device having favorable electrical characteristics can be provided. Furthermore, according to one embodiment of the present invention, a semiconductor device that can be miniaturized or highly integrated can be provided. Furthermore, according to one embodiment of the present invention, a semiconductor device having high reliability can be provided. Furthermore, according to one embodiment of the present invention, a semiconductor device with low power consumption can be provided.

The structure, method, and the like described above in this embodiment can be used in an appropriate combination with the structures, the methods, and the like described in the other embodiments and examples.

Embodiment 2

In this embodiment, one embodiment of a semiconductor device will be described with reference to FIG. 14 and FIG. 15.

[Memory Device 1]

Figure 14:
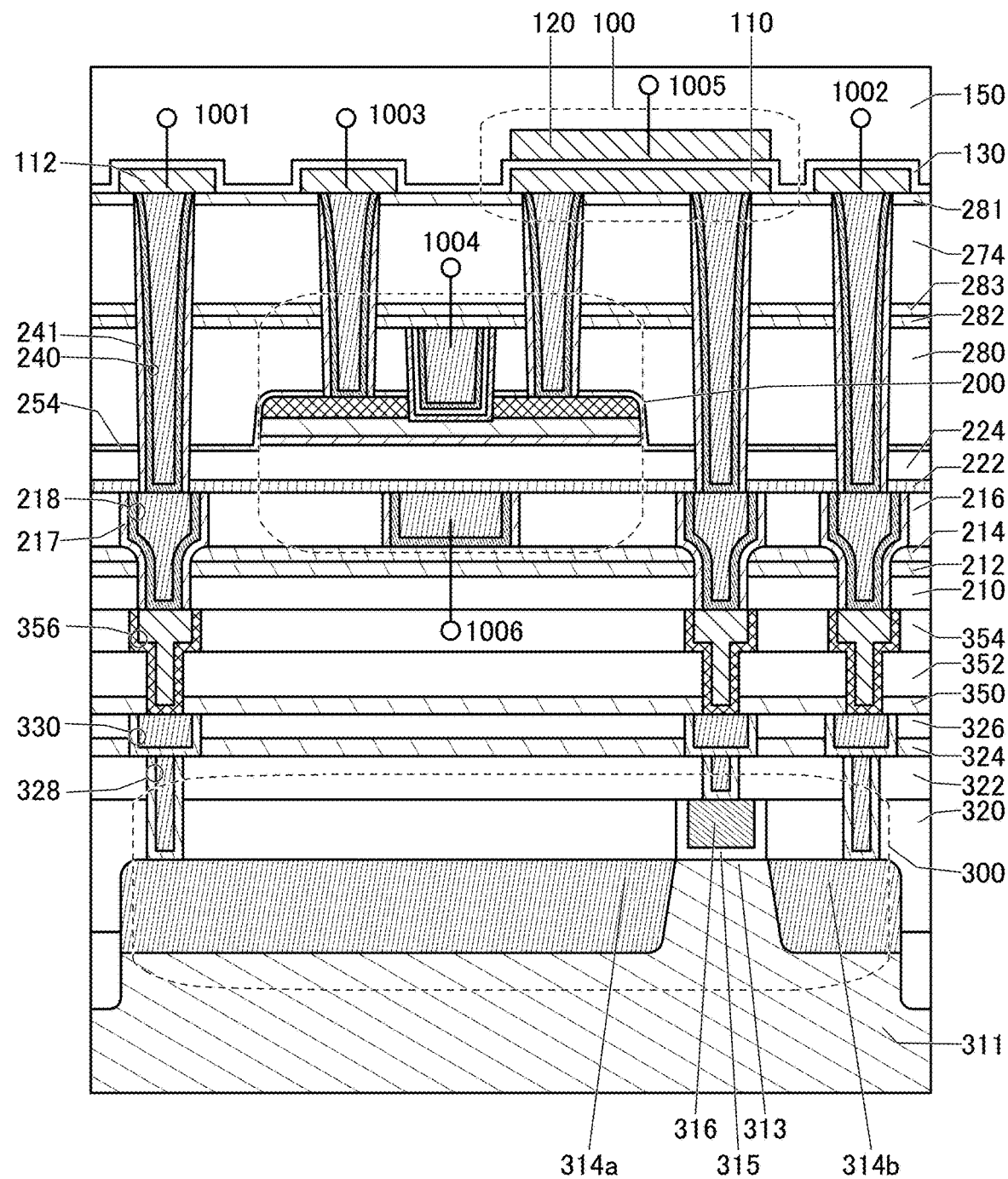
FIG. 14 is a cross-sectional view illustrating a structure of a memory device of one embodiment of the present invention.

FIG. 14 illustrates an example of a semiconductor device (memory device) using a semiconductor device of one embodiment of the present invention. In the semiconductor device of one embodiment of the present invention, the transistor 200 is provided above a transistor 300, and a capacitor 100 is provided above the transistor 300 and the transistor 200. The transistor 200 described in the above embodiment can be used as the transistor 200 described in the above embodiment. Therefore, for the transistor 200 and layers including the transistor 200, the description in the above embodiment can be referred to.

The transistor 200 is a transistor whose channel is formed in a semiconductor layer containing an oxide semiconductor. Since the transistor 200 has a low off-state current, a memory device including the transistor 200 can retain stored data for a long time. In other words, such a memory device does not require refresh operation or has an extremely low frequency of the refresh operation, which leads to a sufficient reduction in power consumption of the memory device.

In the semiconductor device illustrated in FIG. 14, a wiring 1001 is electrically connected to a source of the transistor 300, and a wiring 1002 is electrically connected to a drain of the transistor 300. A wiring 1003 is electrically connected to one of the source and the drain of the transistor 200, a wiring 1004 is electrically connected to the first gate of the transistor 200, and a wiring 1006 is electrically connected to the second gate of the transistor 200. A gate of the transistor 300 and the other of the source and the drain of the transistor 200 are electrically connected to one electrode of the capacitor 100. A wiring 1005 is electrically connected to the other electrode of the capacitor 100.

Furthermore, by arranging the memory devices illustrated in FIG. 14 in a matrix, a memory cell array can be formed.

<Transistor 300>

The transistor 300 is provided over a substrate 311 and includes a conductor 316 functioning as a gate, an insulator 315 functioning as a gate insulator, a semiconductor region 313 formed of part of the substrate 311, and a low-resistance region 314a and a low-resistance region 314b functioning as the source region and the drain region. The transistor 300 may be a p-channel transistor or an n-channel transistor.

Here, in the transistor 300 illustrated in FIG. 14, the semiconductor region 313 (part of the substrate 311) in which a channel is formed has a convex shape. Furthermore, the conductor 316 is provided so as to cover a side surface and the top surface of the semiconductor region 313 with the insulator 315 positioned therebetween. Note that a material adjusting the work function may be used for the conductor 316. Such a transistor 300 is also referred to as a FIN-type transistor because it utilizes a convex portion of the semiconductor substrate. Note that an insulator functioning as a mask for forming the convex portion may be placed in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 14 is an example and the structure is not limited thereto; an appropriate transistor may be used in accordance with a circuit configuration or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

For example, a conductor 112 and the conductor 110 over the conductor 240 can be formed at the same time. Note that the conductor 112 functions as a plug or a wiring that is electrically connected to the capacitor 100, the transistor 200, or the transistor 300.

The conductor 112 and the conductor 110 illustrated in FIG. 14 each have a single-layer structure; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

For the insulator 130, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like is used, and a stacked layer or a single layer can be provided.

For example, for the insulator 130, a stacked-layer structure using a material with high dielectric strength such as silicon oxynitride and a high dielectric constant (high-k) material is preferably used. In the capacitor 100 having such a structure, a sufficient capacitance can be ensured owing to the high dielectric constant (high-k) insulator, and the dielectric strength can be increased owing to the insulator with high dielectric strength, so that the electrostatic breakdown of the capacitor 100 can be inhibited.

As an insulator of a high dielectric constant (high-k) material (a material having a high relative permittivity), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, and the like can be given.

Examples of a material with high dielectric strength (a material having a low relative permittivity) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

<Wiring Layer>

A wiring layer provided with an interlayer film, a wiring, a plug, and the like may be provided between the structure bodies. A plurality of wiring layers can be provided in accordance with the design. Here, a plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and another part of the conductor functions as a plug.

For example, an insulator 320, an insulator 322, an insulator 324, and the insulator 326 are stacked over the transistor 300 in this order as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as plugs or wirings.

The insulator functioning as an interlayer film may function as a planarization film that covers an uneven shape thereunder. For example, the top surface of the insulator 322 may be planarized by planarization treatment using a chemical mechanical polishing (CMP) method or the like to improve planarity.

A wiring layer may be provided over the insulator 326 and the conductor 330. For example, in FIG. 14, an insulator 350, an insulator 352, and an insulator 354 are provided to be stacked in this order. Furthermore, a conductor 356 is formed in the insulator 350, the insulator 352, and the insulator 354. The conductor 356 functions as a plug or a wiring.

Similarly, a conductor 218, a conductor (conductor 205) included in the transistor 200, and the like are embedded in an insulator 210, the insulator 212, the insulator 214, and the insulator 216. Note that the conductor 218 functions as a plug or a wiring that is electrically connected to the capacitor 100 or the transistor 300. In addition, an insulator 150 is provided over the conductor 120 and the insulator 130.

Here, like the insulator 241 described in the above embodiment, an insulator 217 is provided in contact with the side surface of the conductor 218 functioning as a plug. The insulator 217 is provided in contact with the inner wall of the opening formed in the insulator 210, the insulator 212, the insulator 214, and the insulator 216. That is, the insulator 217 is provided between the conductor 218 and the insulator 210, the insulator 212, the insulator 214, and the insulator 216. Note that the conductor 205 and the conductor 218 can be formed in parallel; thus, the insulator 217 is sometimes formed in contact with the side surface of the conductor 205.

As the insulator 217, an insulator such as silicon nitride, aluminum oxide, or silicon nitride oxide may be used. Since the insulator 217 is provided in contact with the insulator 210, the insulator 212, the insulator 214, the insulator 216, and the insulator 222, the entry of impurities such as water and hydrogen into the oxide 230 through the conductor 218 from the insulator 210, the insulator 216, or the like can be inhibited. In particular, silicon nitride is suitable because of having a high blocking property against hydrogen. Moreover, oxygen contained in the insulator 210 or the insulator 216 can be prevented from being absorbed into the conductor 218.

The insulator 217 can be formed in a manner similar to that of the insulator 241. For example, silicon nitride is deposited by a PEALD method and an opening reaching the conductor 356 is formed by anisotropic etching.

As an insulator that can be used as an interlayer film, an insulating oxide, an insulating nitride, an insulating oxynitride, an insulating nitride oxide, an insulating metal oxide, an insulating metal oxynitride, an insulating metal nitride oxide, or the like is given.

For example, when a material having a low relative dielectric constant is used for the insulator functioning as an interlayer film, the parasitic capacitance between wirings can be reduced. Accordingly, a material is preferably selected depending on the function of an insulator.

For example, for the insulator 150, the insulator 210, the insulator 352, the insulator 354, or the like, an insulator having a low relative dielectric constant is preferably used. For example, the insulator preferably includes silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative dielectric constant. Examples of the resin include polyester, polyolefin, polyamide (e.g., nylon and aramid), polyimide, polycarbonate, and acrylic.

When a transistor using an oxide semiconductor is surrounded by insulators having a function of inhibiting passage of oxygen and impurities such as hydrogen, the electrical characteristics of the transistor can be stable. Thus, the insulator having a function of inhibiting passage of oxygen and impurities such as hydrogen can be used for the insulator 214, the insulator 212, the insulator 350, and the like.

As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride can be used.

As the conductors that can be used for a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, and the like, a single-layer structure or a stacked-layer structure using a conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

<Wiring or Plug in Layer Provided with Oxide Semiconductor>

In the case where an oxide semiconductor is used in the transistor 200, an insulator including an excess oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, the insulator 241 is preferably provided between the conductor 240 and the insulator 224 and the insulator 280 that include excess oxygen in FIG. 14. Since the insulator 241 is provided in contact with the insulator 222 and the insulator 254, the insulator 224 and the transistor 200 can be sealed by the insulators having a barrier property. It is preferable that the insulator 241 be also in contact with part of the insulator 280. When the insulator 241 extends to the insulator 274, diffusion of oxygen and impurities can be further inhibited.

That is, the insulator 241 can inhibit excess oxygen contained in the insulator 224 and the insulator 280 from being absorbed by the conductor 240. In addition, diffusion of hydrogen, which is an impurity, into the transistor 200 through the conductor 240 can be inhibited when the insulator 241 is provided.

Note that an insulating material having a function of inhibiting diffusion of oxygen and impurities such as water and hydrogen is preferably used for the insulator 241. For example, silicon nitride, silicon nitride oxide, aluminum oxide, hafnium oxide, or the like is preferably used. In particular, silicon nitride is preferably used because silicon nitride has a high blocking property against hydrogen. Other than that, a metal oxide such as magnesium oxide, gallium oxide, germanium oxide, yttrium oxide, zirconium oxide, lanthanum oxide, neodymium oxide, or tantalum oxide can be used, for example.

The above is the description of the structure example. With use of the structure, a semiconductor device using a transistor including an oxide semiconductor can have a small variation in electrical characteristics and higher reliability. Alternatively, a transistor including an oxide semiconductor and having a high on-state current can be provided. Alternatively, a transistor including an oxide semiconductor and having a low off-state current can be provided. Alternatively, a semiconductor device with low power consumption can be provided.

[Memory Device 2]

Figure 15:
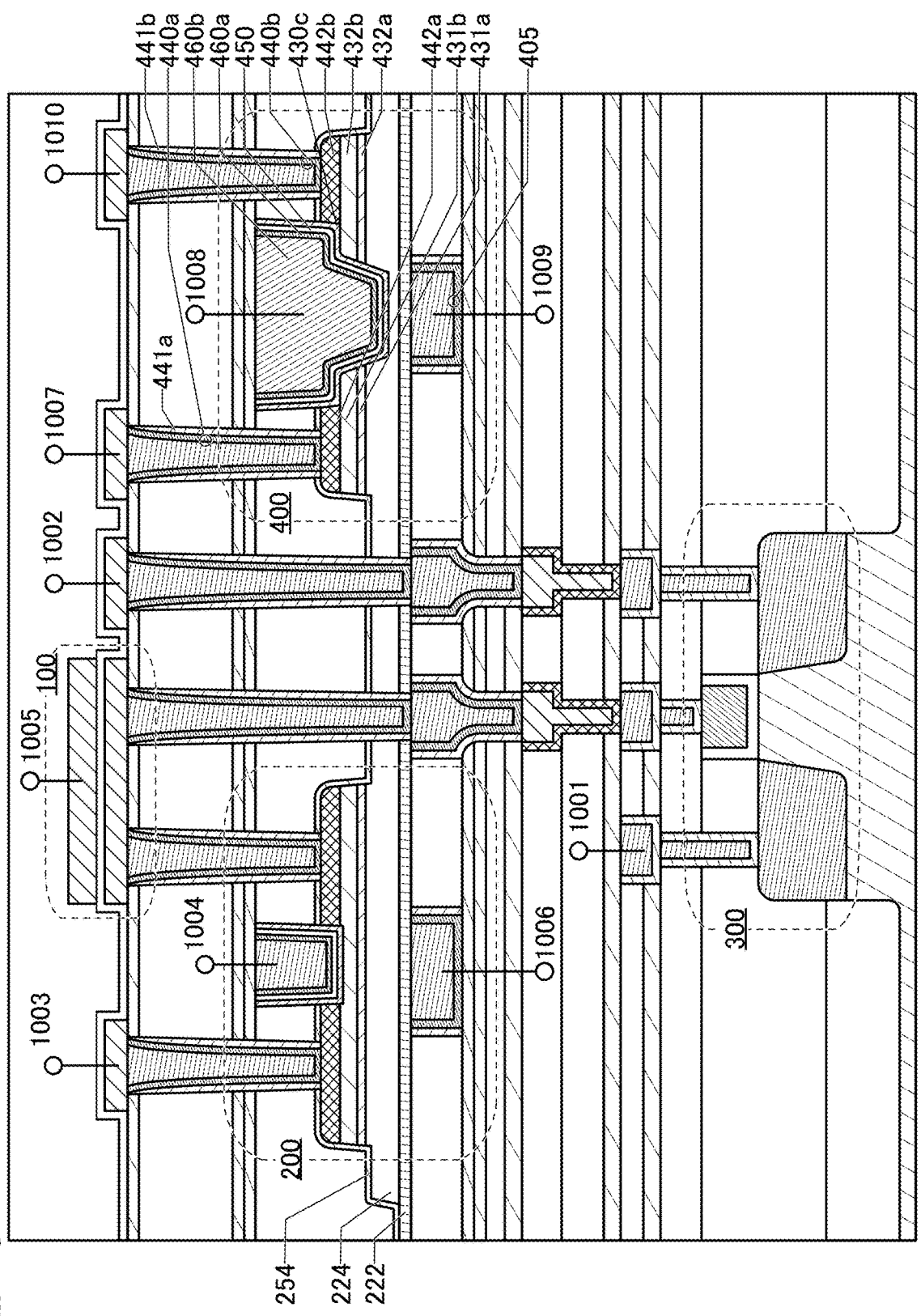
FIG. 15 is a cross-sectional view illustrating a structure of a memory device of one embodiment of the present invention.

FIG. 15 illustrates an example of a memory device using the semiconductor device which is one embodiment of the present invention. The memory device illustrated in FIG. 15 includes a transistor 400 in addition to the semiconductor device including the transistor 200, the transistor 300, and the capacitor 100 illustrated in FIG. 14.

The transistor 400 can control a second gate voltage of the transistor 200. For example, a first gate and a second gate of the transistor 400 are diode-connected to a source of the transistor 400, and the source thereof is connected to the second gate of the transistor 200. When a negative potential of the second gate of the transistor 200 is retained in this structure, a first gate-source voltage and a second gate-source voltage of the transistor 400 are 0 V. In the transistor 400, a drain current when the second gate voltage and the first gate voltage are 0 V is extremely low; thus, the negative potential of the second gate of the transistor 200 can be held for a long time even without power supply to the transistor 200 and the transistor 400. Accordingly, the memory device including the transistor 200 and the transistor 400 can retain stored data for a long time.

In FIG. 15, the wiring 1001 is electrically connected to the source of the transistor 300, and the wiring 1002 is electrically connected to the drain of the transistor 300. In addition, the wiring 1003 is electrically connected to one of the source and the drain of the transistor 200, the wiring 1004 is electrically connected to the gate of the transistor 200, and the wiring 1006 is electrically connected to the second gate of the transistor 200. A gate of the transistor 300 and the other of the source and the drain of the transistor 200 are electrically connected to one electrode of the capacitor 100. A wiring 1005 is electrically connected to the other electrode of the capacitor 100. A wiring 1007 is electrically connected to the source of the transistor 400, a wiring 1008 is electrically connected to the gate of the transistor 400, a wiring 1009 is electrically connected to the second gate of the transistor 400, and a wiring 1010 is electrically connected to a drain of the transistor 400. The wiring 1006, the wiring 1007, the wiring 1008, and the wiring 1009 are electrically connected to each other.

When the memory devices illustrated in FIG. 15 are arranged in a matrix like the memory devices illustrated in FIG. 14, a memory cell array can be formed. Note that one transistor 400 can control the second gate voltages of a plurality of transistors 200. For this reason, the number of transistors 400 is preferably smaller than the number of transistors 200.

<Transistor 400>

The transistor 400 and the transistors 200 are formed in the same layer and thus can be fabricated in parallel. The transistor 400 includes a conductor 460 (a conductor 460a and a conductor 460b) functioning as a first gate; a conductor 405 functioning as a second gate; the insulator 222, the insulator 224, and an insulator 450 each functioning as a gate insulating layer; an oxide 430c including a channel formation region; a conductor 442a, an oxide 431a, and an oxide 431b functioning as a source; a conductor 442b, an oxide 432a, and an oxide 432b functioning as a drain; a conductor 440 (a conductor 440a and a conductor 440b) functioning as a plug; and an insulator 441 (an insulator 441a and an insulator 441b) functioning as a barrier insulating film of the conductor 440.

The conductor 405 is formed in the same layer as the conductor 205. The oxide 431a and the oxide 432a are formed in the same layer as the oxide 230a, and the oxide 431b and the oxide 432b are formed in the same layer as the oxide 230b. The conductor 442a and the conductor 442b are formed in the same layer as the conductor 242. The oxide 430c is formed in the same layer as the oxide 230c. The insulator 450 is formed in the same layer as the insulator 250. The conductor 460 is formed in the same layer as the conductor 260. The conductor 440 is formed in the same layer as the conductor 240. The insulator 441 is formed in the same layer as the insulator 241.

Note that the components formed in the same layer can be formed at the same time. For example, the oxide 430c can be formed by processing an oxide film to be the oxide 230c.

In the oxide 430c functioning as an active layer of the transistor 400, oxygen vacancies and impurities such as hydrogen and water are reduced, as in the oxide 230 or the like. Accordingly, the threshold voltage of the transistor 400 can be further increased, the off-state current can be reduced, and the drain current at the time when the second gate voltage and the first gate voltage are 0 V can be extremely low.

<Dicing Line>

A dicing line (referred to as a scribe line, a dividing line, or a cutting line in some cases) which is provided when a large-sized substrate is divided into semiconductor elements so that a plurality of semiconductor devices are each formed in a chip form is described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, as illustrated in FIG. 15, it is preferable that a region in which the insulator 254 and the insulator 222 are in contact with each other be the dicing line. That is, an opening is provided in the insulator 224 in the vicinity of the region to be the dicing line that is provided in an outer edge of the transistor 400 and the memory cell including a plurality of transistors 200. The insulator 254 is provided so at to cover the side surface of the insulator 224.

That is, in the opening provided in the insulator 224, the insulator 222 is in contact with the insulator 254. For example, in this instance, the insulator 222 and the insulator 254 may be formed using the same material and the same method. When the insulator 222 and the insulator 254 are formed using the same material and the same method, the adhesion therebetween can be increased. For example, aluminum oxide is preferably used.

With such a structure, the insulator 224, the transistor 200, and the transistor 400 can be enclosed with the insulator 222 and the insulator 254. Since the insulator 222 and the insulator 254 have a function of inhibiting diffusion of oxygen, hydrogen, and water, even when the substrate is divided into circuit regions each of which is provided with the semiconductor elements in this embodiment to form a plurality of chips, the entry and diffusion of impurities such as hydrogen or water from the side surface direction of the divided substrate into the transistor 200 and the transistor 400 can be prevented.

Furthermore, the structure can prevent excess oxygen in the insulator 224 from diffusing to the outside of the insulator 254 and the insulator 222. Accordingly, excess oxygen in the insulator 224 is efficiently supplied to the oxide where the channel is formed in the transistor 200 or the transistor 400. The oxygen can reduce oxygen vacancies in the oxide where the channel is formed in the transistor 200 or the transistor 400. Thus, the oxide where the channel is formed in the transistor 200 or the transistor 400 can be an oxide semiconductor with a low density of defect states and stable characteristics. That is, a change in electrical characteristics of the transistors 200 or the transistor 400 can be reduced and reliability can be improved.

The structures, methods, and the like described in this embodiment can be used in combination as appropriate with the structures, configurations, methods, and the like described in the other embodiments and examples.

Embodiment 3

In this embodiment, a memory device according to one embodiment of the present invention including a transistor in which an oxide is used for a semiconductor (hereinafter referred to as an OS transistor in some cases) and a capacitor (hereinafter referred to as an OS memory device in some cases), is described with reference to FIG. 16A and FIG. 16B and FIG. 17A to FIG. 17H. The OS memory device includes at least a capacitor and an OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 16A:
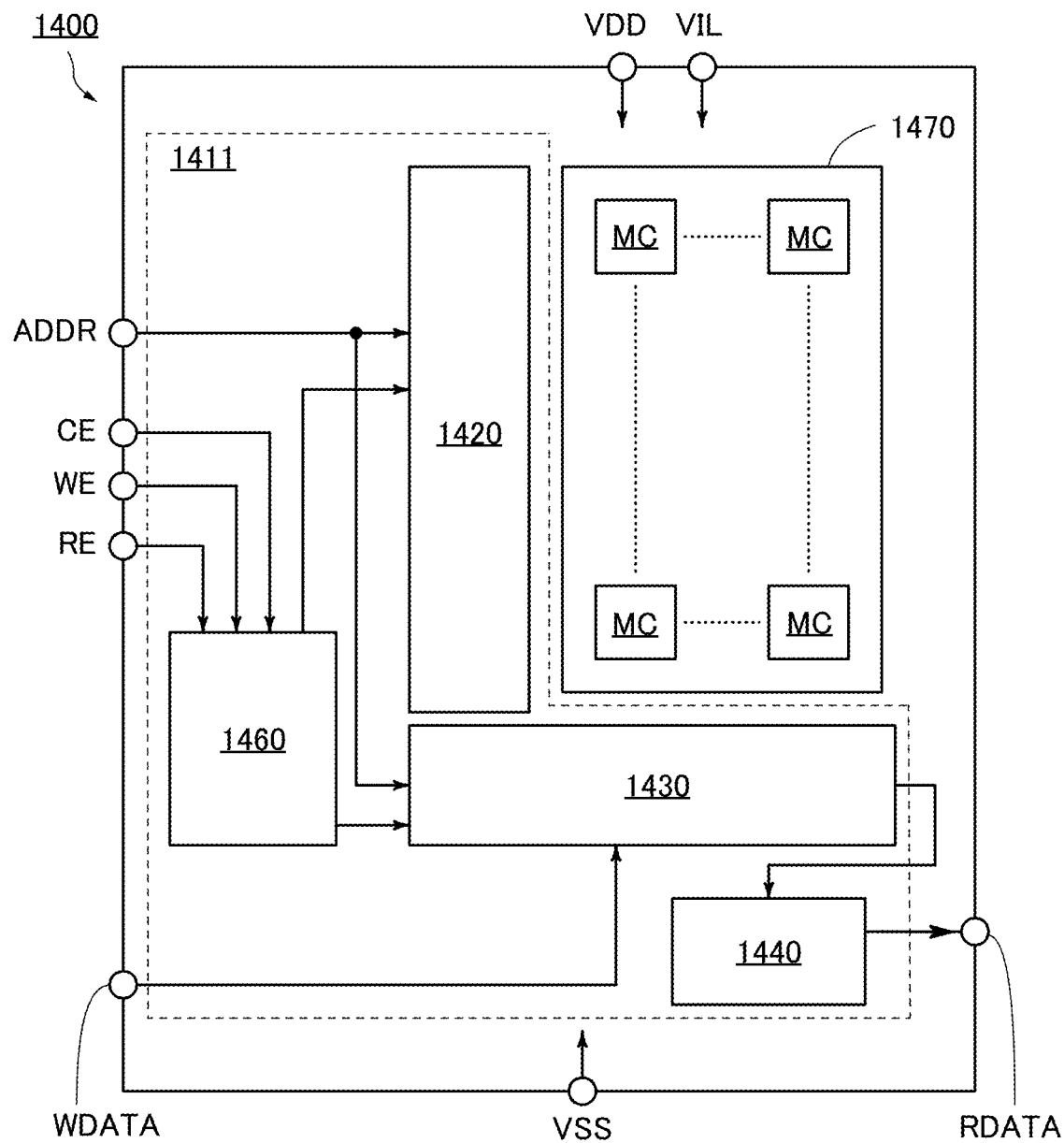
FIG. 16A and FIG. 16B are block diagrams illustrating a structure example of a memory device of one embodiment of the present invention.

FIG. 16A illustrates an example of the structure of an OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and will be described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals may be input as necessary.

The memory cell array 1470 includes a plurality of memory cells MC arranged in a matrix and a plurality of wirings. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 16B:
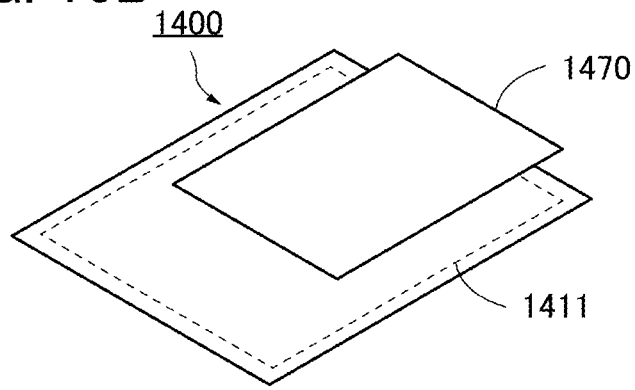

Note that FIG. 16A shows an example in which the peripheral circuit 1411 and the memory cell array 1470 are formed on the same plane; however, this embodiment is not limited thereto. For example, as shown in FIG. 16B, the memory cell array 1470 may be provided over the peripheral circuit 1411 to partly overlap with the peripheral circuit 1411. For example, the sense amplifier may be provided below the memory cell array 1470 so that they overlap with each other.

FIG. 17A to FIG. 17H show structure examples of a memory cell which can be used to the memory cell MC.

[DOSRAM]

Figure 17A:
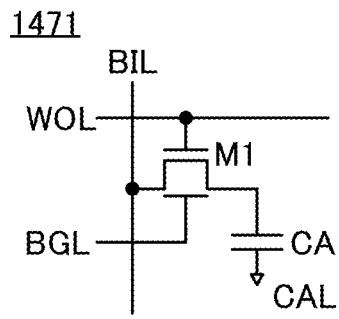
FIG. 17A to FIG. 17H are circuit diagrams each illustrating a structure example of a memory device of one embodiment of the present invention.
Figure 17B:
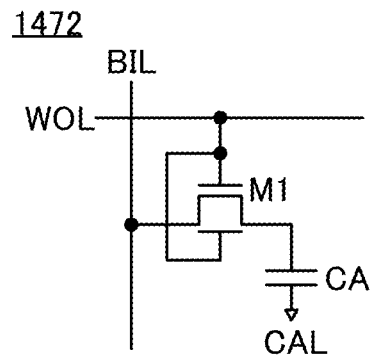
Figure 17C:
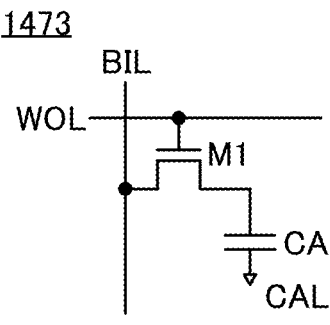

FIG. 17A to FIG. 17C each illustrate a circuit structure example of a memory cell of a DRAM. In this specification and the like, a DRAM using a memory cell including one OS transistor and one capacitor is referred to as DOSRAM (Dynamic Oxide Semiconductor Random Access Memory) in some cases. A memory cell 1471 shown in FIG. 17A includes a transistor M1 and a capacitor CA. Note that the transistor M1 includes a gate (also referred to as a top gate in some cases) and a back gate.

A first terminal of the transistor M1 is connected to a first terminal of the capacitor CA. A second terminal of the transistor M1 is connected to a wiring BIL. A gate of the transistor M1 is connected to a wiring WOL. A back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. Applying a given potential to the wiring BGL can increase or decrease the threshold voltage of the transistor M1.

Here, the memory cell 1471 shown in FIG. 17A corresponds to the memory device shown in FIG. 14. That is, the transistor M1, the capacitor CA, the wiring BIL, the wiring WOL, the wiring BGL, and the wiring CAL correspond to the transistor 200, the capacitor 100, the wiring 1003, the wiring 1004, the wiring 1006, and the wiring 1005, respectively. Note that the transistor 300 illustrated in FIG. 14 corresponds to a transistor provided in the peripheral circuit 1411 of the memory device 1400 illustrated in FIG. 16B.

The memory cell MC is not limited to the memory cell 1471, and the circuit structure can be changed. For example, like a memory cell 1472 in FIG. 17B, a structure may be used in which the back gate of the transistor M1 is connected not to the wiring BGL but to the wiring WOL in the memory cell MC. Alternatively, for example, the memory cell MC may be a memory cell including a single-gate transistor, that is, the transistor M1 not including a back gate, as in a memory cell 1473 shown in FIG. 17C.

In the case where the semiconductor device described in the above embodiments is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with use of the transistor M1, written data can be retained for a long time, and thus the frequency of the refresh operation for the memory cell can be decreased. Alternatively, the refresh operation of the memory cell can be omitted. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. Thus, the bit line capacitance can be small, and the storage capacitance of the memory cell can be reduced.

[NOSRAM]

FIGS. 17D to 17G each show a circuit structure example of a gain-cell memory cell including two transistors and one capacitor. A memory cell 1474 shown in FIG. 17D includes a transistor M2, a transistor M3, and a capacitor CB. Note that the transistor M2 includes a top gate (simply referred to as a gate in some cases) and a back gate. In this specification and the like, a memory device including a gain-cell memory cell using an OS transistor as the transistor M2 is referred to as NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. A gate of the transistor M2 is connected to the wiring WOL. A back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing, data retaining, and data reading, a low-level potential is preferably applied to the wiring CAL. The wiring BGL functions as a wiring for applying a potential to the back gate of the transistor M2. By application of a given potential to the wiring BGL, the threshold voltage of the transistor M2 can be increased or decreased.

Figure 17D:
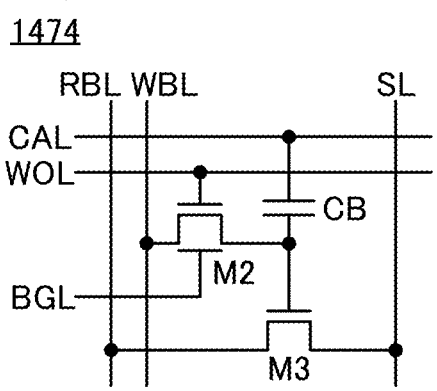
Figure 17E:
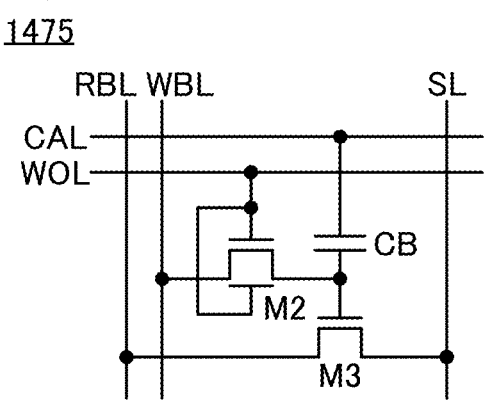
Figure 17F:
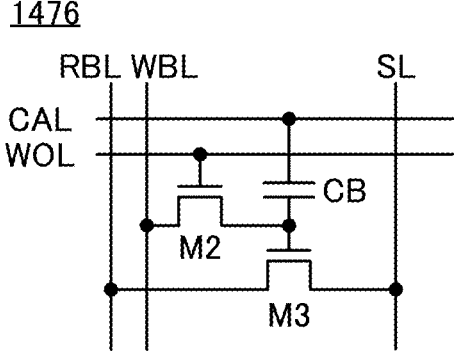
Figure 17G:
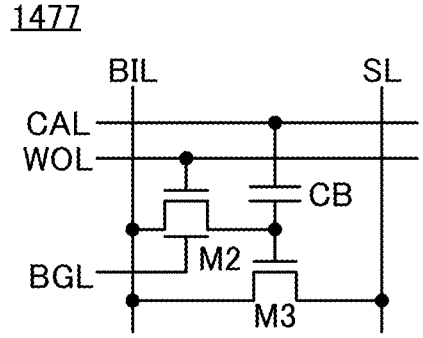

Here, the memory cell 1474 shown in FIG. 17D corresponds to the memory device shown in FIG. 14. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 1003, the wiring 1004, the wiring 1006, the wiring 1005, the wiring 1002, and the wiring 1001, respectively.

The memory cell MC is not limited to the memory cell 1474, and the circuit structure can be changed as appropriate. For example, like a memory cell 1475 in FIG. 17E, a structure may be used in which the back gate of the transistor M2 is connected not to the wiring BGL but to the wiring WOL in the memory cell MC. Alternatively, for example, like a memory cell 1476 in FIG. 17F, the memory cell MC may be a memory cell including a single-gate transistor, that is, the transistor M2 that does not include a back gate. Alternatively, for example, like a memory cell 1477 shown in FIG. 17G, the memory cell MC may have a structure where the wiring WBL and the wiring RBL are combined into one wiring BIL.

In the case where the semiconductor device described in the above embodiments is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. That is, with use of the transistor M2, written data can be retained for a long time, and thus the frequency of the refresh operation for the memory cell can be decreased. Alternatively, the refresh operation of the memory cell can be omitted. In addition, since the transistor M2 has an extremely low leakage current, multi-level data or analog data can be retained in the memory cell 1474. The same applies to the memory cell 1475 to the memory cell 1477.

Note that the transistor M3 may be a transistor containing silicon in a channel formation region (hereinafter also referred to as a Si transistor in some cases). The conductivity type of the Si transistor may be of either an n-channel type or a p-channel type. The Si transistor has higher field-effect mobility than the OS transistor in some cases. Therefore, a Si transistor may be used as the transistor M3 functioning as a reading transistor. Furthermore, the transistor M2 can be provided to be stacked over the transistor M3 when a Si transistor is used as the transistor M3; therefore, the area occupied by the memory cell can be reduced, leading to high integration of the memory device.

The transistor M3 may be an OS transistor. When an OS transistor is used as each of the transistor M2 and the transistor M3, the circuit of the memory cell array 1470 can be formed using only n-channel transistors.

Figure 17H:
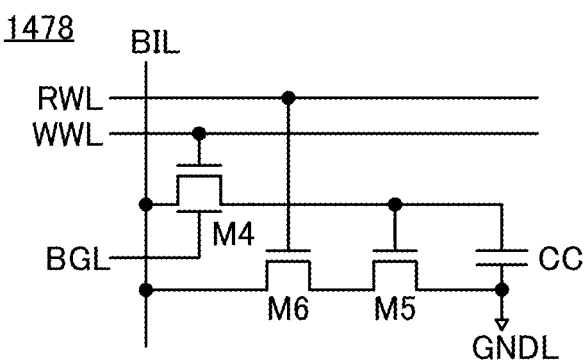

In addition, FIG. 17H shows an example of a gain-cell memory cell including three transistors and one capacitor. A memory cell 1478 shown in FIG. 17H includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate that is electrically connected to the wiring BGL. Note that the back gate and the gate of the transistor M4 may be electrically connected to each other. Alternatively, the transistor M4 does not necessarily include the back gate.

Note that each of the transistor M5 and the transistor M6 may be an n-channel Si transistor or a p-channel Si transistor. Alternatively, the transistor M4 to the transistor M6 may be OS transistors, in which case the circuit of the memory cell array 1470 can be formed using only n-channel transistors.

In the case where the semiconductor device described in the above embodiments is used in the memory cell 1478, the transistor 200 can be used as the transistor M4, the transistor 300 can be used as the transistor M5 and the transistor M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to the above. Positions and functions of these circuits, wirings connected to the circuits, circuit elements, and the like can be changed, deleted, or added as needed.

The structure described in this embodiment can be used in an appropriate combination with the structures described in the other embodiments, example, and the like.

Embodiment 4

In this embodiment, an example of a chip 1200 on which the semiconductor device of the present invention is mounted is described with reference to FIG. 18A and FIG. 18B. A plurality of circuits (systems) are mounted on the chip 1200. The technique for integrating a plurality of circuits (systems) on one chip as described above is referred to as system on chip (SoC) in some cases.

Figure 18A:
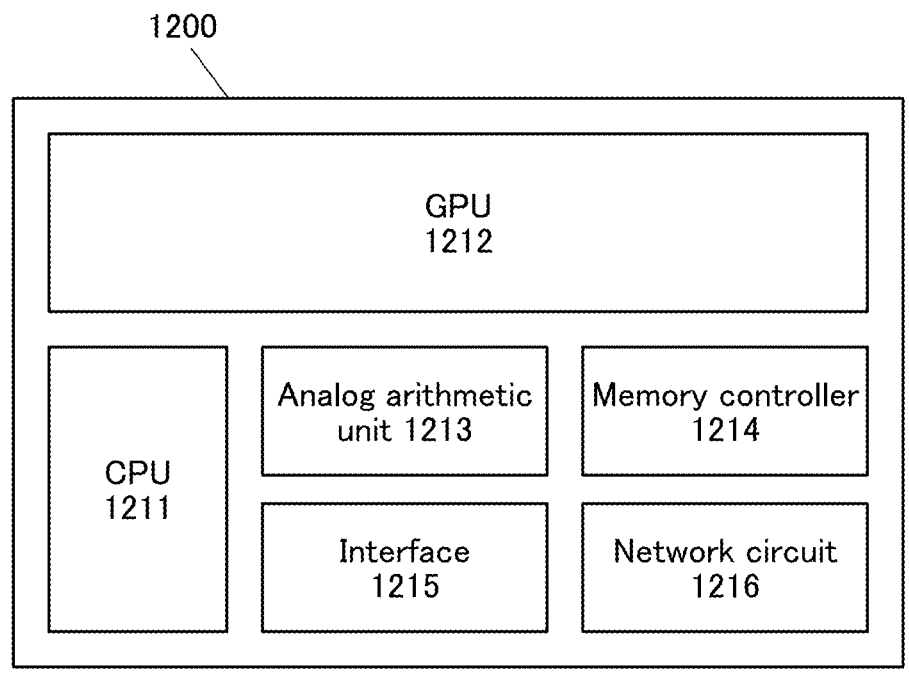
FIG. 18A and FIG. 18B are schematic diagrams of a semiconductor device of one embodiment of the present invention.

As illustrated in FIG. 18A, the chip 1200 includes a CPU 1211, a GPU 1212, one or more of analog arithmetic units 1213, one or more of memory controllers 1214, one or more of interfaces 1215, one or more of network circuits 1216, and the like.

Figure 18B:
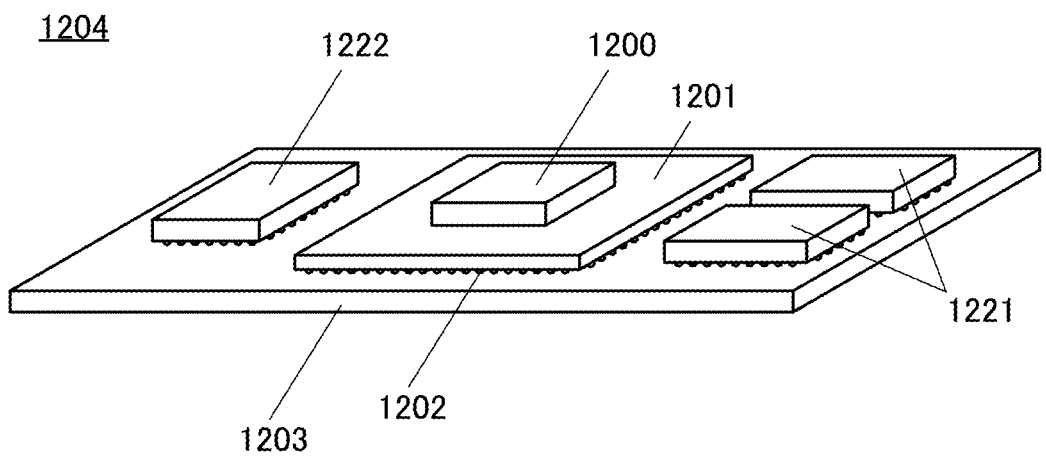

A bump (not illustrated) is provided on the chip 1200 and is connected to a first surface of a printed circuit board (PCB) 1201 as shown in FIG. 18B. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

Since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. The analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a circuit for a network such as a LAN (Local Area Network). The network circuit 1216 may include a circuit for network security.

The circuits (systems) can be formed in the chip 1200 in the same manufacturing process. Thus, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game console. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described in this embodiment can be used in an appropriate combination with the structures described in the other embodiments, example, and the like.

Embodiment 5

In this embodiment, application examples of the memory device using the semiconductor device described in the above embodiment are described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and SSDs (solid state drives). FIG. 19A to FIG. 19E schematically show some structure examples of removable memory devices. The semiconductor device described in the above embodiment is processed into a packaged memory chip and used in a variety of storage devices and removable memories, for example.

Figure 19A:
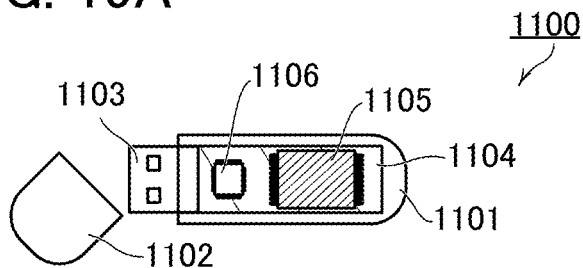
FIG. 19A to FIG. 19E are schematic diagrams of a memory device of one embodiment of the present invention.

FIG. 19A is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like.

Figure 19B:
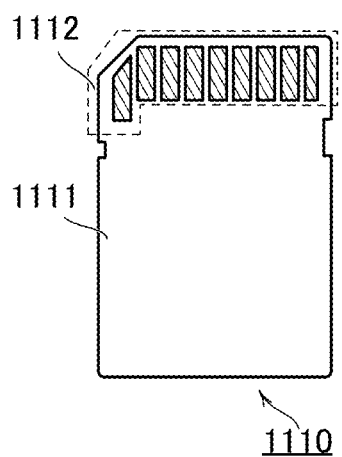
Figure 19C:
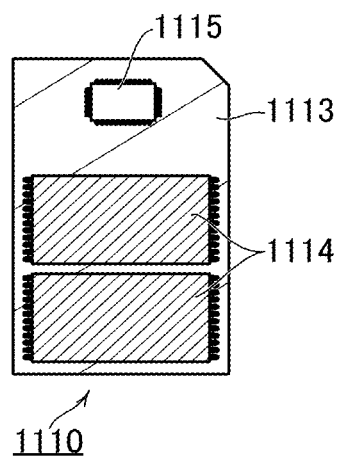

FIG. 19B is a schematic external view of an SD card, and FIG. 19C is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like.

Figure 19D:
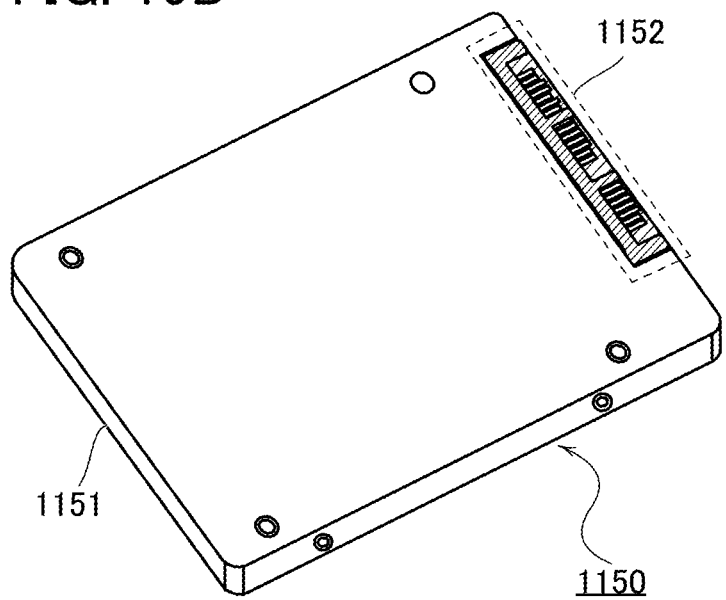
Figure 19E:
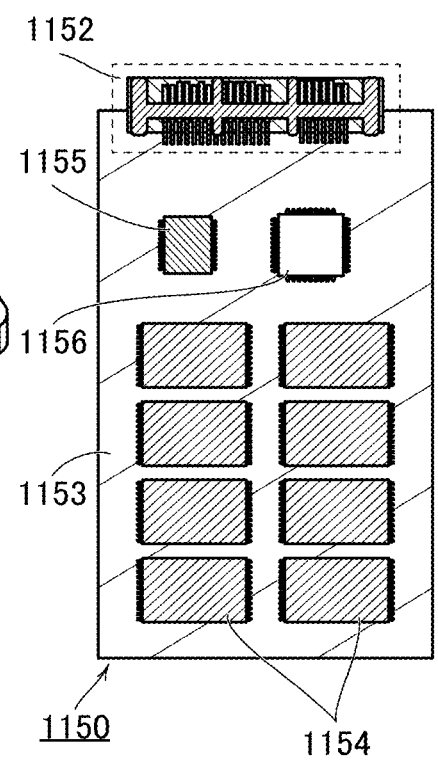

FIG. 19D is a schematic external view of an SSD, and FIG. 19E is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear surface side of the substrate 1153, the capacity of the SSD 1150 can be increased. The semiconductor device described in the above embodiment can be incorporated in the memory chip 1154 or the like.

This embodiment can be implemented in an appropriate combination with the structures described in the other embodiments, example, and the like.

Embodiment 6

The semiconductor device of one embodiment of the present invention can be used as a processor such as a CPU and a GPU or a chip. FIG. 20A to FIG. 20H show specific examples of electronic devices including a chip or a processor such as a CPU or a GPU of one embodiment of the present invention.

<Electronic Devices and Systems>

The GPU or the chip of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. In addition, when the GPU or the chip of one embodiment of the present invention is provided in the electronic device, the electronic device can include artificial intelligence.

The electronic device of one embodiment of the present invention may include an antenna. When a signal is received by the antenna, a video, data, or the like can be displayed on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 20A to FIG. 20H show examples of electronic devices.

[Information Terminal]

Figure 20A:
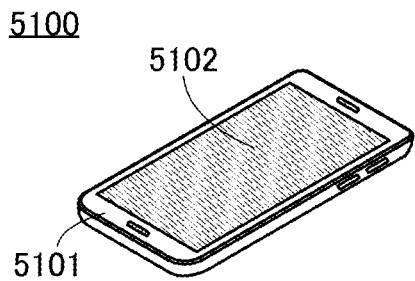
FIG. 20A to FIG. 20H each illustrate an electronic device of one embodiment of the present invention.

FIG. 20A illustrates a mobile phone (smartphone), which is a type of information terminal. An information terminal 5100 includes a housing 5101 and a display portion 5102. As input interfaces, a touch panel is provided in the display portion 5102 and a button is provided in the housing 5101.

When the chip of one embodiment of the present invention is applied to the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 20B:
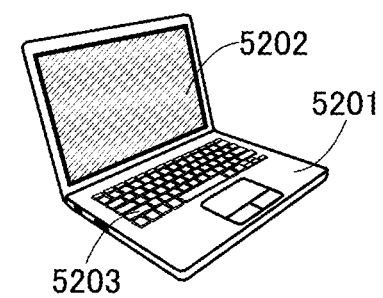

FIG. 20B illustrates a notebook information terminal 5200. The notebook information terminal 5200 includes a main body 5201 of the information terminal, a display portion 5202, and a keyboard 5203.

Like the information terminal 5100 described above, when the chip of one embodiment of the present invention is applied to the notebook information terminal 5200, the notebook information terminal 5200 can execute an application utilizing artificial intelligence. Examples of the application utilizing artificial intelligence include design-support software, text correction software, and software for automatic menu generation. Furthermore, with use of the notebook information terminal 5200, novel artificial intelligence can be developed.

Note that although FIG. 20A and FIG. 20B illustrate a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machines]

Figure 20C:
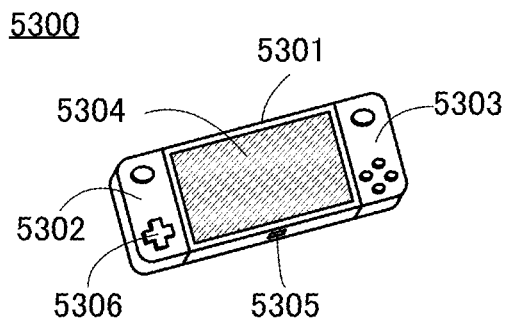

FIG. 20C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not shown), an image to be output to the display portion 5304 can be output to another video device (not shown). In that case, the housing 5302 and the housing 5303 can each function as an operating unit. Thus, a plurality of players can perform a game at the same time. The chip described in the above embodiment can be incorporated into the chip provided on a substrate in the housing 5301, the housing 5302 and the housing 5303.

Figure 20D:
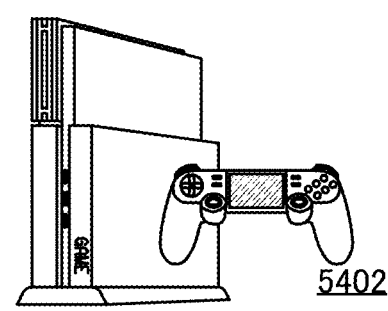

FIG. 20D illustrates a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit, a peripheral circuit, and a module can be reduced.

Furthermore, when the GPU or the chip of one embodiment of the present invention is applied to the portable game machine 5300, the portable game machine 5300 including artificial intelligence can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, questions posed by the player, the progress of the game, time, and actions and words of game characters can be changed for various expressions.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are shown as examples of game machines in FIG. 20C and FIG. 20D, the game machine using the GPU or the chip of one embodiment of the present invention is not limited thereto. Examples of the game machine to which the GPU or the chip of one embodiment of the present invention is applied include an arcade game machine installed in entertainment facilities (a game center, an amusement park, and the like), and a throwing machine for batting practice installed in sports facilities.

[Large Computer]

The GPU or the chip of one embodiment of the present invention can be used in a large computer.

Figure 20E:
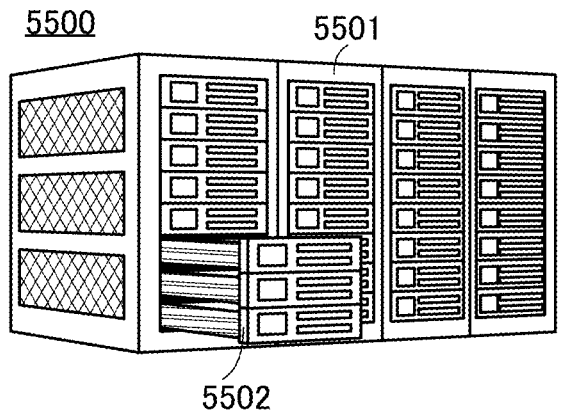
Figure 20F:
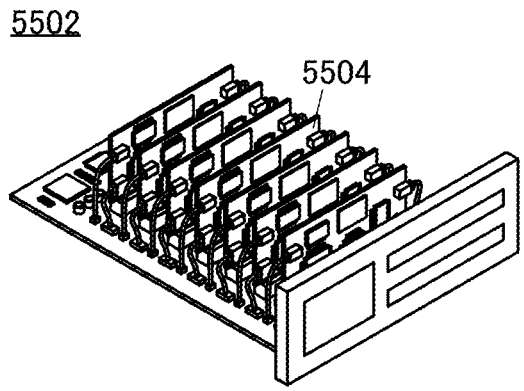

FIG. 20E illustrates a supercomputer 5500 as an example of a large computer. FIG. 20F illustrates a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip shown in the above embodiment can be mounted.

The supercomputer 5500 is a large computer mainly used for scientific computation. In scientific computation, an enormous amount of arithmetic operation needs to be processed at a high speed; hence, power consumption is large and chips generate a large amount of heat. Using the GPU or the chip of one embodiment of the present invention in the supercomputer 5500 achieves a low-power-consumption supercomputer. Moreover, heat generation from a circuit can be reduced owing to low power consumption; thus, the influence of heat generation on the circuit, a peripheral circuit, and a module can be reduced.

Although a supercomputer is shown as an example of a large computer in FIG. 20E and FIG. 20F, a large computer using the GPU or the chip of one embodiment of the present invention is not limited thereto. Other examples of large computers in which the GPU or the chip of one embodiment of the present invention is usable include a computer that provides service (a server) and a large general-purpose computer (a mainframe).

[Moving Vehicle]

The GPU or the chip of one embodiment of the present invention can be applied to an automobile, which is a moving vehicle, and the periphery of a driver's seat in the automobile.

Figure 20G:
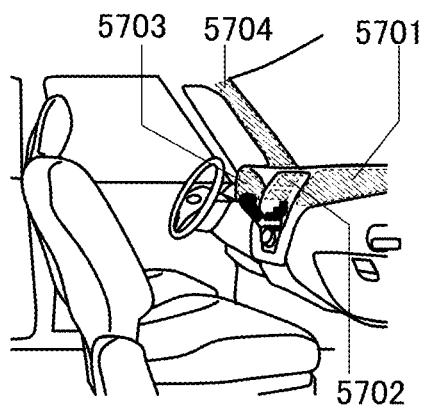

FIG. 20G illustrates an area around a windshield inside an automobile, which is an example of a moving vehicle. FIG. 20G illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. The content, layout, or the like of the display on the display panels can be changed appropriately to suit the user's preferences, so that the design can be improved. The display panel 5701 to the display panel 5703 can also be used as lighting devices.

The display panel 5704 can compensate for view obstructed by the pillar (a blind spot) by showing an image taken by an imaging device (not shown) provided for the automobile. That is, displaying an image taken by the imaging device provided outside the automobile leads to compensation for the blind spot and an increase in safety. In addition, display of an image that complements the area that cannot be seen makes it possible to confirm safety more naturally and comfortably. The display panel 5704 can also be used as a lighting device.

Since the GPU or the chip of one embodiment of the present invention can be applied to a component of artificial intelligence, the chip can be used for an automatic driving system of the automobile, for example. The chip can also be used for a system for navigation, risk prediction, or the like. The display panel 5701 to the display panel 5704 may display information regarding navigation, risk prediction, and the like.

Although an automobile is described above as an example of a moving vehicle, moving vehicles are not limited to an automobile. Examples of a moving vehicle include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Household Appliance]

Figure 20H:
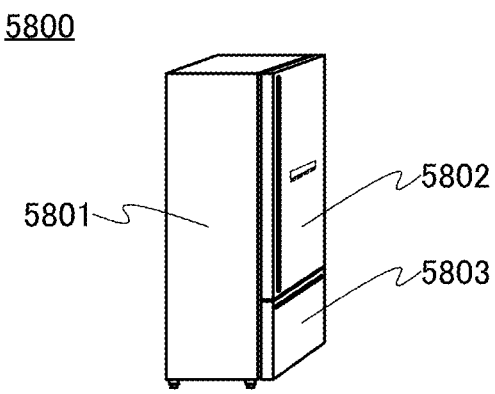

FIG. 20H illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800 and the food expiration dates, for example, a function of automatically adjusting the temperature to be appropriate for the foods stored in the electric refrigerator-freezer 5800, and the like.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic device and the functions of the electronic device, the application example of the artificial intelligence and its effects, and the like described in this embodiment can be combined as appropriate with the description of another electronic device.

This embodiment can be implemented in an appropriate combination with the structures described in the other embodiments, example, and the like.

Example 1

In this example, a plurality of the transistors 200 each including an oxide semiconductor shown in FIG. 1A to FIG. 1D were fabricated in the same process, transistor characteristics were measured, and variation of the transistor characteristics was evaluated.

Note that a semiconductor device including the transistor 200 shown in FIG. 1A to FIG. 1D is referred to as Sample 1A. The semiconductor device fabricated as a sample includes 161 transistors formed in the same process. The design values of the channel length and the channel width of Sample 1A were each 60 nm.

The sample 1A is described below.

In Sample 1A, the oxide 230a was formed of an In—Ga—Zn oxide film deposited by a sputtering method using an oxide target with In:Ga:Zn=1:3:4 [atomic ratio]. The oxide 230b was formed of an In—Ga—Zn oxide film deposited by a sputtering method using an oxide target with In:Ga:Zn=4:2:4.1 [atomic ratio]. Note that the film to be the oxide 230a and the film to be the oxide 230b were successively formed.

The oxide 230c was formed to have a stacked-layer structure of an In—Ga—Zn oxide film deposited by a sputtering method using an oxide target with In:Ga:Zn=4:2:4.1 [atomic ratio] and an In—Ga—Zn oxide film deposited by a sputtering method using an oxide target with In:Ga:Zn=1:3:4 [atomic ratio].

The conductor 242 was formed using a tantalum nitride film. The insulator 250 was formed using a silicon oxynitride film.

The conductor 260a was formed using a titanium nitride film. The conductor 260b was formed using a tungsten film. The film to be the conductor 260a and the film to be the conductor 260b were successively formed.

<Electrical Characteristics of Transistor in Sample 1A>

First, heat treatment was performed on Sample 1A at 400° C. for four hours in a nitrogen atmosphere. After that, electrical characteristics of the 161 transistors included in Sample 1A were measured. As electrical characteristics, $I_d$-$V_g$ characteristics were measured when the drain voltage $V_d$ was set at 1.2 V and the gate voltage $V_g$ was changed from −4 V to +4 V.

Here, in the $I_d$-$V_g$ transistor characteristics, the value of the gate voltage $V_g$ at a drain current $I_d$=1.0×10$^{-12}$ [A] was the Shift value ($V_{sh}$).

Figure 21:
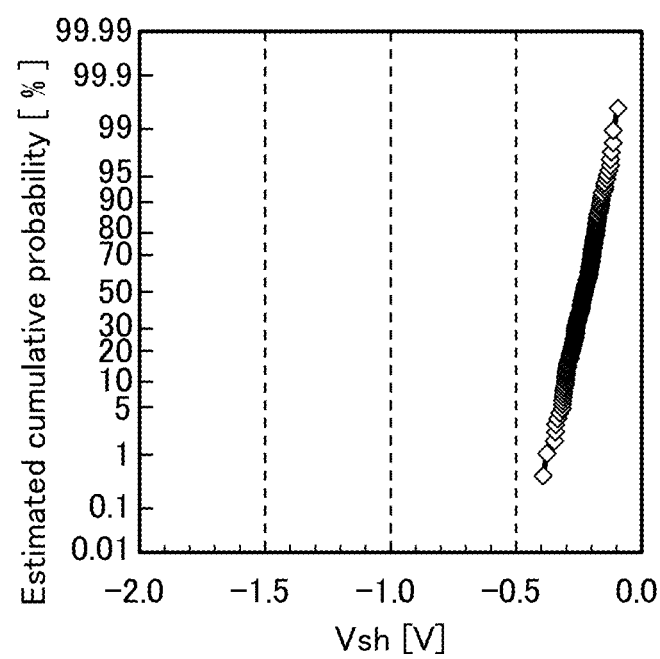
FIG. 21 shows a normal probability plot for shift values of samples of Example.

FIG. 21 shows a normal probability plot diagram of electrical characteristics of the 161 transistors included in Sample 1A. In FIG. 21, the horizontal axis represents the Shift value ($V_{sh}$) [V] and the vertical axis represents the estimated cumulative probability [%].

Note that examples of methods for calculating estimated cumulative probability (also referred to as cumulative relative frequency) include a median ranking method, an average ranking method, a symmetric sample cumulative distribution method, and a Kaplan-Meier method, and an appropriate method may be selected. In this example, the estimated cumulative probability was calculated using a median ranking method.

According to FIG. 21, the average value of the Shift value is −0.231 V and the standard deviation σ is 0.056 V in Sample 1A.

From the above, it was found that the transistor 200 using the present invention has electrical characteristics with a small variation.

At least part of the structure, the method, and the like described in this example can be implemented in appropriate combination with other embodiments described in this specification.

Example 2

In this example, the semiconductor device illustrated in FIG. 12A to FIG. 12D was fabricated, the reliability of the transistor 200 was evaluated, and the stress time dependence was evaluated. The evaluation results are described. The reliability evaluation was performed on four transistors of Sample A to Sample D formed on one substrate. On the substrate including Sample A to Sample D, a 2-nm-thick oxide 243 was formed by a sputtering method using a target with In:Ga:Zn=1:3:4 [atomic ratio] at a substrate temperature of 200° C. The substrate was subjected to heat treatment in a nitrogen atmosphere at 400° C. for eight hours. The reliability was evaluated by a +GBT (Gate Bias Temperature) stress test at a stress temperature of 150° C. The set temperature was 150° C.; the drain potential $V_d$, the source potential $V_s$, and the bottom gate potential $V_{bg}$ were set to 0 V; and the top gate potential $V_g$ was set to +3.63 V. Note that as the transistor size, each of Sample A to Sample D has the following design value: a channel length of 60 nm and a channel width of 60 nm. Note that in the stress test, the stress time at which $\Delta V_{sh}$ exceeds ±100 mV is defined as the lifetime of a transistor. Changes in $I_{on}$, the S value, and μFE with the stress time were also evaluated.

Figure 22:
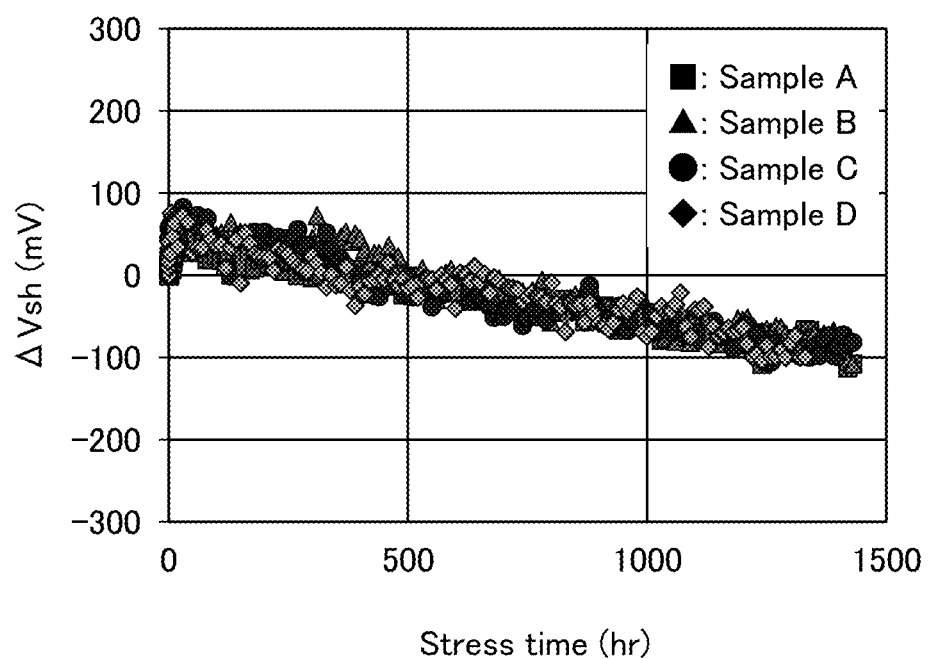
FIG. 22 shows stress time dependence of $\Delta V_{sh}$ in a +GBT stress test of Example.

FIG. 22 shows the results of the +GBT stress test. In FIG. 22, the horizontal axis represents stress time (hr), and the vertical axis represents $\Delta V_{sh}$ (mV). As shown in FIG. 22, the lifetime of Sample A is 1230 hours, that of Sample B is 1410 hours, that of Sample C is 1240 hours, and that of Sample D is 1230 hours. The favorable result such that the lifetime is longer than or equal to 1200 hours was obtained from all of four samples.

The set temperature of 150° C. in the +GBT stress test performed in this example is assumed to accelerate deterioration by approximately 24 times, compared to the set temperature of 125° C. in a +GBT stress test. Accordingly, the lifetime at a stress temperature of 125° C. can be estimated at 28000 hours or longer.

Figure 23A:
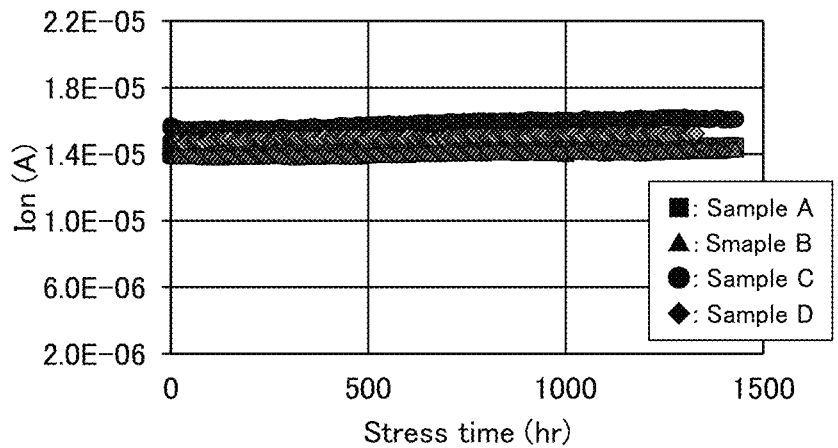
FIG. 23A shows stress time dependence of $I_{on}$ in a +GBT stress test of Example.
Figure 23B:
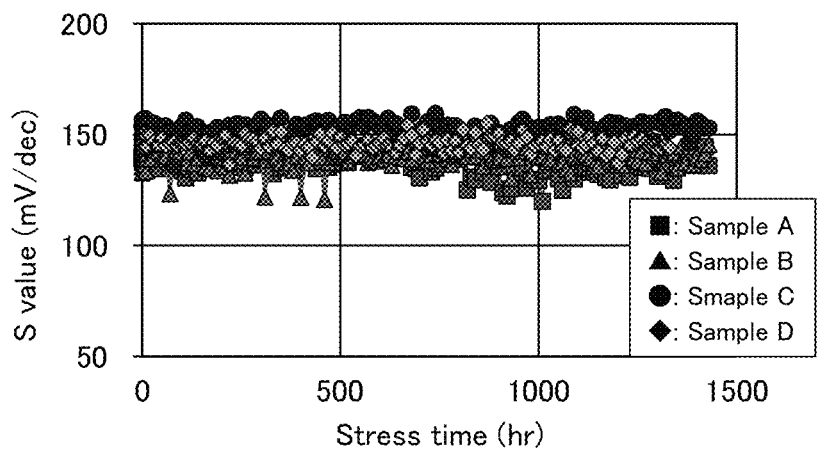
FIG. 23B shows stress time dependence of S value in a +GBT stress test of Example.
Figure 23C:
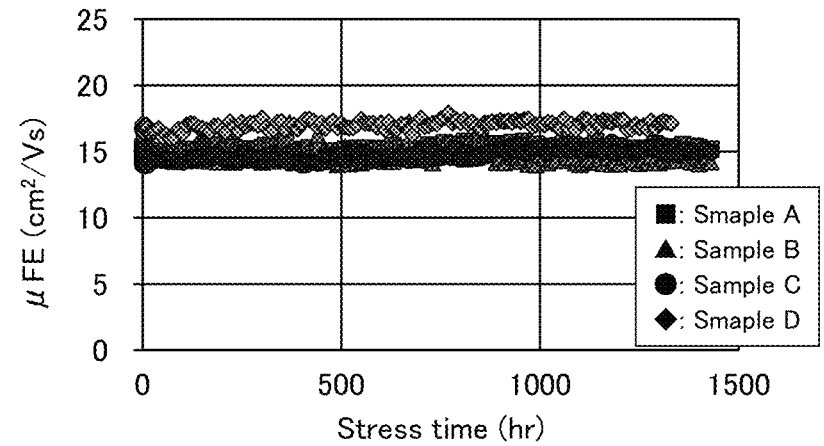
FIG. 23C shows stress time dependence of $\mu_{FE}$ in a +GBT stress test of Example.

FIG. 23A shows a variation in $I_{on}$ of Sample A to Sample D depending on stress time. FIG. 23B shows a variation in S values of Sample A to Sample D depending on stress time. FIG. 23C shows a variation in μFE of Sample A to Sample D depending on stress time.

Note that $I_{on}$ (A) is the value of $I_d$ when $V_d$=+1.2 V and $V_g$=+3.3 V. The S value (mV/dec) is the value of $V_g$ that is necessary to change $I_d$ by an order of magnitude in the subthreshold region when $V_d$ is set to +1.2 V. Moreover, μFE (cm²/Vs) is a value calculated from the equation of the linear region of gradual channel approximation.

As shown in FIG. 23A to FIG. 23C, Sample A to Sample D were verified to have small variations in $I_{on}$, S value, and μFE depending on stress time.

The above results demonstrate that the transistor 200 of one embodiment of the present invention has high reliability.

This example can be used in an appropriate combination with the structures, configurations, methods, and the like described in other embodiments and the other examples.

Example 3

In this example, a semiconductor device including the transistor 200 illustrated in FIG. 12A to FIG. 12D was fabricated, transistor characteristics were measured, and variation of the transistor characteristics was evaluated.

Note that the semiconductor device including the formed transistor 200 includes 215 transistors fabricated in the same process. The design values of the channel length and the channel width were each 60 nm.
<Electrical Characteristics>

First, heat treatment was performed on the fabricated semiconductor device at 400° C. for eight hours in a nitrogen atmosphere. After that, electrical characteristics of the 215 transistors included in the semiconductor device were measured. As electrical characteristics, $I_d$-$V_g$ characteristics were measured when $V_d$ was set at 0.1 V or 1.2 V and $V_g$ was changed from −4 V to +4 V.

Figure 24:
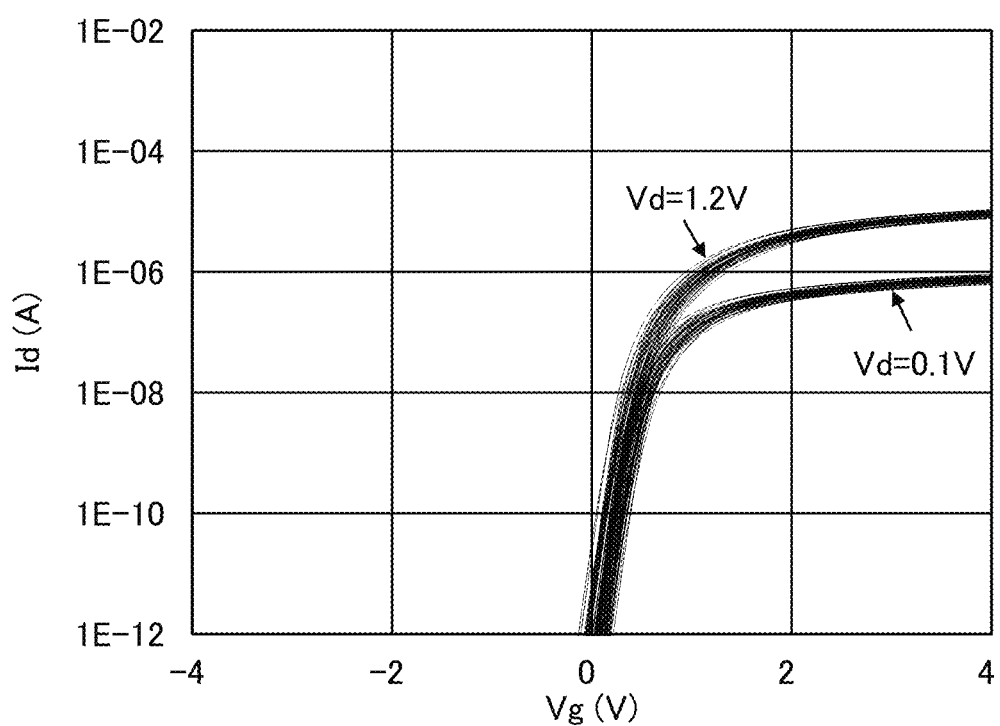
FIG. 24 shows $I_d$-$V_g$ characteristics of transistors of Example.

FIG. 24 shows a graph showing $I_d$-$V_g$ characteristics of the 215 transistors included in the semiconductor device. In FIG. 24, the horizontal axis represents $V_g$ (V), and the vertical axis represents $I_d$ (A).

Figure 25A:
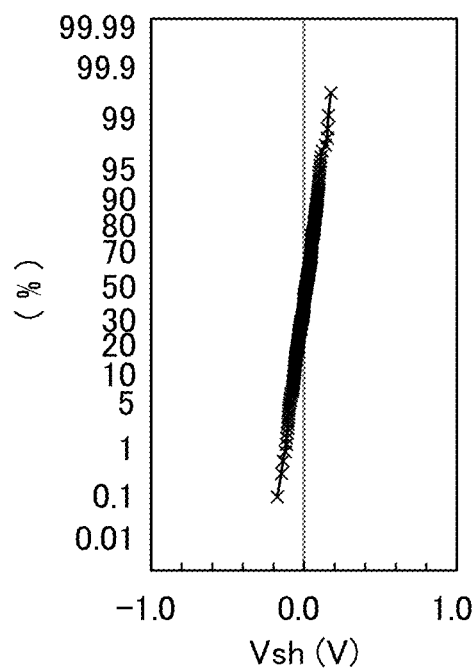
FIG. 25A shows a normal probability plot for $V_{sh}$ of Example.
Figure 25B:
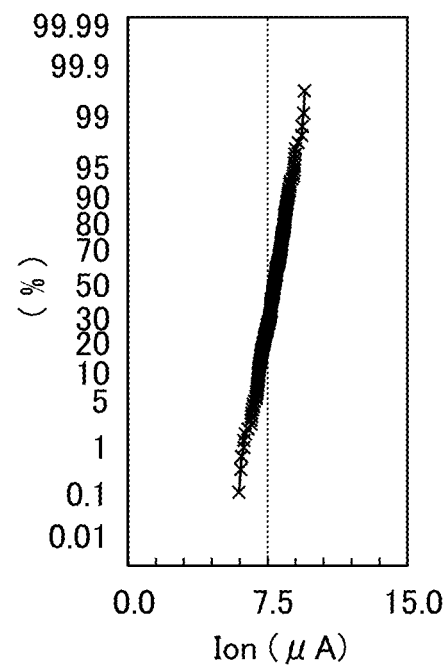
FIG. 25B shows a normal probability plot for $I_{on}$ of Example.
Figure 25C:
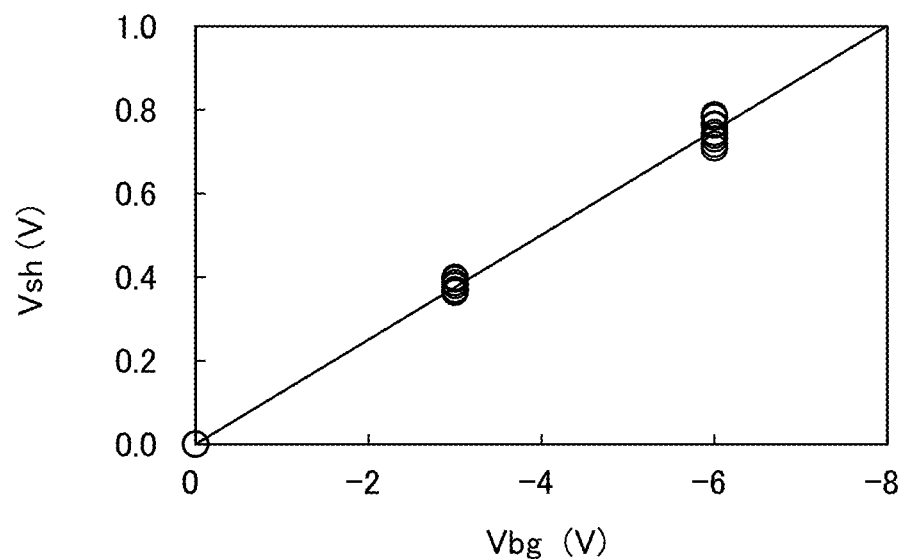
FIG. 25C shows $V_{bg}$ dependence of $V_{sh}$ of Example.

FIG. 25A shows a normal probability plot diagram of $V_{sh}$. In FIG. 25A, the horizontal axis represents $V_{sh}$ (V) and the vertical axis represents estimated cumulative probability (%). FIG. 25B shows a normal probability plot diagram of $I_{on}$. In FIG. 25B, the horizontal axis represents $I_{on}$ (μA) and the vertical axis represents estimated cumulative probability (%). FIG. 25C shows $V_{bg}$ dependence of $V_{sh}$ of nine transistors.

Note that examples of methods for calculating estimated cumulative probability (also referred to as cumulative relative frequency) include a median ranking method, an average ranking method, a symmetric sample cumulative distribution method, and a Kaplan-Meier method, and an appropriate method may be selected. In this example, the estimated cumulative probability was calculated using a median ranking method.

FIG. 24 shows $I_d$-$V_g$ characteristics of the 215 transistors. According to FIG. 25A, the standard deviation σ of $V_{sh}$ of the 215 transistors is approximately 64 mV.

According to FIG. 25B, the average value of $I_{on}$ of the 215 transistors is approximately 7.78 μA, and the standard deviation σ thereof is approximately 6.71 μA.

From the above results, the transistor 200 using one embodiment of the present invention was verified to have favorable electrical characteristics and a small variation thereof. Furthermore, it was found that control of $V_{sh}$ with $V_{bg}$ is possible.

At least part of the structure, the method, and the like shown in this example can be implemented in appropriate combination with other embodiments and other examples described in this specification.

Example 4

In this example, the reliability of two transistors (Element A and Element B) of the semiconductor devices including the transistor 200 used in Example 2 was evaluated.
<Reliability of Transistor>

The reliability was evaluated by a +GBT stress test. In the +GBT stress test of this example, the set temperature was 150° C.; $V_d=V_s=V_g=0$ V; and $V_g=+3.63$ V. Note that $V_s$ denotes a drain potential, and $V_{bg}$ denotes a bottom gate potential.

During the +GBT stress test, $I_d$-$V_g$ measurement was performed at certain intervals. The $I_d$-$V_g$ measurement was performed by sweeping $V_g$ from −3.3 V to +3.3 V when the transistor was set to have $V_d=1.2$ V, $V_s=0$V, and $V_{bg}=0$ V. Note that a semiconductor parameter analyzer manufactured by Keysight Technologies was used for the $I_d$-$V_g$ measurement. In the +GBT stress test, $\Delta V_{sh}$ representing the amount of change in $V_{sh}$ from the start of the measurement was used as an index of the amount of change in the electrical characteristics of the transistor. A variation in S values depending on stress time was also evaluated.

Figure 26A:
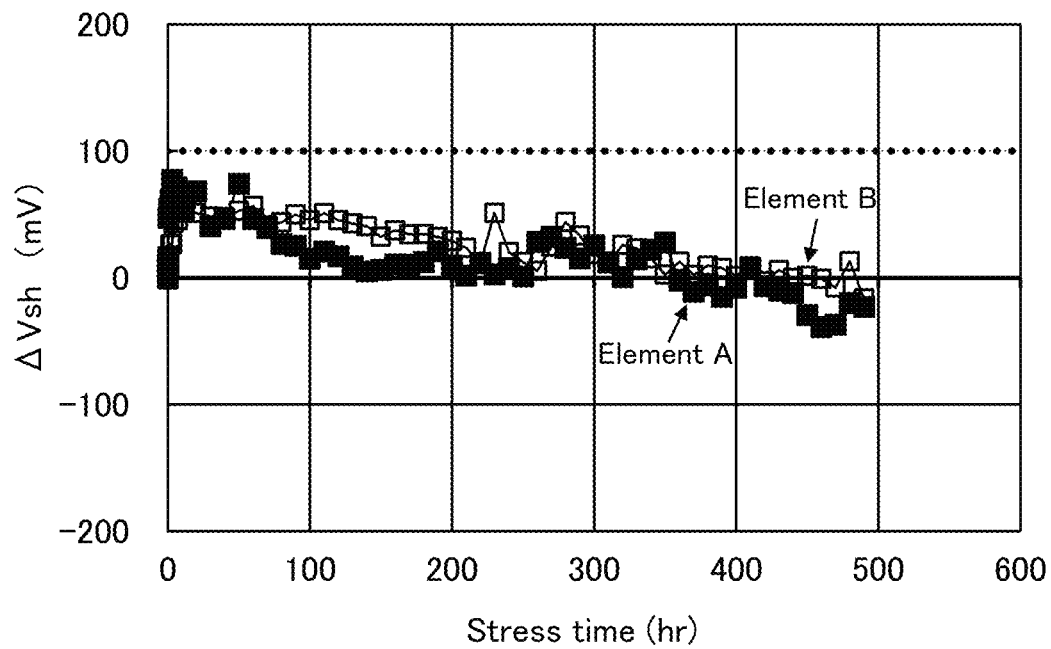
FIG. 26A shows $\Delta V_{sh}$ in a +GBT stress test of Example.

FIG. 26A shows results of the +GBT stress test on Element A and Element B. In FIG. 26A, the horizontal axis represents stress time (hr), and the vertical axis represents $\Delta V_{sh}$ (mV).

As shown in FIG. 26A, the amount of change in the shift voltage $\Delta V_{sh}$ of each of Element A and Element B was less than or equal to 100 mV even when the stress was applied for 490 hours. Specifically, $\Delta V_{sh}$ of Element A after the elapse of 490 hours was −16 mV, and $\Delta V_{sh}$ of Element B after the elapse of 490 hours was −23 mV.

Figure 26B:
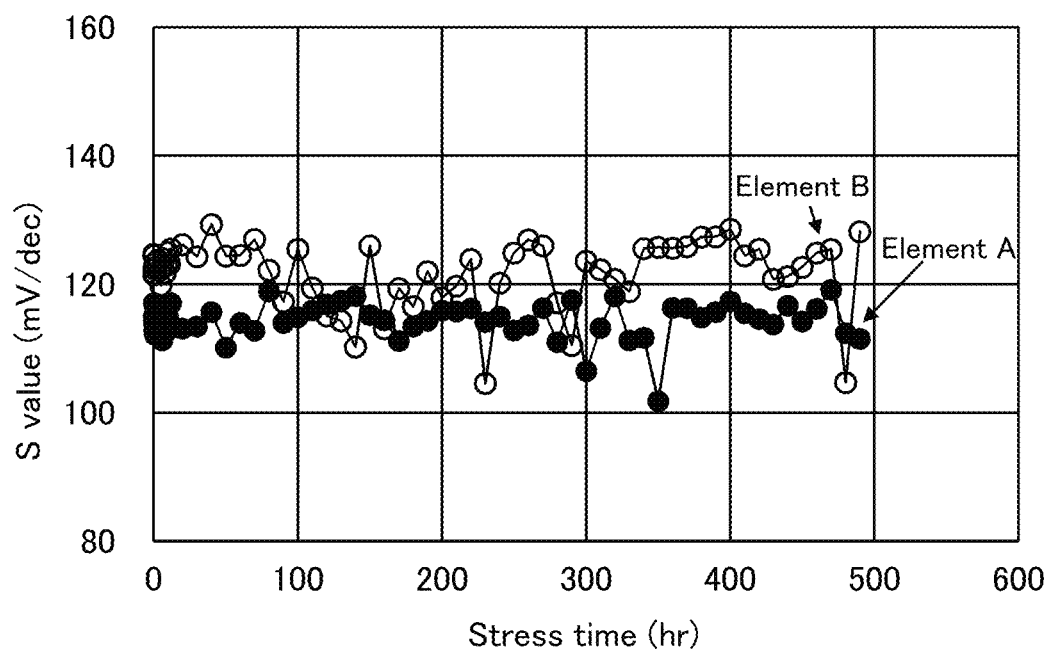
FIG. 26B shows stress time dependence of S value of Example.

FIG. 26B shows variations in S values of Element A and Element B in the +GBT stress test. In FIG. 26B, the horizontal axis represents stress time (hr), and the vertical axis represents S value (mV/dec).

As shown in FIG. 26B, even when the stress was applied for 490 hours, a variation in S values of each of Element A and Element B was not out of a range from 100 mV/dec to 140 mV/dec.

The above results demonstrate that the transistor 200 using one embodiment of the present invention has high reliability.

At least part of the structure, the method, and the like shown in this example can be implemented in appropriate combination with other embodiments and other examples described in this specification.

REFERENCE NUMERALS

100: capacitor, 110: conductor, 112: conductor, 120: conductor, 130: insulator, 150: insulator, 200: transistor, 200_1: transistor, 2002: transistor, 200_n: transistor, 205: conductor, 205a: conductor, 205b: conductor, 210: insulator, 212: insulator, 214: insulator, 216: insulator, 217: insulator, 218: conductor, 222: insulator, 224: insulator, 230: oxide, 230a: oxide, 230A: oxide film, 230b: oxide, 230B: oxide film, 230c: oxide, 230c1: oxide, 230c2: oxide, 230C: oxide film, 231: region, 231a: region, 231b: region, 234: region, 240: conductor, 240a: conductor, 240b: conductor, 241: insulator, 241a: insulator, 241b: insulator, 242: insulator, 242a: conductor, 242A: conductive film, 242b: conductor, 242B: conductive layer, 243: oxide, 243a: oxide, 243b: oxide, 246: conductor, 246a: conductor, 246b: conductor, 250: insulator, 250A: insulating film, 254: insulator, 254a: insulator, 254A: insulating film, 254b: insulator, 260: conductor, 260a: conductor, 260A: conductive film, 260b: conductor, 260B: conductive film, 265: sealing portion, 265a: sealing portion, 265b: sealing portion, 274: insulator, 280: insulator, 281: insulator, 282: insulator, 283: insulator, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 400: transistor, 405: conductor, 430c: oxide, 431a: oxide, 431b: oxide, 432a: oxide, 432b: oxide, 440: conductor, 440a: conductor, 440b: conductor, 441: insulator, 441a: insulator, 441b: insulator, 442a: conductor, 442b: conductor, 450: insulator, 460: conductor, 460a: conductor, 460b: conductor, 1001: wiring, 1002: wiring, 1003: wiring, 1004: wiring, 1005: wiring, 1006: wiring, 1007: wiring, 1008: wiring, 1009: wiring, 1010: wiring, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1200: chip, 1201: PCB, 1202: bump, 1203: motherboard, 1204: GPU module, 1211: CPU, 1212: GPU, 1213: analog arithmetic unit, 1214: memory controller, 1215: interface, 1216: network circuit, 1221: DRAM, 1222: flash memory, 1400: memory device, 1411: peripheral circuit, 1420: row circuit, 1430: column circuit, 1440: output circuit, 1460: control logic circuit, 1470: memory cell array, 1471: memory cell, 1472: memory cell, 1473: memory cell, 1474: memory cell, 1475: memory cell, 1476: memory cell, 1477: memory cell, 1478: memory cell, 5100: information terminal, 5101: housing, 5102: display portion, 5200: notebook information terminal, 5201: main body, 5202: display portion, 5203: keyboard, 5300: portable game machine, 5301: housing, 5302: housing, 5303: housing, 5304: display portion, 5305: connection portion, 5306: operation key, 5400: stationary game machine, 5402: controller, 5500: supercomputer, 5501: rack, 5502: computer, 5504: substrate, 5701: display panel, 5702: display panel, 5703: display panel, 5704: display panel, 5800: electric refrigerator-freezer, 5801: housing, 5802: refrigerator door, 5803: freezer door

The invention claimed is:

1. A semiconductor device comprising a transistor,
wherein the transistor comprises:
a first insulator;
a first oxide over the first insulator;
a first conductor, a second conductor, and a second oxide over the first oxide, the second oxide being between the first conductor and the second conductor;
a second insulator over the second oxide; and
a third conductor over the second insulator,
wherein a top surface of the first oxide in a region overlapping with the third conductor is at a lower position than a position of a top surface of the first oxide in a region overlapping with the first conductor,
wherein the first oxide in the region overlapping with the third conductor comprises a curved surface between a side surface and the top surface of the first oxide, and
wherein a curvature radius of the curved surface is greater than or equal to 1 nm and less than or equal to 15 nm.

2. The semiconductor device according to claim 1, wherein, in a channel length direction, a difference between a level of the top surface of the first oxide in the region overlapping with the third conductor and a level of the top surface of the first oxide in the region overlapping with the first conductor is greater than or equal to 1 nm and less than or equal to 5 nm, with respect to a bottom surface of the first insulator.

3. The semiconductor device according to claim 1, wherein in a channel width direction of the transistor, a half of a difference between a length of a bottom surface of the first oxide in the region overlapping with the first conductor and a length of a bottom surface of the first oxide in the region overlapping with the third conductor is greater than or equal to 2 nm and less than or equal to 10 nm.

4. The semiconductor device according to claim 1,
wherein the transistor comprises a third oxide and a fourth oxide,
wherein the third oxide is between the first oxide and the first conductor,
wherein the fourth oxide is between the first oxide and the second oxide, and
wherein in a channel length direction of the transistor, a bottom surface of the second oxide is at a lower position than a position of a bottom surface of the third oxide and a position of a bottom surface of the fourth oxide.

5. A semiconductor device comprising a plurality of transistors, wherein the plurality of transistors each comprise:
a first insulator;
a first oxide over the first insulator;
a first conductor, a second conductor, and a second oxide over the first oxide, the second oxide being between the first conductor and the second conductor;
a second insulator over the second oxide; and
a third conductor over the second insulator,
wherein a top surface the first oxide in a region overlapping with the third conductor is at a lower position than a position of a top surface of the first oxide in a region overlapping with the first conductor,
wherein the first oxide in the region overlapping with the third conductor comprises a curved surface between a side surface and the top surface of the first oxide, and
wherein in $I_d$-$V_g$ characteristics of the plurality of transistors, a standard deviation $\sigma$ of $V_{sh}$ is less than 60 mV.

6. The semiconductor device according to claim 5,
wherein a channel length of each of the plurality of transistors is greater than or equal to 40 nm and less than or equal to 80 nm, and
wherein a channel width of each of the plurality of transistors is greater than or equal to 40 nm and less than or equal to 80 nm.

7. The semiconductor device according to claim 5, wherein a curvature radius of the curved surface is greater than or equal to 1 nm and less than or equal to 15 nm.

8. A semiconductor device comprising a transistor,
wherein the transistor comprises:
a first insulator;
a first oxide over the first insulator;
a first conductor, a second conductor, and a second oxide over the first oxide, the second oxide being between the first conductor and the second conductor;
a second insulator over the second oxide;
a third conductor over the second insulator; and
a third insulator in contact with a top surface of the first conductor, a top surface of the second conductor, and a part of a side surface of the first oxide,
wherein in a channel width of the transistor, a length of a bottom surface of the first oxide in a region overlapping with the first conductor is larger than a length of a bottom surface of the first oxide in a region overlapping with the third conductor,
wherein the first oxide in the region overlapping with the third conductor comprises a curved surface between the side surface and a top surface of the first oxide,
wherein the first oxide comprises indium, an element M, and zinc,
wherein the element M is any one of gallium, yttrium, and tin,
wherein the third insulator comprises an element that is to be an impurity of the first oxide, and
wherein a concentration ratio of the element to the element M at the side surface of the first oxide in the region overlapping with the third conductor is lower than a concentration ratio of the element to the element M at the side surface of the first oxide in a region overlapping with the first conductor.

9. The semiconductor device according to claim 8, wherein the element in the third insulator is aluminum.

10. The semiconductor device according to claim 8, wherein a curvature radius of the curved surface is greater than or equal to 1 nm and less than or equal to 15 nm.

* * * * *